United States Patent
Kim et al.

(10) Patent No.: US 12,369,412 B2
(45) Date of Patent: Jul. 22, 2025

(54) IMAGE SENSOR HAVING DIFFERENT-SIZED COLOR FILTERS

(71) Applicant: Samsung Electronics Co., Ltd., Suwon-si (KR)

(72) Inventors: Taehan Kim, Hwaseong-si (KR); Cheonho Park, Suwon-si (KR); Jaeho Choi, Seoul (KR); Bumsuk Kim, Hwaseong-si (KR); Jungsaeng Kim, Seoul (KR); Yunki Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 641 days.

(21) Appl. No.: 17/672,912

(22) Filed: Feb. 16, 2022

(65) Prior Publication Data
US 2022/0406836 A1     Dec. 22, 2022

(30) Foreign Application Priority Data

Jun. 22, 2021 (KR) .......................... 10-2021-0080702

(51) Int. Cl.
*H01L 27/146* (2006.01)
*G02B 5/20* (2006.01)
(Continued)

(52) U.S. Cl.
CPC .......... *H10F 39/182* (2025.01); *G02B 5/201* (2013.01); *H10F 39/8023* (2025.01);
(Continued)

(58) Field of Classification Search
CPC ......... H01L 27/14645; H01L 27/14605; H01L 27/14621; H01L 27/14627;
(Continued)

(56) References Cited

U.S. PATENT DOCUMENTS 10,121,809 B2    11/2018  Pang et al.
2012/0248560 A1*  10/2012  Lee ..................... H01L 27/1464
                                               257/E31.127
(Continued)

FOREIGN PATENT DOCUMENTS

JP    2013165216 A    8/2013
JP    2016054227 A    4/2016
(Continued)

*Primary Examiner* — Jennifer D Bennett
*Assistant Examiner* — Erin R Garber
(74) *Attorney, Agent, or Firm* — Muir Patent Law, PLLC

(57) ABSTRACT

An image sensor includes a pixel array including a plurality of pixels arranged in directions, parallel to an upper surface of a substrate, each of the plurality of pixels including at least one photodiode, a color filter above the at least one photodiode, and a pixel circuit below the at least one photodiode, and a logic circuit configured to obtain a pixel signal from the plurality of pixels. The plurality of pixels include red pixels each having a red color filter, green pixels each having a green color filter, and blue pixels each having a blue color filter, and a size of a first red color filter included in a first red pixel, disposed in a first area separated by a first distance from a center of the pixel array, is greater than a size of a second red color filter included in a second red pixel, disposed in a second area separated from the center of the pixel array by a second distance, greater than the first distance.

20 Claims, 56 Drawing Sheets

(51) Int. Cl.
*H10F 39/00* (2025.01)
*H10F 39/18* (2025.01)

(52) U.S. Cl.
CPC ....... *H10F 39/8053* (2025.01); *H10F 39/806* (2025.01); *H10F 39/8063* (2025.01); *H10F 39/18* (2025.01)

(58) Field of Classification Search
CPC ......... H01L 27/14625; H01L 27/14643; H01L 27/14623; H01L 27/1463; G02B 5/201; H10F 39/182; H10F 39/8023; H10F 39/8053; H10F 39/8063; H10F 39/18; H10F 39/806; H10F 39/8057; H10F 39/807
See application file for complete search history.

(56) References Cited

U.S. PATENT DOCUMENTS

| | | |
|---|---|---|
| 2014/0367817 A1* | 12/2014 | Furuta .............. H01L 27/14629 |
| | | 257/432 |
| 2016/0276395 A1 | 9/2016 | Chou et al. |
| 2019/0052823 A1 | 2/2019 | Jung et al. |
| 2020/0052021 A1* | 2/2020 | Takahashi ............. H01L 27/146 |
| 2020/0403025 A1 | 12/2020 | Kim et al. |
| 2021/0051250 A1* | 2/2021 | Chen ...................... G02B 5/201 |
| 2021/0126031 A1* | 4/2021 | Yamaguchi ......... H01L 27/1463 |
| 2022/0021853 A1* | 1/2022 | Hasumi ............. H01L 27/14601 |

FOREIGN PATENT DOCUMENTS

| | | |
|---|---|---|
| KR | 1020080104589 A | 12/2008 |
| KR | 1020190017197 A | 2/2019 |
| KR | 1020200145978 A | 12/2020 |

\* cited by examiner

IMAGE SENSOR HAVING DIFFERENT-SIZED COLOR FILTERS

CROSS-REFERENCE TO RELATED APPLICATION(S)

This application claims the benefit under 35 USC 119(a) of Korean Patent Application No. 10-2021-0080702 filed on Jun. 22, 2021 in the Korean Intellectual Property Office, the entire disclosure of which is incorporated herein by reference for all purposes.

BACKGROUND

The present inventive concept relates to an image sensor.

Image sensors are semiconductor-based sensors receiving light and generating electrical signals, and may include pixel arrays having a plurality of pixels, logic circuits for driving the pixel arrays and generating images, and the like. The plurality of pixels may be classified as a red pixel, a green pixel, a blue pixel, and the like according to colors of color filters included in each of the pixels. A difference in signal intensity may occur depending on respective positions of the pixels disposed in the pixel array, and thus, the performance of an image sensor may be deteriorated.

SUMMARY

Example embodiments provide an image sensor in which a difference in signal intensity depending on a position of each pixel and other adjacent pixels may be significantly reduced.

According to example embodiments, an image sensor includes a pixel array including a plurality of pixels arranged in directions parallel to an upper surface of a substrate, each of the plurality of pixels including at least one photodiode, a color filter above the at least one photodiode, and a pixel circuit below the at least one photodiode; and a logic circuit configured to obtain a pixel signal from the plurality of pixels. The plurality of pixels include red pixels each having a red color filter, green pixels each having a green color filter, and blue pixels each having a blue color filter, and a size of a first red color filter included in a first red pixel, disposed in a first area separated by a first distance from a center of the pixel array, is greater than a size of a second red color filter included in a second red pixel, disposed in a second area separated from the center of the pixel array by a second distance, greater than the first distance.

According to example embodiments, an image sensor includes a substrate providing a plurality of pixel areas on which a plurality of pixels are disposed, the substrate including a first surface and a second surface opposing the first surface; a light transmitting portion including a color filter, a planarization layer, and a microlens sequentially disposed on the first surface in each of the plurality of pixel areas; and a pixel circuit disposed on the second surface in each of the plurality of pixel areas. The plurality of pixels include red pixels each having a red color filter, green pixels each having a green color filter, and blue pixels each having a blue color filter, and a first red color filter included in at least one of the red pixels has an area smaller than an area of at least one of the green color filter and the blue color filter, when viewed from a first direction perpendicular to the first surface of the substrate.

According to example embodiments, an image sensor includes a pixel array including a plurality of pixels arranged in a direction, parallel to an upper surface of a substrate, each of the plurality of pixels including a plurality of sub-pixels disposed in N×N form, where N is a natural number equal to or greater than 2, the plurality of sub-pixels sharing one color filter; and a logic circuit configured to obtain a pixel signal from the plurality of pixels. The plurality of pixels include red pixels each having a plurality of red sub-pixels sharing one red color filter, green pixels each having a plurality of green sub-pixels sharing one green color filter, and blue pixels each having a plurality of blue sub-pixels sharing one blue color filter. In each of the plurality of pixels, the color filter has a plurality of sub-filter areas respectively corresponding to the plurality of sub-pixels, and in at least one of the red pixels, from a plan view, a size of each sub-filter area of the plurality of sub-filter areas, disposed relatively closer to a first edge of the substrate, is smaller than a size of each of each remaining sub-filter area of the plurality of sub-filter areas, disposed further from the first edge of the substrate.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
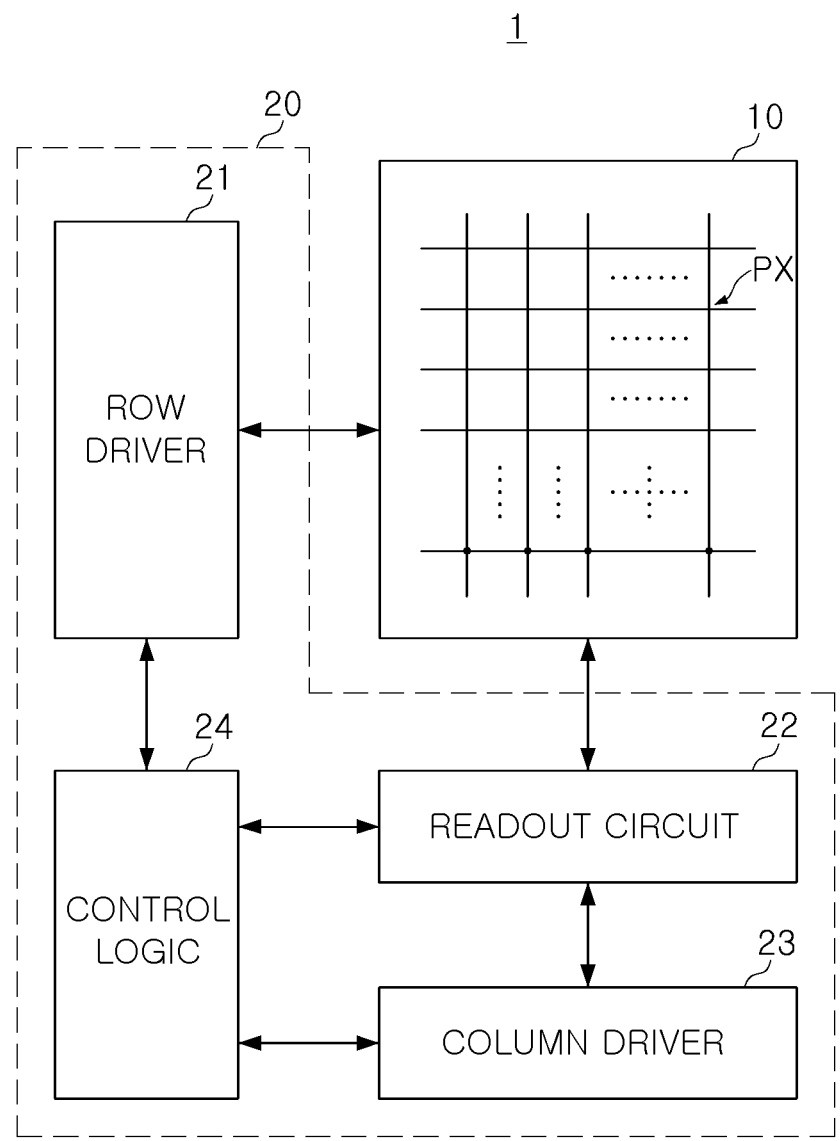
FIG. 1 is a block diagram schematically illustrating an image sensor according to an example embodiment.

FIG. 1 is a block diagram schematically illustrating an image sensor according to an example embodiment.

Referring to FIG. 1, an image sensor 1 may include a pixel array 10 and a logic circuit 20.

The pixel array 10 may include a plurality of pixels PX arranged in array form in a plurality of rows and a plurality of columns. Each of the plurality of pixels PX may include at least one photoelectric conversion element generating a charge in response to light, and a pixel circuit generating a pixel signal corresponding to the charge generated by the photoelectric conversion element. The photoelectric conversion element, also described as a photoelectric conversion device, may include a photodiode formed of a semiconductor material, and/or an organic photodiode formed of an organic material.

For example, the pixel circuit may include a floating diffusion region, a transfer transistor, a reset transistor, a driving transistor, and a selection transistor. The configuration of the pixels PX may vary according to example embodiments. For example, each of the pixels PX may include an organic photodiode including an organic material, or may be implemented as a digital pixel. When the pixels PX are implemented as digital pixels, each of the pixels PX may include an analog-to-digital converter for outputting a digital pixel signal. In some embodiments, as described herein, a pixel PX, or a sub-pixel, includes the components used to generate an individual pixel signal. For example, a single photodiode and a corresponding pixel circuit may generate an individual pixel signal.

The logic circuit 20 may include circuits for controlling the pixel array 10. For example, the logic circuit 20 may include a row driver 21, a readout circuit 22, a column driver 23, a control logic 24, and the like. The row driver 21 may drive the pixel array 10 in units of row lines. For example, the row driver 21 may generate a transfer control signal for controlling a transfer transistor of the pixel circuit, a reset control signal for controlling the reset transistor, a select control signal for controlling the select transistor, and the like, and may input the generated signals to the pixel array 10 in a row line unit.

The readout circuit 22 may include a correlated double sampler (CDS), an analog-to-digital converter (ADC), and the like. The correlated double samplers may be connected to the pixels PX through column lines. The correlated double samplers may read a pixel signal through column lines from the pixels PX connected to a row line selected by the row line selection signal of the row driver 21. The analog-to-digital converter may convert the pixel signal detected by the correlated double sampler into a digital pixel signal and transmit the converted signal to the column driver 23.

The column driver 23 may include a latch or buffer circuit capable of temporarily storing a digital pixel signal, an amplifier circuit, and the like, and may process a digital pixel signal received from the readout circuit 22. The row driver 21, the readout circuit 22, and the column driver 23 may be controlled by the control logic 24. The control logic 24 may include a timing controller for controlling the operation timing of the row driver 21, the readout circuit 22, and the column driver 23.

Among the pixels PX, the pixels PX disposed in the same position in the horizontal direction (from a top-down view) may share the same column line. For example, the pixels PX disposed in the same position in the vertical direction (from a top-down view) may be simultaneously selected by the row driver 21 and may output pixel signals through column lines. In an example embodiment, the readout circuit 22 may simultaneously acquire pixel signals from the pixels PX selected by the row driver 21 through column lines. The pixel signal may include a reset voltage and a pixel voltage, and the pixel voltage may be a voltage in which charges generated in response to light in each of the pixels PX are reflected in the reset voltage.

Each of the pixels PX may include a color filter having a predetermined color, and may be classified as a red pixel, a green pixel, a blue pixel, and the like according to the color of the color filter. Since the pixels PX are arranged in the horizontal direction and the vertical direction, in the first color filter and the second color filter adjacent to each other, a portion of light incident to the second color filter may be blocked by the first color filter according to the incident angle of light entering each of the pixels PX.

For example, when a red pixel and a green pixel are adjacent to each other in a light incident direction, a portion of light incident to a green color filter may be blocked by the adjacent red color filter. When the incident angle of the light is not vertical, for example, as the incident angle of light is farther from the center of the pixel array 10, a relatively more amount of light incident on the green color filter may be blocked by the adjacent red color filter.

In an example embodiment, the red color filters included in the red pixels may have different sizes according to positions of the red pixels. For example, the red color filter of the red pixel close to the edge of the pixel array 10 may be formed to have a relatively smaller size than the red color filter of the red pixel close to the center of the pixel array 10. Accordingly, a phenomenon in which light incident to the green pixel adjacent to the red pixel is blocked by the red color filter of the red pixel may be significantly reduced, and the performance of the image sensor 1 may be improved.

Figure 2:
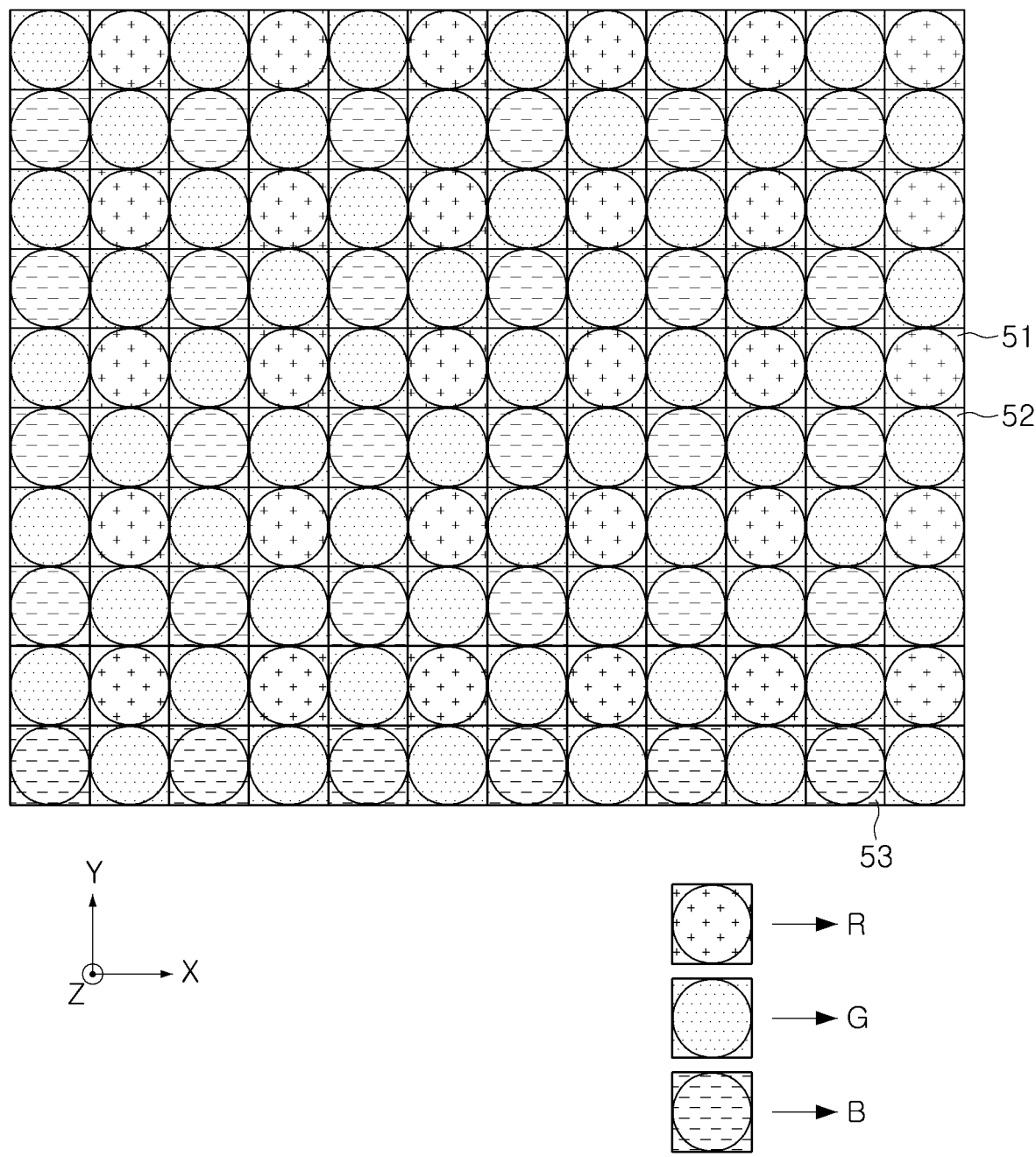
FIG. 2 is a diagram schematically illustrating a pixel array of an image sensor according to an example embodiment.

FIG. 2 is a diagram schematically illustrating a pixel array of an image sensor according to an example embodiment.

Referring to FIG. 2, a pixel array 50 of an image sensor according to an example embodiment may include a plurality of pixels 51-53 arranged in a first direction (X-axis direction) and a second direction (Y-axis direction). For example, the pixel array 50 may include red pixels 51, green pixels 52, and blue pixels 53. Each of the red pixels 51 may include a red color filter, each of the green pixels 52 may include a green color filter, and each of the blue pixels 53 may include a blue color filter.

In the example embodiment illustrated in FIG. 2, each of the green pixels 52 may be adjacent to a portion of the red pixels 51 and a portion of the blue pixels 53 in the first direction and the second direction. Accordingly, according to a direction in which light is incident on the pixel array 50, in a region close to the edge of the pixel array 50, a portion of the light that should be incident on each of the green pixels 52 may be absorbed by the blue color filter included in at least one of the adjacent blue pixels 53 or a red color filter included in at least one of the adjacent red pixels 51.

Accordingly, depending on the direction in which light is incident on each of the green pixels 52 and the types of other pixels adjacent to each of the green pixels 52 in the light incident direction, a difference may appear in the intensity of signals output by the green pixels 52. For example, in the case of the green pixels 52 distant from the center of the pixel array 50 in the first direction, the signal strength may appear relatively low in the green pixels 52 adjacent to a portion of the red pixels 51 in the first direction. In addition, in the case of the green pixels 52 away from the center of the pixel array 50 in the second direction, the green pixels 52 adjacent to a portion of the red pixels 51 in the second direction may output a relatively low intensity signal.

When a signal intensity difference occurs between the green pixels 52 and the adjacent red pixels 51, the quality of an image output by the image sensor may be deteriorated. In an example embodiment, the size of the red color filter included in each of the red pixels 51 may be adjusted according to the position thereof so as to reduce the influence on the green pixels 52. Accordingly, a signal intensity difference between the green pixels 52 irrespective of their location may be reduced, and image quality may be improved.

Figure 3:
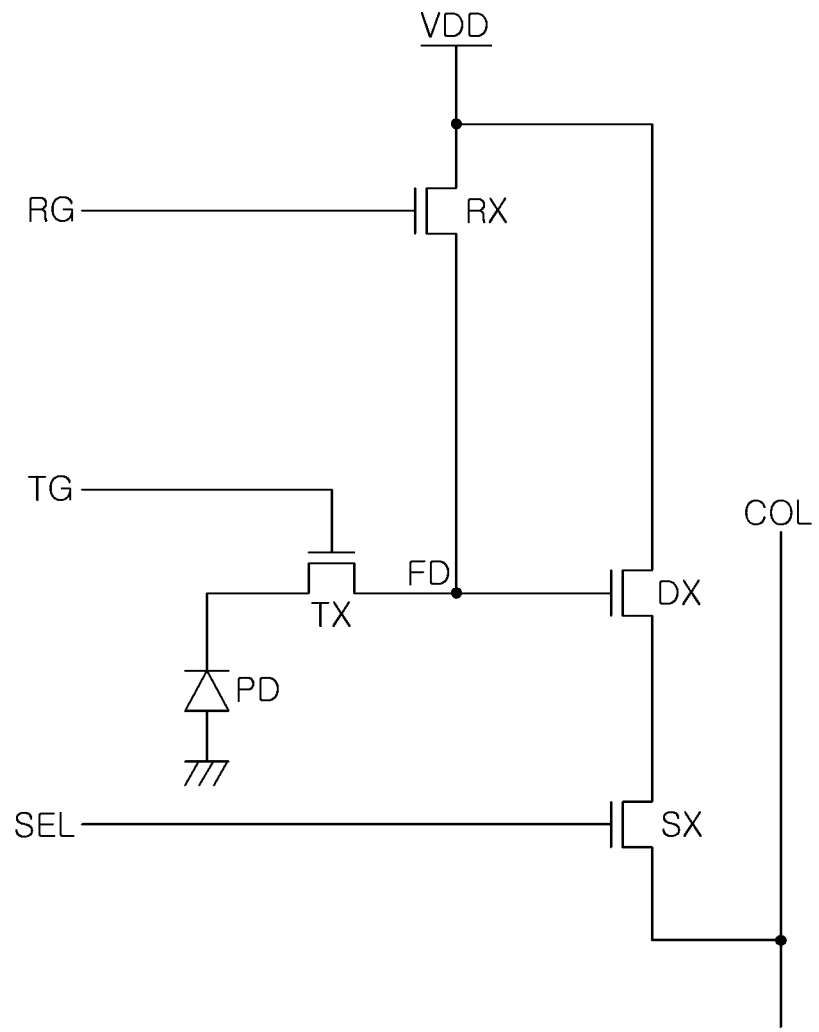
FIG. 3 is a diagram schematically illustrating a pixel circuit of an image sensor according to an example embodiment.

FIG. 3 is a diagram schematically illustrating a pixel circuit of an image sensor according to an example embodiment.

Referring to FIG. 3, the pixel circuit may include a photodiode PD, a transfer transistor TX, a reset transistor RX, a driving transistor DX, and a selection transistor SX. The pixel circuit is connected to a logic circuit of the image sensor by a column line COL connected to the selection transistor SX, and the logic circuit may generate a pixel signal by acquiring a reset voltage and a pixel voltage through the column line COL.

However, the pixel circuit of the pixel is not necessarily limited to the illustration of FIG. 3, and some elements may be added or omitted if necessary or desired. For example, a device for adjusting the conversion gain of the pixel may be added between the floating diffusion region FD and the reset transistor RX.

When the reset transistor RX is turned on, the voltage of the floating diffusion region FD is reset, and the logic circuit may read the reset voltage by turning on the selection transistor SX. When the reset transistor RX is turned off, the photodiode PD may be exposed to light for an exposure time to generate an electrical charge. After the exposure time has elapsed, when the transfer transistor TX is turned on and the charge of the photodiode PD moves to the floating diffusion region FD, the selection transistor SX is turned on again and the logic circuit may acquire the pixel voltage. The logic circuit may generate a pixel signal corresponding to a difference between the reset voltage and the pixel voltage.

FIGS. 4, 5A, 5B, and 6A to 6E are diagrams illustrating a pixel array of an image sensor according to an example embodiment.

Figure 4:
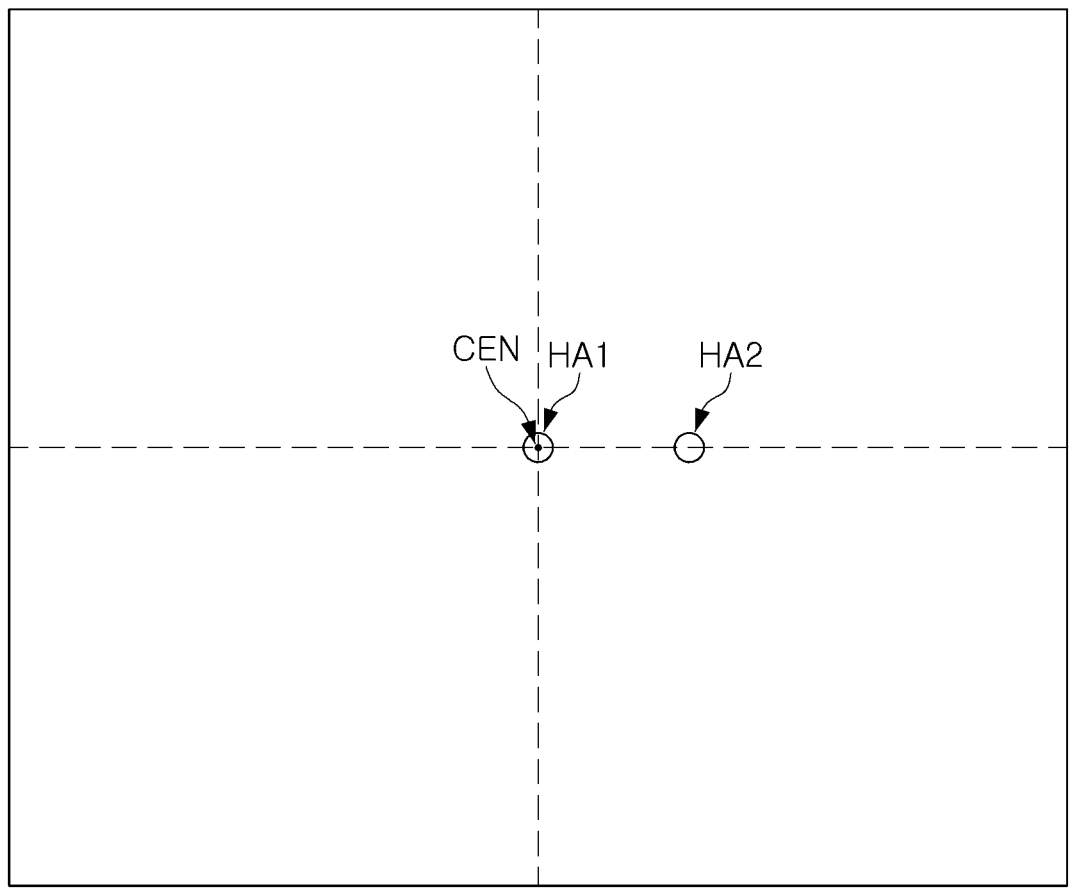
FIGS. 4, 5A, 5B, and 6A to 6E are diagrams illustrating a pixel array of an image sensor according to an example embodiment.
Figure 4:
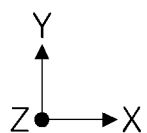

Referring first to FIG. 4, in a pixel array 100 of an image sensor according to an example embodiment, a first area HA1 and a second area HA2 may be defined. The first area HA1 may be an area separated by a first distance from a center CEN of the pixel array 100 in the first direction (X-axis direction), and the second area HA2 may be an area separated by a second distance from the center CEN in the first direction. The first distance may be shorter than the second distance, and thus the first area HA1 may be an area disposed closer to the center CEN of the pixel array 100 than the second area HA2.

Figure 5A:
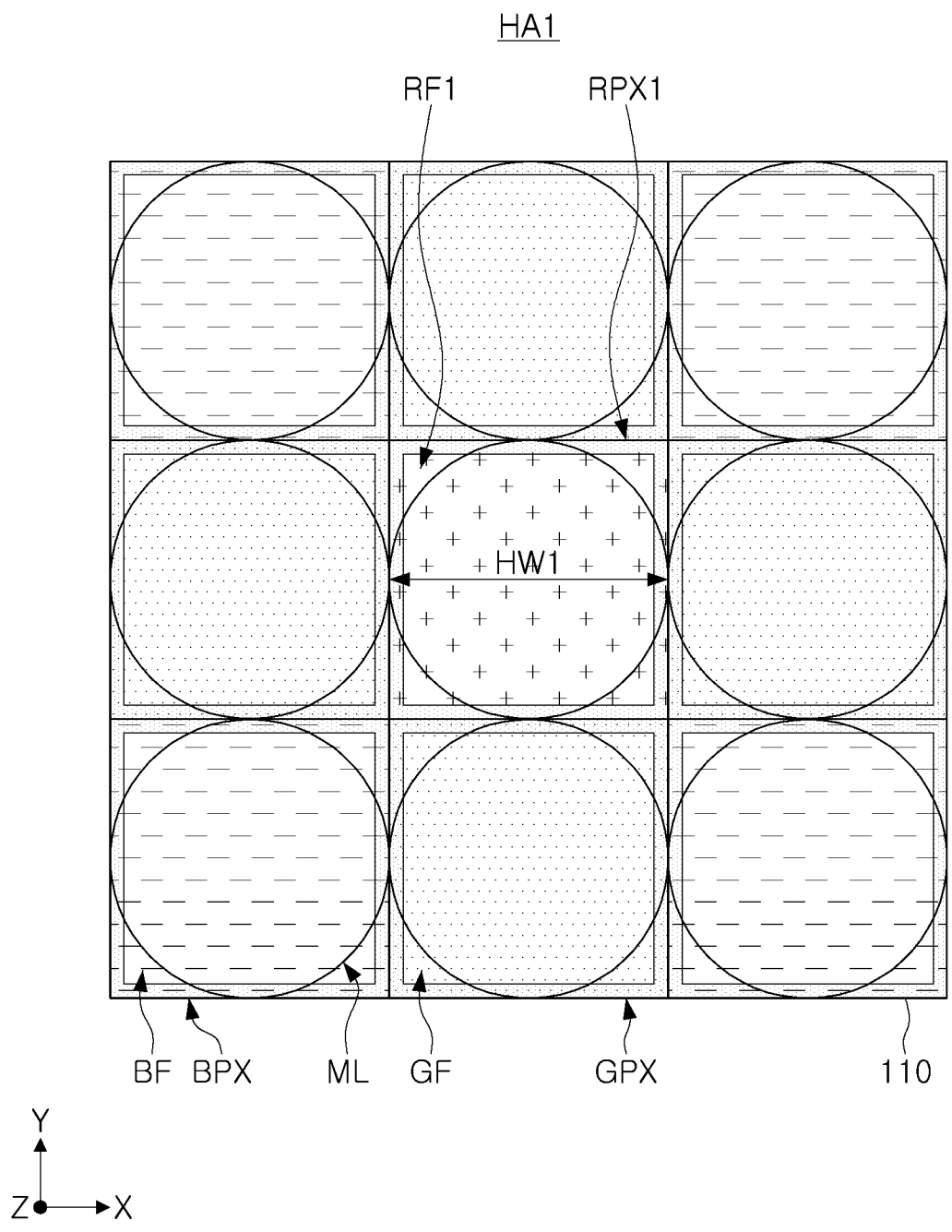
Figure 5B:
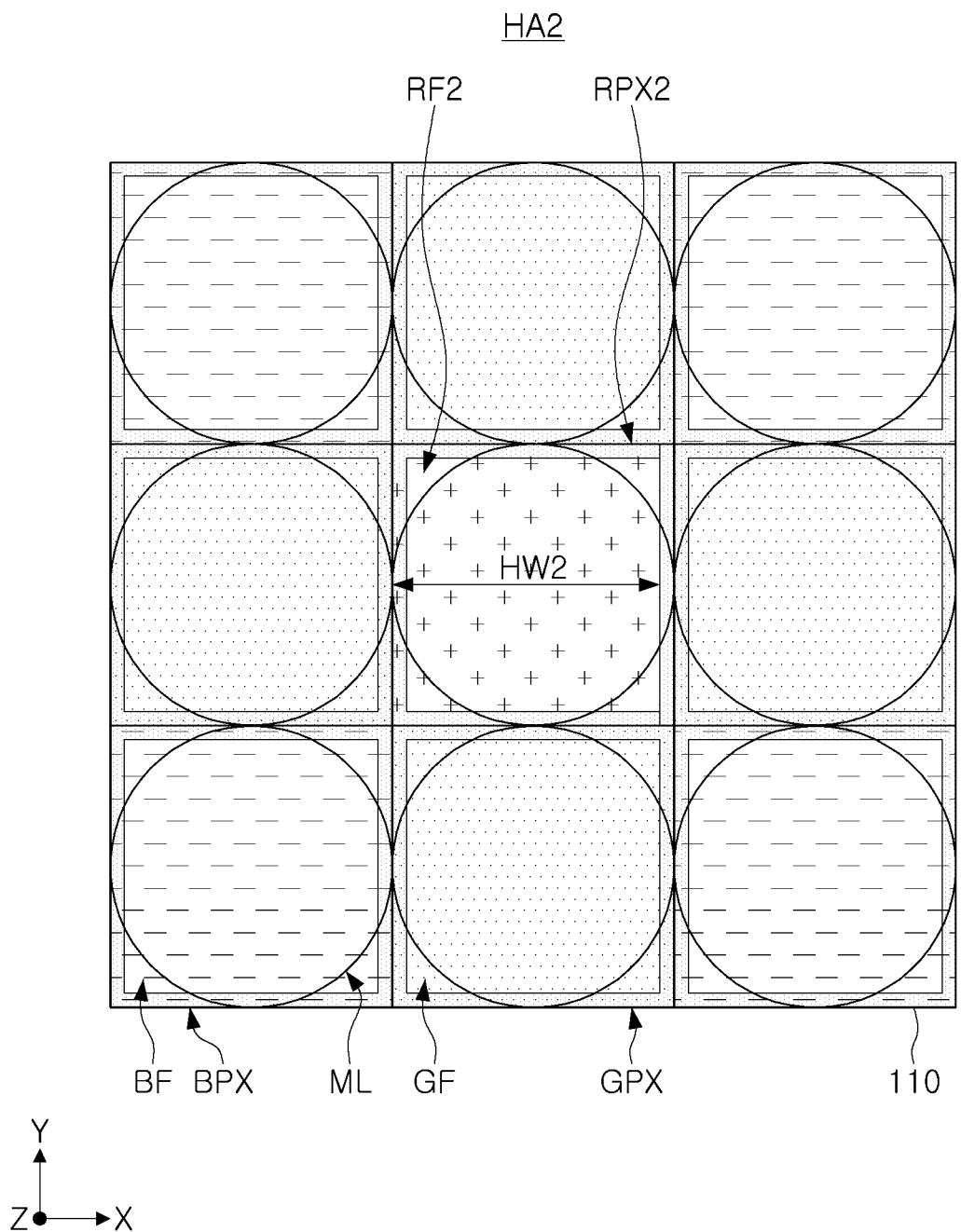

FIGS. 5A and 5B are plan views illustrating portions of pixels disposed in the first area HA1 and the second area HA2, respectively. In each of the first area HA1 and the second area HA2, pixels may be arranged in the first direction (X-axis direction) and the second direction (Y-axis direction). Referring to FIG. 5A, a first red pixel RPX1, a green pixel GPX, and a blue pixel BPX may be disposed in the first area HA1. Referring to FIG. 5B, a second red pixel RPX2, a green pixel GPX and a blue pixel BPX may be disposed in the second area HA2.

Referring to FIGS. 5A and 5B, each of the pixels includes a microlens ML, a green pixel GPX may include a green color filter GF, and a blue pixel BPX may include a blue color filter BF. On the other hand, the first red pixel RPX1 may include a first red color filter RF1, and the second red pixel RPX2 may include a second red color filter RF2. To distinguish the pixels, a grid structure 110 extending in the first direction and the second direction may be formed between the color filters.

The second red color filter RF2 may have a size smaller than that of the first red color filter RF1. For example, in the first direction, the first red color filter RF1 may have a first horizontal length HW1, and the second red color filter RF2 has a second horizontal length HW2 shorter than the first horizontal length HW1. Accordingly, the second red color filter RF2 may have a smaller size than the green color filter GF and the blue color filter BF.

Figure 6A:
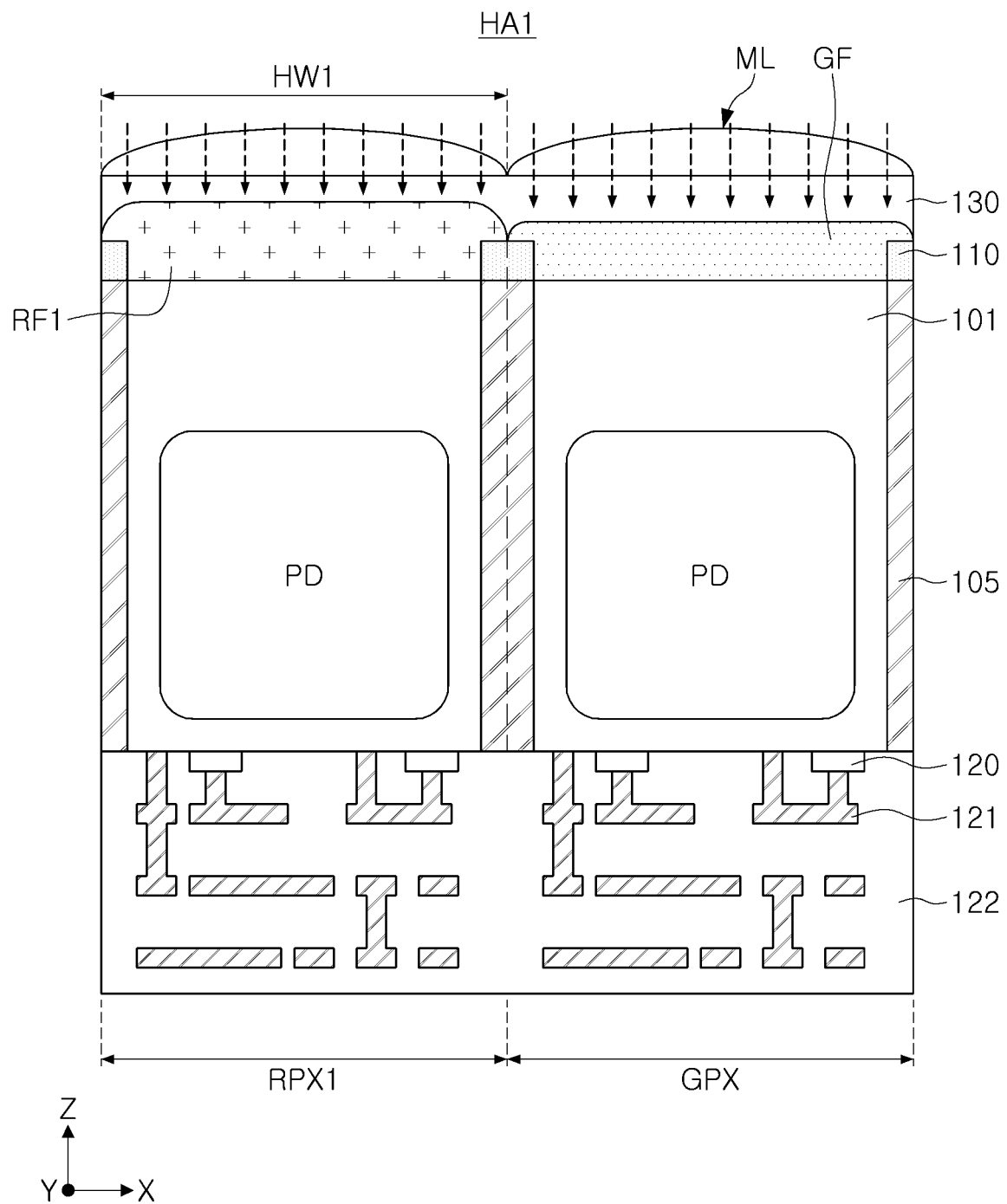
Figure 6B:
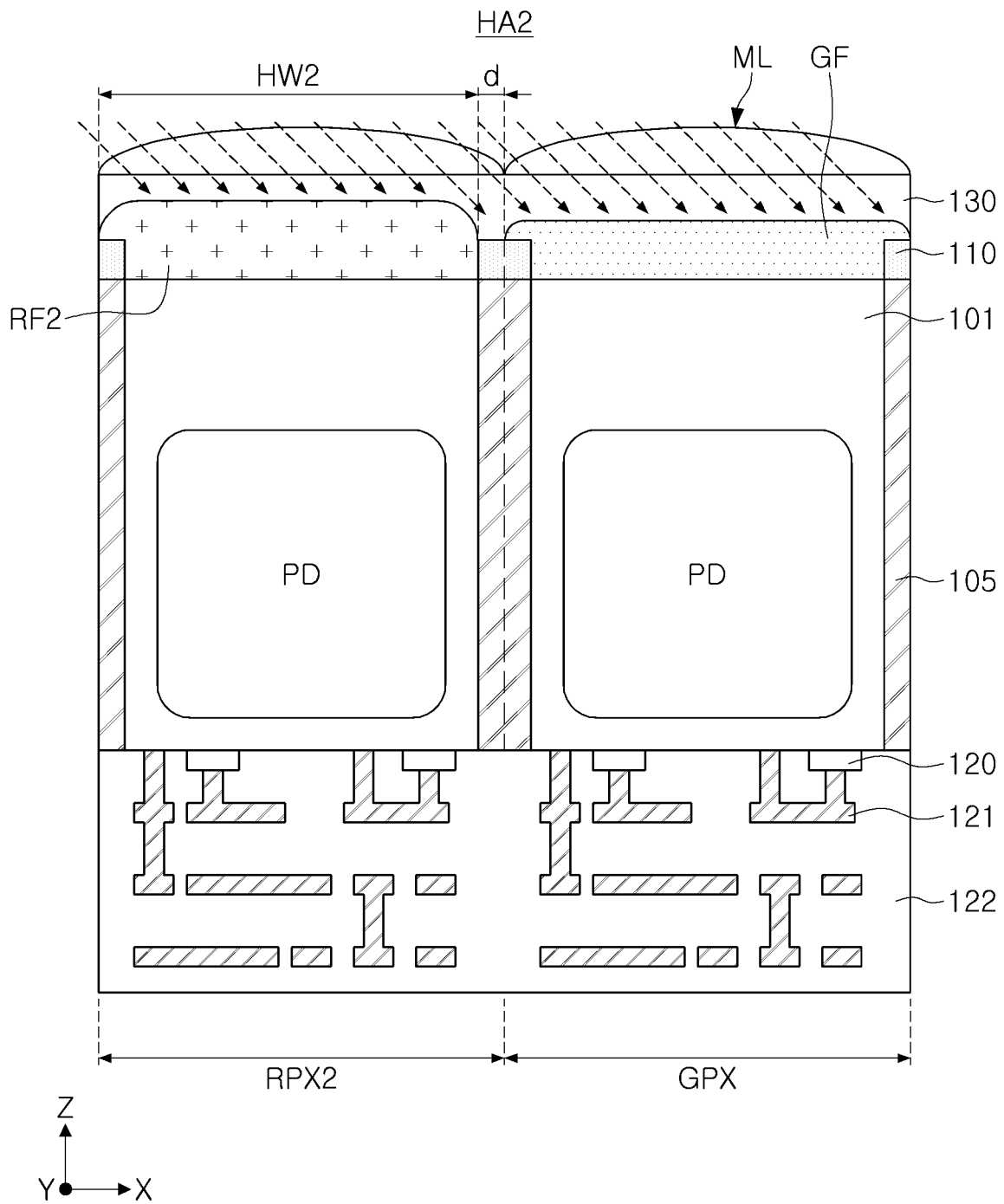
Figure 6C:
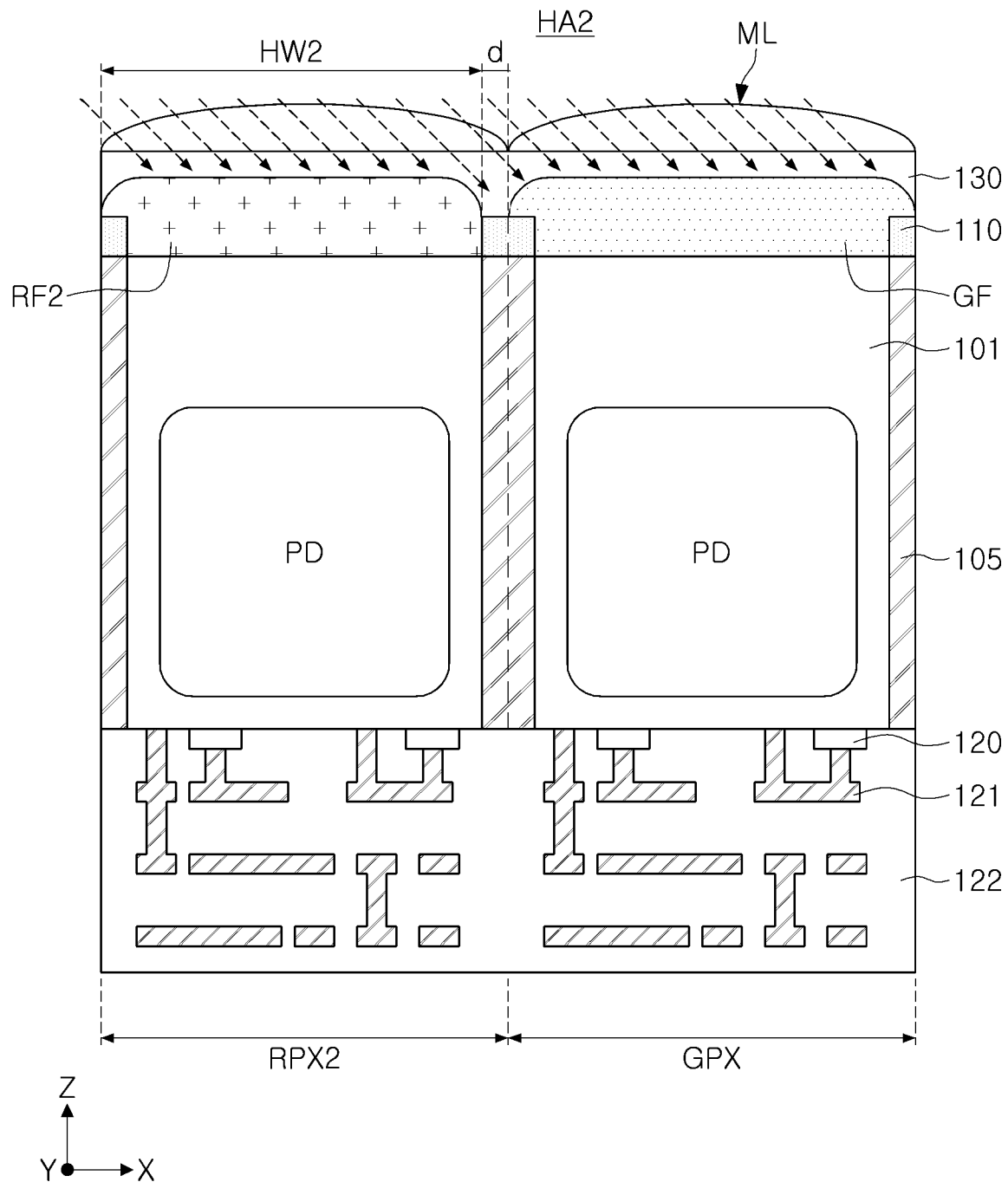

FIG. 6A is a cross-sectional view illustrating the first red pixel RPX1 and the green pixel GPX adjacent to each other in the first direction, in the first area HA1 and FIGS. 6B and 6C are cross-sectional views illustrating cross-sections of the second red pixel RPX2 and the green pixel GPX adjacent to each other in the first direction. Referring to FIGS. 6A to 6C, each of the pixels includes a photodiode PD formed in a substrate 101, and the pixels may be separated from each other by a pixel separation layer 105. The pixel separation layer 105 may extend in the first direction and the second direction from the bottom of the grid structure 110 to separate pixels from each other, and may extend in a third direction (Z-axis direction). FIGS. 6A to 6C illustrate that the pixel separation layer 105 is formed to a depth that completely penetrates through the substrate 101, but this is only an example embodiment, and the shape of the pixel separation layer 105 may be variously formed.

The substrate 101 may include a first surface and a second surface opposing each other. For example, a light transmitting portion including a color filter, a planarization layer 130, a microlens ML and the like may be disposed on the first surface of each of the pixels. On the other hand, devices 120 constituting the pixel circuit may be formed on the second surface of each of the pixels. The devices 120 are connected to each other by wiring patterns 121, and the devices 120 and the wiring patterns 121 may be covered by an insulating layer 122.

Referring to FIGS. 6A and 6B, the first red color filter RF1 and the second red color filter RF2 may have a thickness greater than that of the green color filter GF. Accordingly, upper surfaces of the first red color filter RF1 and the second red color filter RF2 may be positioned higher than the upper surfaces of the green color filter GF. Since the first area HA1 is relatively close to the center CEN of the pixel array 100, as illustrated in FIG. 6A, light may be incident on the first red pixel RPX1 and the green pixel GPX in a direction substantially similar to the third direction. Accordingly, the first red color filter RF1 having a relatively great thickness may have little effect on light incident to the adjacent green color filter GF. The first red color filter RF1 may have a first horizontal length HW1 that is similar to that of the green color filter GF in the first direction.

On the other hand, since the second area HA2 is relatively far from the center CEN of the pixel array 100, as illustrated in FIG. 6B, light may be incident on the second red pixel RPX2 and the green pixel GPX in an inclined direction with respect to the first surface of the substrate 101. Accordingly, at least a portion of light incident to the adjacent green color filter GF may be blocked by the second red color filter RF2.

According to aspects of the present inventive concept, as illustrated in FIG. 6B, the above problem may be prevented or reduced by forming the second red color filter RF2 in a relatively small size. For example, in the first direction, the second red color filter RF2 has a second horizontal length HW2, and the second horizontal length HW2 may be shorter than the first horizontal length HW1 of the first red color filter RF1. In detail, in a plane parallel to the first surface of the substrate 101, the area of the second red color filter RF2 may be smaller than the area of the first red color filter RF1. Accordingly, a portion of light that should be incident on the green pixel GPX may be prevented from being blocked by the second red color filter RF2, and the sensitivity of the second red pixel RPX2 may be improved. In this example, in embodiments where a particular red color filter is a certain distance or more from the center of the pixel array, one or more sides of the red color filter furthest from the center of the pixel array may be formed such that a gap exists between that side of the particular red color filter and an adjacent side of an adjacent green color filter. It should be noted that although certain colors, such as red, green, and blue, are used as examples here, the above arrangement may be used for any color filters, for example, where one color filter is thicker in the vertical direction (Z-direction) than an adjacent color filter or is blocked in part by an adjacent color filter for light incident at an angle.

Since the first red color filter RF1 and the second red color filter RF2 have relatively greater thicknesses than the green color filter GF, the planarization layer 130 may have a first thickness on the red color filters RF1 and RF2, and may have a second thickness less than the first thickness on the green color filter GF. Also, the upper surface of the planarization layer 130 may be positioned on the same height, on the red color filters RF1 and RF2, the green color filter GF, and the blue color filter BF. In detail, the planarization layer 130 may have a flat upper surface.

According to some embodiments, a length difference d in comparing the first red color filter RF1 and the second red color filter RF2 in the first direction may be equal to ½ of the width of the grid structure 110. Accordingly, as illustrated in FIG. 6B, at least a portion of the grid structure 110 may contact the planarization layer 130 at one side of the second red color filter RF2. However, this is only an example embodiment, and the length difference d between the first red color filter RF1 and the second red color filter RF2 may vary according to the location of the second area HA2 (e.g., with respect to a center of the pixel array 100). For example, as the second area HA2 is closer to the edge of the pixel array 100, the length difference d between the first red color filter RF1 and the second red color filter RF2 may increase. In this case, the size or width of the grid structure 110 may increase in response to the length difference d between the first red color filter RF1 and the second red color filter RF2.

In one embodiment, as illustrated in FIG. 6C, the green color filter GF may have the same thickness as the second red color filter RF2. In detail, in the example embodiment illustrated in FIG. 6C, the green color filter GF and the red color filter RF may have substantially the same thickness throughout the pixel array 100. Accordingly, the planarization layer 130 may have a constant thickness in positions corresponding to the red color filters RF1 and RF2 and the green color filter GF, respectively.

Even when the green color filter GF and the red color filter RF have the same thickness, there may be a problem in that a portion of the light that should be incident on the green color filter GF is absorbed by the red color filter RF by the incident angle of the light according to respective positions of the pixels RPX, GPX, and BPX. In an example embodiment of the present inventive concept, as illustrated in FIG. 6C, the length of the second red color filter RF2 close to the edge of the pixel array 100 may be formed to be shorter than that of the green color filter GF in one direction, and thus, the problem in that a portion of the light that should be incident on the green color filter GF is absorbed/blocked by the red color filter RF may be prevented or reduced. For example, the one direction may be a first direction (X-axis direction) in which the second red color filter RF2 is adjacent to the green color filter GF. Similar to above, a gap may be formed between the second red color filter RF2 and the green color filter GF in this case, so that the filters are not directly adjacent to each other and do not contact each other. It will be understood that when an element is referred to as being "connected" or "coupled" to or "adjacent to" or "on" another element, it can be directly connected or coupled to or adjacent to or on the other element or intervening elements may be present. In contrast, when an element is referred to as being "directly connected" or "directly coupled" to another element, or "directly adjacent to" or "directly on," or as "contacting" or "in contact with" another element, there are no intervening elements present at the point of contact.

Figure 6D:
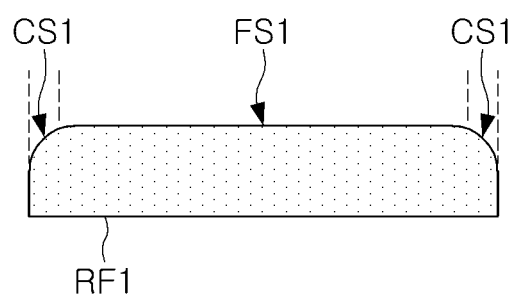
Figure 6D:
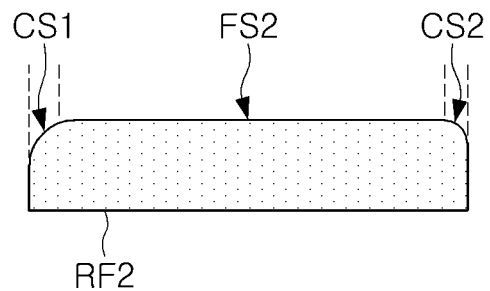

FIG. 6D is a diagram illustrating the first red color filter RF1 and the second red color filter RF2 together. Referring to FIG. 6D, upper surfaces of each of the first red color filter RF1 and the second red color filter RF2 may include a flat surface and a curved surface. First, the upper surface of the first red color filter RF1 may include a first flat surface FS1 and a first curved surface CS1. The upper surface of the first red color filter RF1 may have a symmetrical shape.

The upper surface of the second red color filter RF2 may have a second flat surface FS2, a first curved surface CS1, also described as a first curved surface portion, and a second curved surface CS2, also described as a second curved surface portion. The second flat surface FS2 may be relatively shorter than the first flat surface FS1, and the second curved surface CS2 may be relatively shorter than the first curved surface CS1. Accordingly, the second red color filter RF2 may have an asymmetric shape, e.g., from a cross-sectional view. For example, the second curved surface CS2 closer to the edge of the pixel array 100 in the first direction may have a curvature different from the first curved surface CS1.

As illustrated in FIG. 6D, the second red color filter RF2 has a smaller size than the first red color filter RF1, which means that the second red color filter RF2 has a smaller volume than the first red color filter RF1. Alternatively, it may also be interpreted as meaning that the second red color filter RF2 has a shorter length than the first red color filter RF1 in at least one of directions in which pixels are arranged in the pixel array. In addition, on a plane parallel to the upper surface of the substrate on which the pixels are formed, it may also be understood that the second red color filter RF2 has a smaller area than the first red color filter RF1. For example, in addition to the first red color filter RF1, the second red color filter RF2 may have a smaller area than each of the green color filters GF and the blue color filters BF. Also, for example due to the asymmetry of the second red color filter RF2, and symmetry of the first red color filter RF1 (or due to different amounts of asymmetry between two red color filters positioned at different distances from the center of the pixel array), the first red color filter RF1 and second red color filter RF2 may have different shapes. For example, the green color filters GF and blue color filters BF (e.g., a first set of color filters) may have the same, uniform, sizes and shapes as each other, while the red color filters (e.g., a second set of color filters) have varying sizes and shapes from each other, at least some being different from the sizes and shapes of the first set of color filters. In these cases, according to some embodiments, all of the color filters have a rectangular shape when viewed from along a plane parallel to the X-Y direction (e.g., from plan view). Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

As illustrated in FIG. 5B, a pair of green pixels GPX may be disposed respectively on opposite sides of the second red pixel RPX2 in the first direction, and thus a pair of green color filters GF may be disposed respectively on opposite sides of the second red color filter RF2 in the first direction. The first curved surface CS1 may be adjacent to one of the pair of green color filters GF (e.g., a first green color filter GF), and the second curved surface CS2 may be adjacent to the other one of the pair of green color filters GF (e.g., a second green color filter GF). The first green color filter GF adjacent to the first curved surface CS1 may be disposed between the first red color filter RF1 and the second red color filter RF2 in the first direction. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The influence of the second red color filter RF2 may not affect the first green color filter GF. This may be because the first green color filter GF is closer to the center CEN of the pixel array 100 in the first direction than the second red color filter RF2. Accordingly, the size of the second red color filter RF2 may be reduced only on the second curved surface CS2 that is further from the center CEN of the pixel array 100 in the first direction. As a result, the distance between the first green color filter and the second red color filter RF2 in the first direction may be shorter than the distance between the second green color filter and the second red color filter RF2.

Figure 6E:
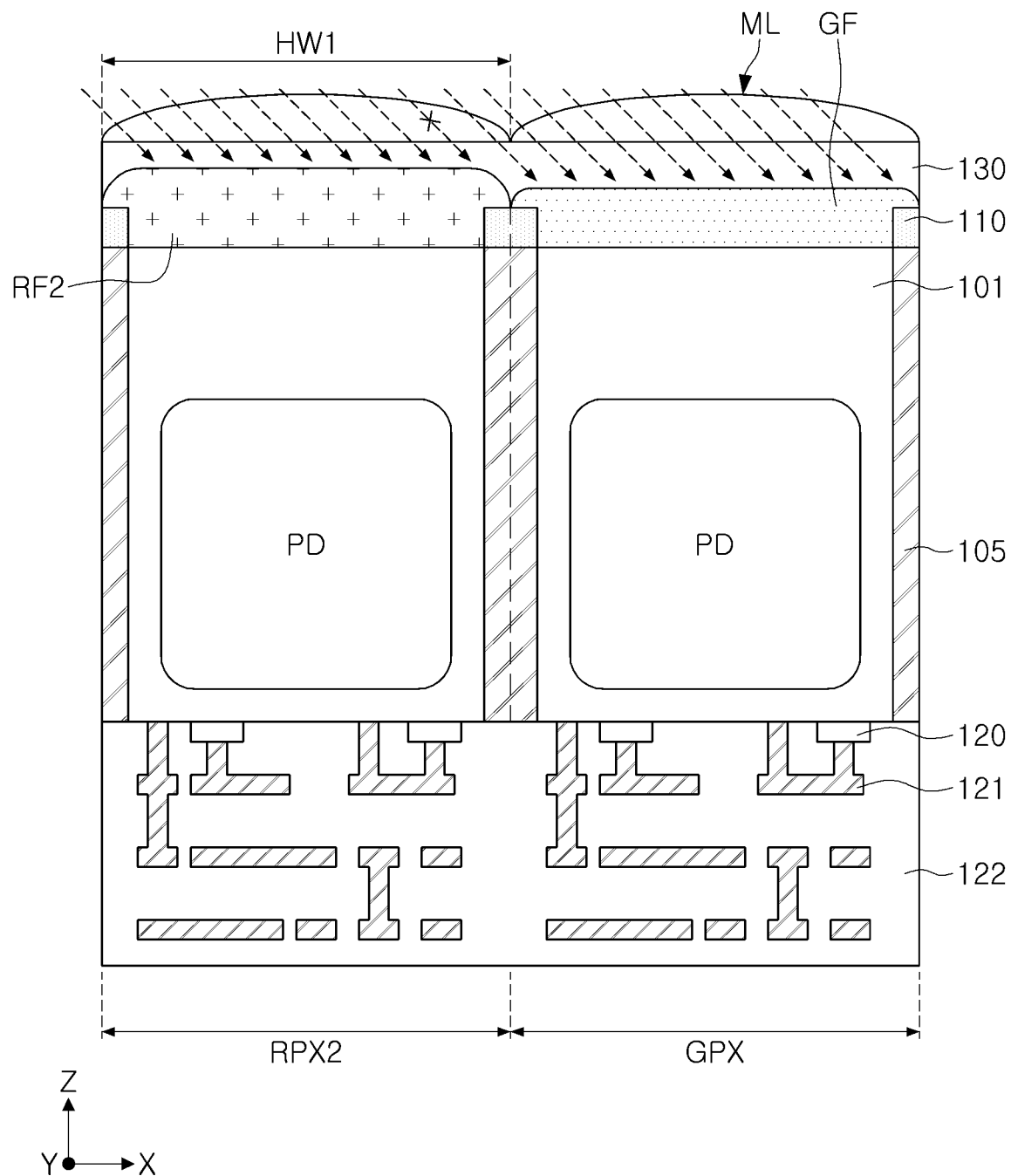

FIG. 6E is a drawing of a comparative example illustrating a phenomenon that occurs when the second red color filter RF2 is formed to have the same size (from a plan view) as the first red color filter RF1, the green color filter GF, or the like in the second area HA2. Referring to FIG. 6E, as the second red color filter RF2 is formed to have the same size (from a plan view) as the first red color filter RF1, the green color filter GF, and the like, a portion of the light to be incident on the green pixel GPX may be blocked by the second red color filter RF2. The above problem described with reference to FIG. 6E may occur even in a case in which the second red color filter RF2 has the same thickness as the first red color filter RF1 and the green color filter GF according to the incident angle of light.

On the other hand, in other green pixels GPX adjacent to the blue pixel BPX in the first direction in the second area HA2, the problem as illustrated in FIG. 6E may not occur, and thus, a signal intensity difference may occur in the different green pixels GPX included in the second area HA2. In an example embodiment of the present inventive concept, the above problem may be prevented by forming the second red color filter RF2 smaller than the first red color filter RF1 and the green color filter GF.

However, according to example embodiments, a phenomenon in which a portion of light that should be incident on the green color filter GF is absorbed and/or blocked by the blue color filter BF may occur. In an example embodiment of the present inventive concept, the sizes of the blue color filters BF may be formed differently in the first area HA1 and the second area HA2, respectively, to significantly reduce light blocking by the blue color filter BF. Hereinafter, this will be described in more detail with reference to FIGS. 7A, 7B, 8A, and 8B.

FIGS. 7A, 7B, 8A, and 8B are diagrams illustrating a pixel array of an image sensor according to an example embodiment.

Figure 7A:
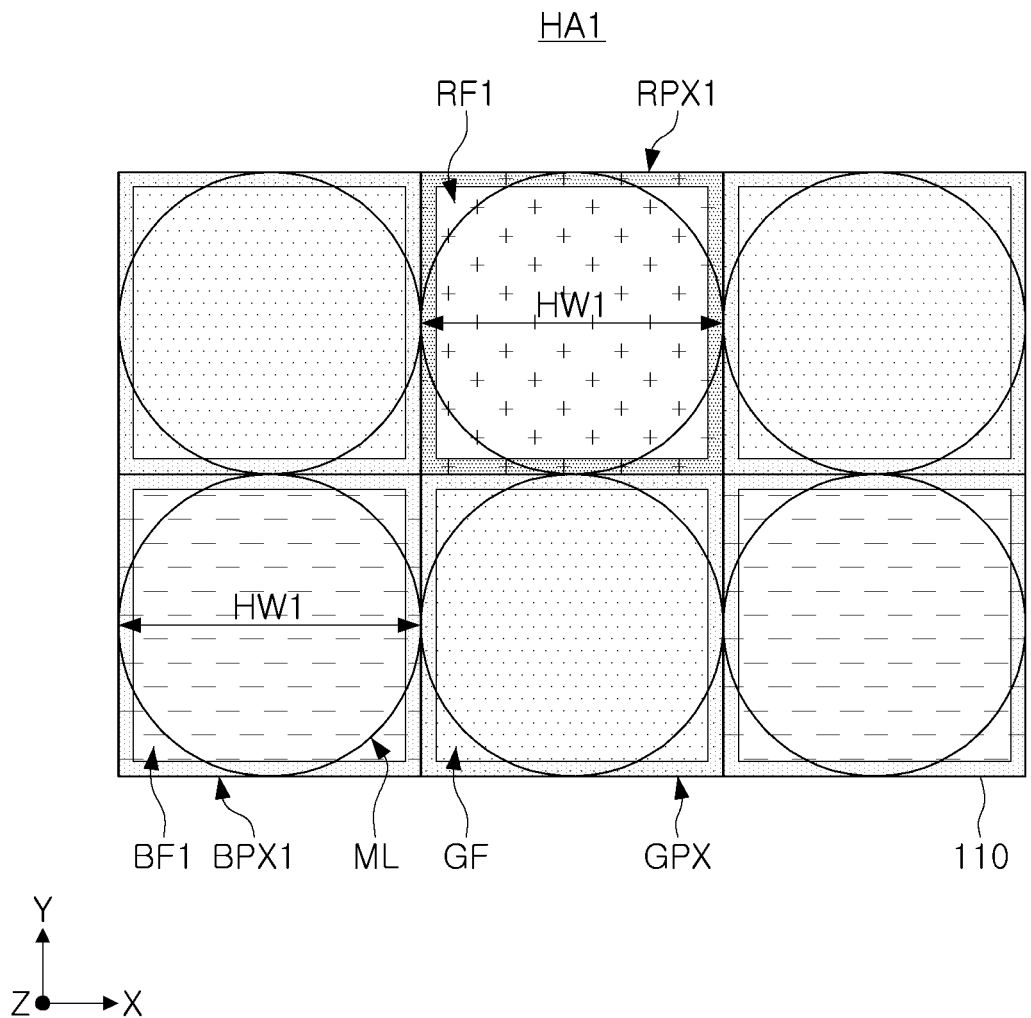
FIGS. 7A, 7B, 8A, and 8B are diagrams illustrating a pixel array of an image sensor according to an example embodiment.
Figure 7B:
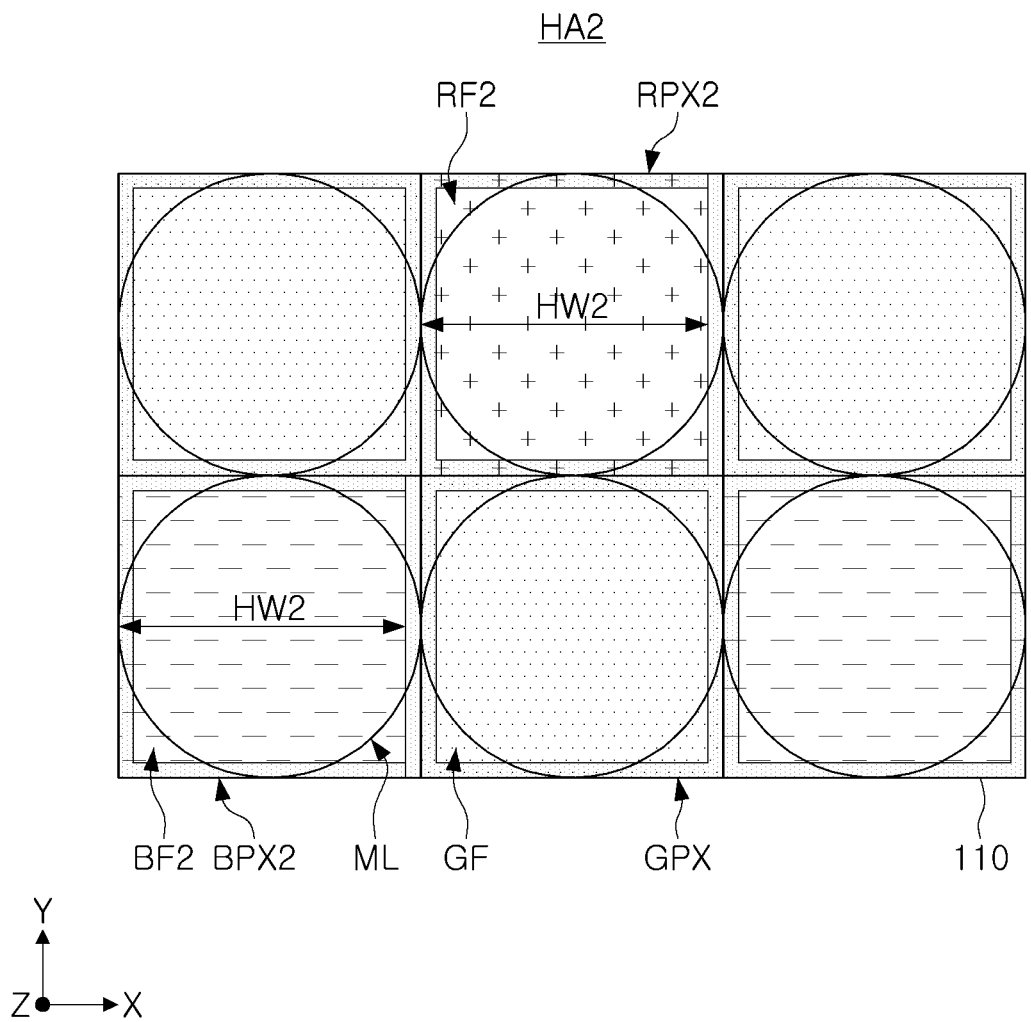

FIGS. 7A and 7B are plan views illustrating a portion of pixels disposed in the first area HA1 and the second area HA2, respectively. The first area HA1 is an area closer to the center of the pixel array than the second area HA2, and the pixels are arranged in the first direction (X-axis direction) and the second direction (Y-axis direction). Each of the pixels may include a microlens ML, the green pixel GPX may include a green color filter GF, and the blue pixel BPX may include blue color filters BF1 and BF2.

Referring to FIG. 7A, the first red pixel RPX1 may include a first red color filter RF1, and the first blue pixel BPX1 may include a first blue color filter BF1. On the other hand, referring to FIG. 7B, the second red pixel RPX2 may include a second red color filter RF2, and the second blue pixel BPX2 may include a second blue color filter BF2. The second red color filter RF2 may have a smaller size than the first red color filter RF1 (e.g., smaller overall size and smaller size from a plan view), and the second blue color filter BF2 may have a smaller size than the first blue color filter BF1 (e.g., smaller overall size and smaller size from a plan view). In the second area HA2, the second red color filter RF2 and the second blue color filter BF2 may each have a smaller size than the green color filter GF (e.g., smaller size from a plan view, and in some cases, smaller overall size).

Figure 8A:
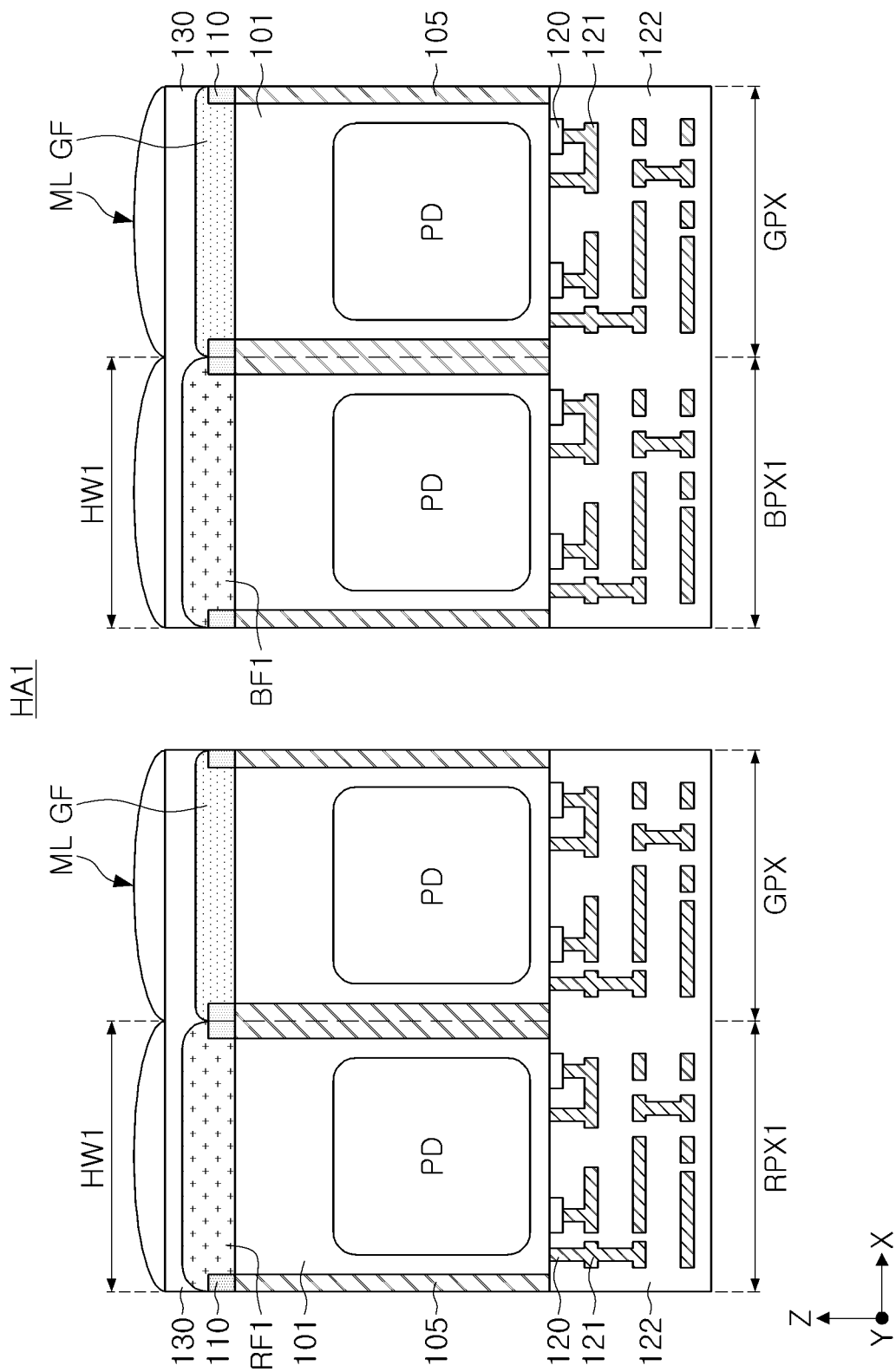
Figure 8B:
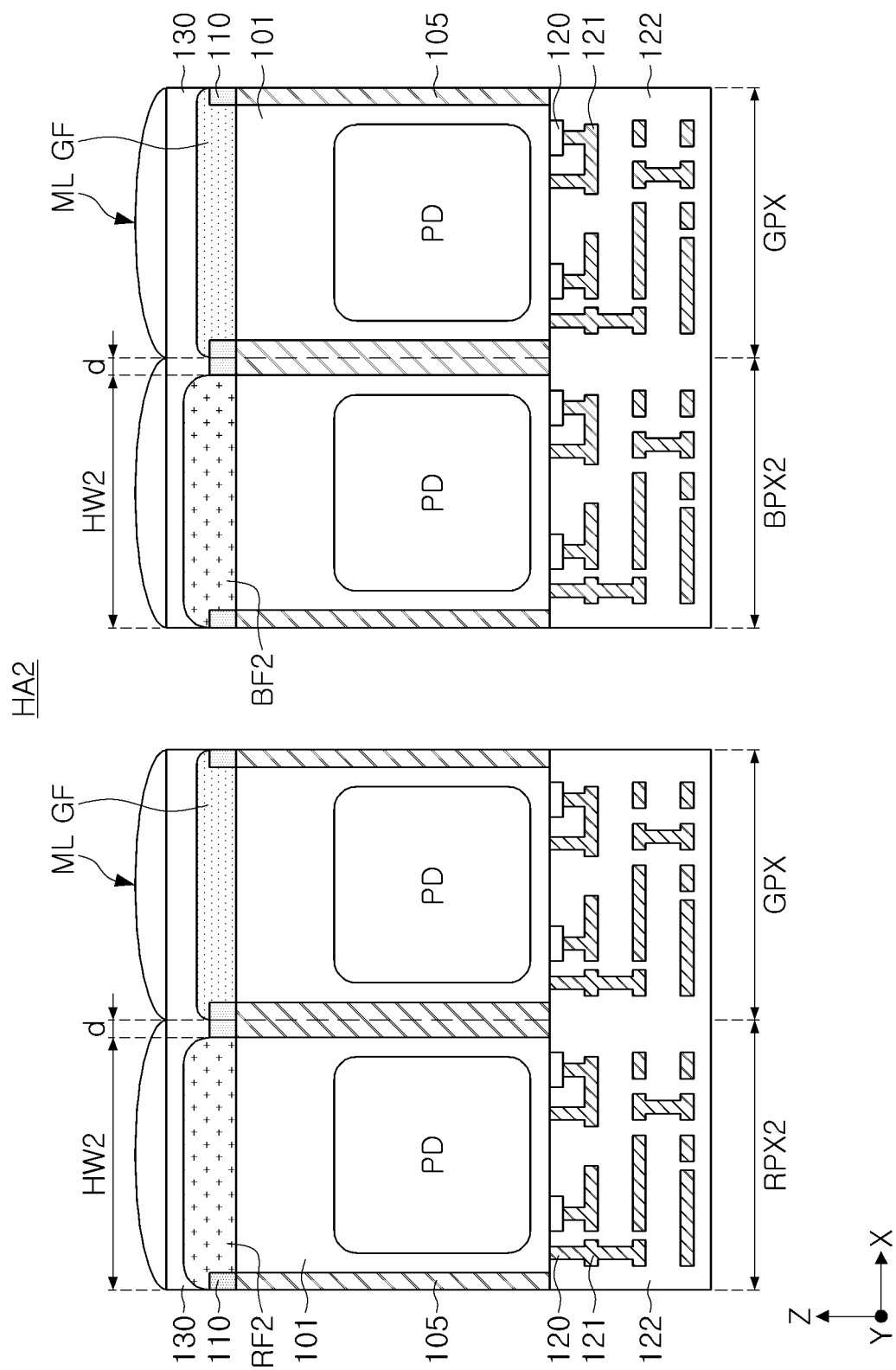

For example, the second red color filter RF2 and the second blue color filter BF2 may have shorter respective lengths than the first red color filter RF1 and the first blue color filter BF1 in the first direction. Referring to FIGS. 8A and 8B, while the first red color filter RF1 and the first blue color filter BF1 have a first horizontal length HW1 in the first direction, the second red color filter RF2 and the second blue color filter BF2 may have a second horizontal length HW2 in the first direction.

In the example embodiment illustrated in FIGS. 8A and 8B, although the difference d in length d between the first red color filter RF1 and the second red color filter RF2 is illustrated as the same as the difference d in length between the first blue color filter BF1 and the second blue color filter BF2, this is only an example embodiment and may vary. For example, when the thickness of the first blue color filter BF1 and the second blue color filter BF2 are the same as the thickness of the first red color filter RF1 and the second red color filter RF2, a length difference d between the first red color filter RF1 and the second red color filter RF2 may be equal to a length difference d between the first blue color filter BF1 and the second blue color filter BF2. On the other hand, the thicknesses of the first blue color filter BF1 and the second blue color filter BF2 may be greater than the thicknesses of the first red color filter RF1 and the second red color filter RF2, and in this case, a length difference between the blue color filter BF1 and the second blue color filter BF2 may be greater than a length difference between the first red color filter RF1 and the second red color filter RF2.

Also, according to example embodiments, the thicknesses of the red color filters RF1 and RF2, the blue color filters BF1 and BF2, and the green color filter GF may be substantially the same. In detail, as described above with reference to FIG. 6C, there may be substantially no thickness difference between the color filters. In this case, as described with reference to FIG. 8B, in the second area HA2, the second red color filter RF2 and the second blue color filter BF2 have substantially the same size as each other (e.g., overall size and size from a plan view), and may have a size (e.g., overall size and size from a plan view) smaller than the green color filter GF.

FIGS. 9, 10A, 10B, 11A, and 11B are diagrams illustrating a pixel array of an image sensor according to an example embodiment.

Figure 9:
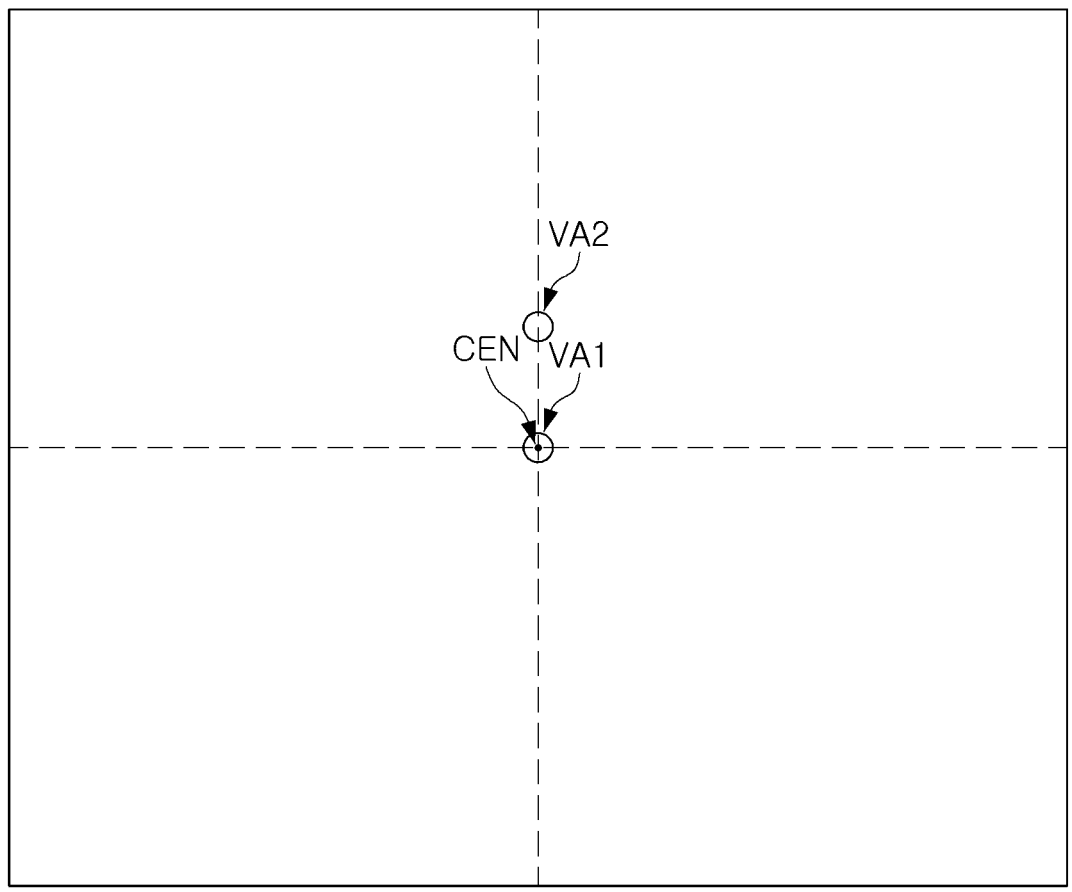
FIGS. 9, 10A, 10B, 11A, and 11B are diagrams illustrating a pixel array of an image sensor according to an example embodiment.

First, referring to FIG. 9, in a pixel array 100 of an image sensor according to an example embodiment, a first area VA1 and a second area VA2 may be defined. The first area VA1 may be an area separated by a first distance from a center CEN of the pixel array 100 in the second direction (Y-axis direction), and the second area HA2 may be an area separated from the center CEN by a second distance in the second direction. The first distance may be shorter than the second distance, and thus, the first area VA1 may be disposed to be closer to the center CEN of the pixel array 100, relative to the second area VA2.

Figure 10A:
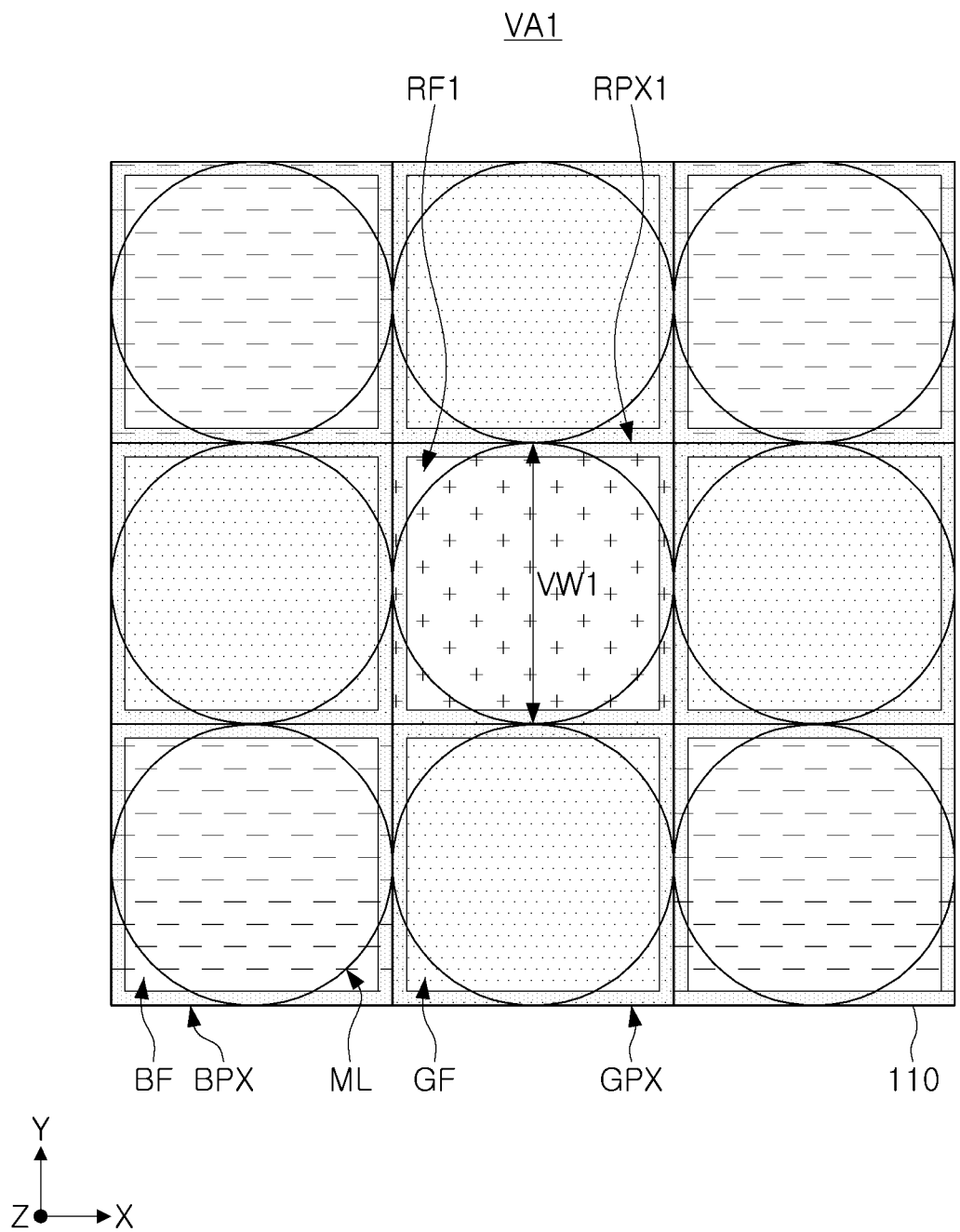
Figure 10B:
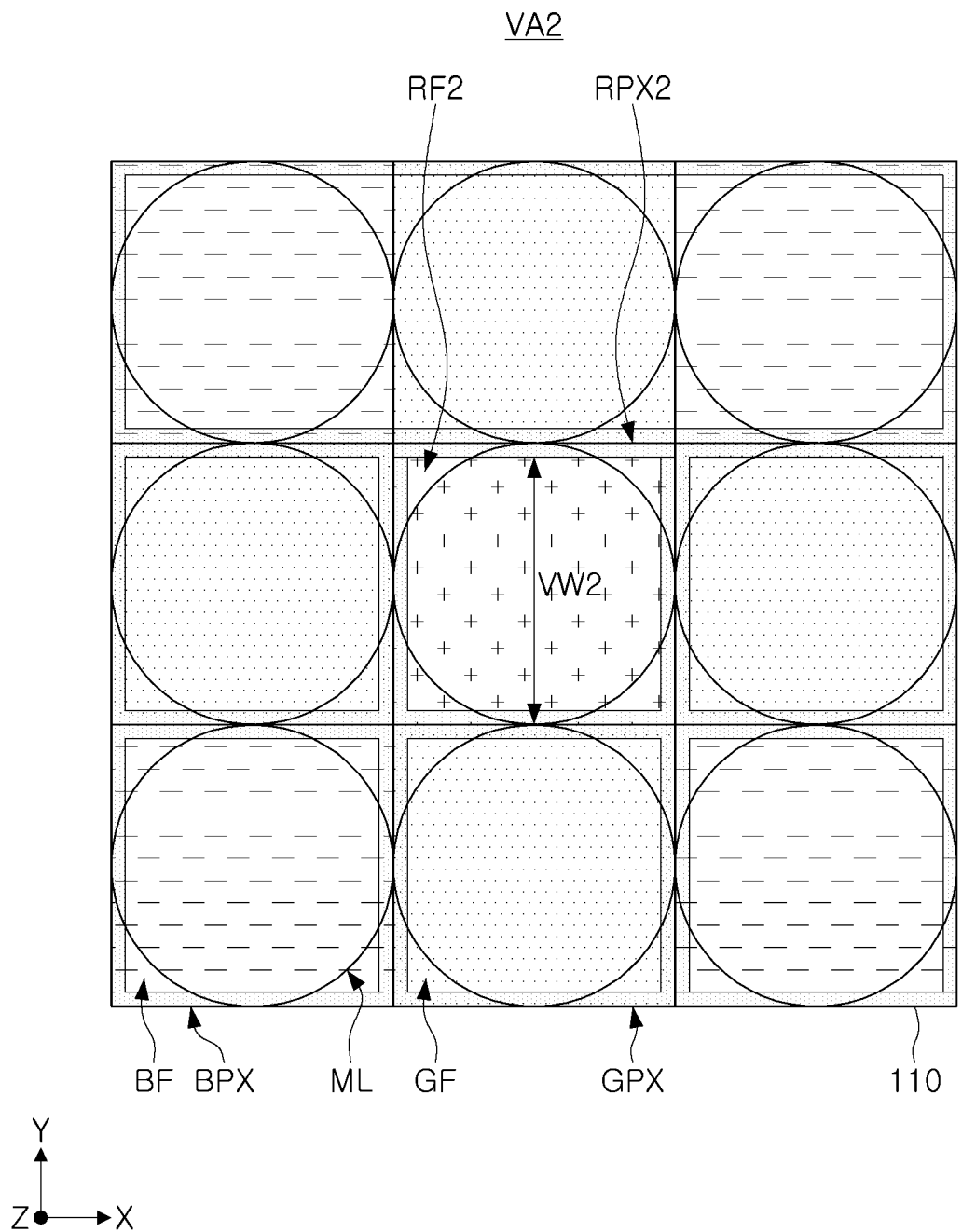

FIGS. 10A and 10B are plan views illustrating portions of pixels disposed in the first area VA1 and the second area VA2, respectively. In each of the first area VA1 and the second area VA2, pixels may be arranged in a first direction (X-axis direction) and a second direction. Referring to FIGS. 10A and 10B, a first red pixel RPX1, a green pixel GPX and a blue pixel BPX may be disposed in the first area VA1, and a second red pixel RPX2, a green pixel GPX and a blue pixel BPX may be disposed in the second area VA2. Each of the pixels may include a microlens ML, and the green pixel GPX may include a green color filter GF. On the other hand, the first red pixel RPX1 may include a first red color filter RF1, and the second red pixel RPX2 may include a second red color filter RF2. The grid structure 110 may be disposed between the color filters to extend in the first direction and the second direction and divide the pixels.

The first red color filter RF1 may have a smaller size than the second red color filter RF2. For example, in the second direction, the first red color filter RF1 may have a first vertical length VW1, and the second red color filter RF2 may have a second vertical length VW2 shorter than the first vertical length VW1.

Figure 11A:
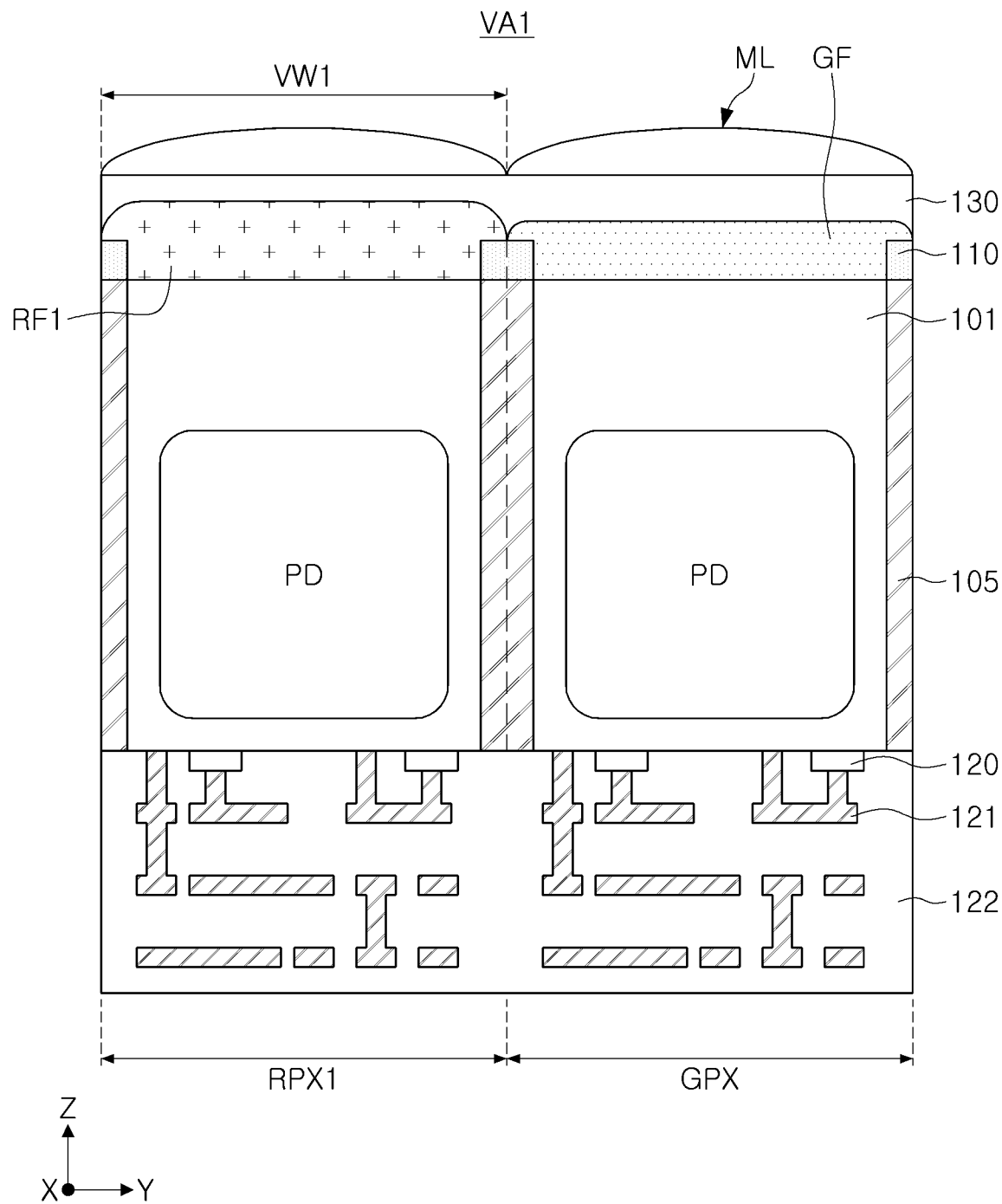
Figure 11B:
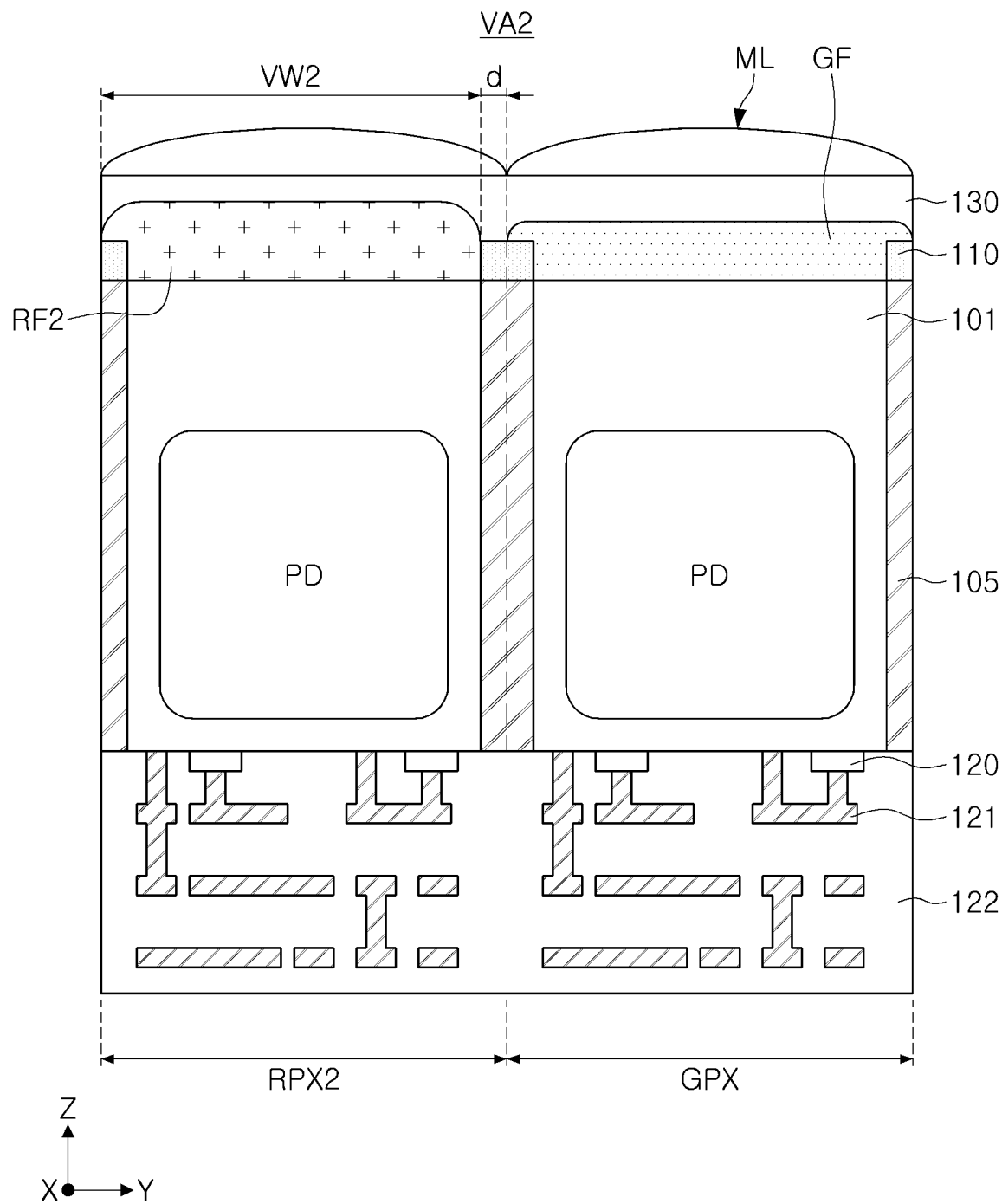

FIG. 11A is a cross-sectional view illustrating a partial cross-section of the first area VA1, and FIG. 11B is a cross-sectional view illustrating a partial cross-section of the second area VA2. A structure of each of the pixels may be similar to that described above with reference to FIGS. 6A and 6B. For example, the first red color filter RF1 and the second red color filter RF2 may have a relatively greater thickness than that of the green color filter GF. However, in some embodiments, the first red color filter RF1 and the second red color filter RF2 may have substantially the same thickness as the green color filter GF.

The second red color filter RF2 may be formed to have a smaller size than the first red color filter RF1. For example, in the second direction, the second red color filter RF2 may have a shorter length than the first red color filter RF1, and in a plane parallel to the upper surface of the substrate 101, the area of the second red color filter RF2 may be smaller than the area of the first red color filter RF1. Accordingly, a phenomenon in which a portion of light incident on the green pixel GPX in the second area VA2 is absorbed and/or blocked by the second red color filter RF2 may be significantly reduced, and the quality of the image generated by the image sensor may be improved.

A difference in shape between the first red color filter RF1 and the second red color filter RF2 may be understood referring to the descriptions with reference to FIGS. 6A to 6D. Also, as described with reference to FIGS. 8A and 8B, the blue color filters BF included in the first area VA1 and the second area VA2, respectively, may have different sizes. For example, the blue color filter BF included in the second area VA2 may have a relatively smaller size than the blue color filter BF included in the first area VA1.

FIGS. 12 and 13A to 13J are diagrams illustrating a pixel array of an image sensor according to an example embodiment.

Figure 12:
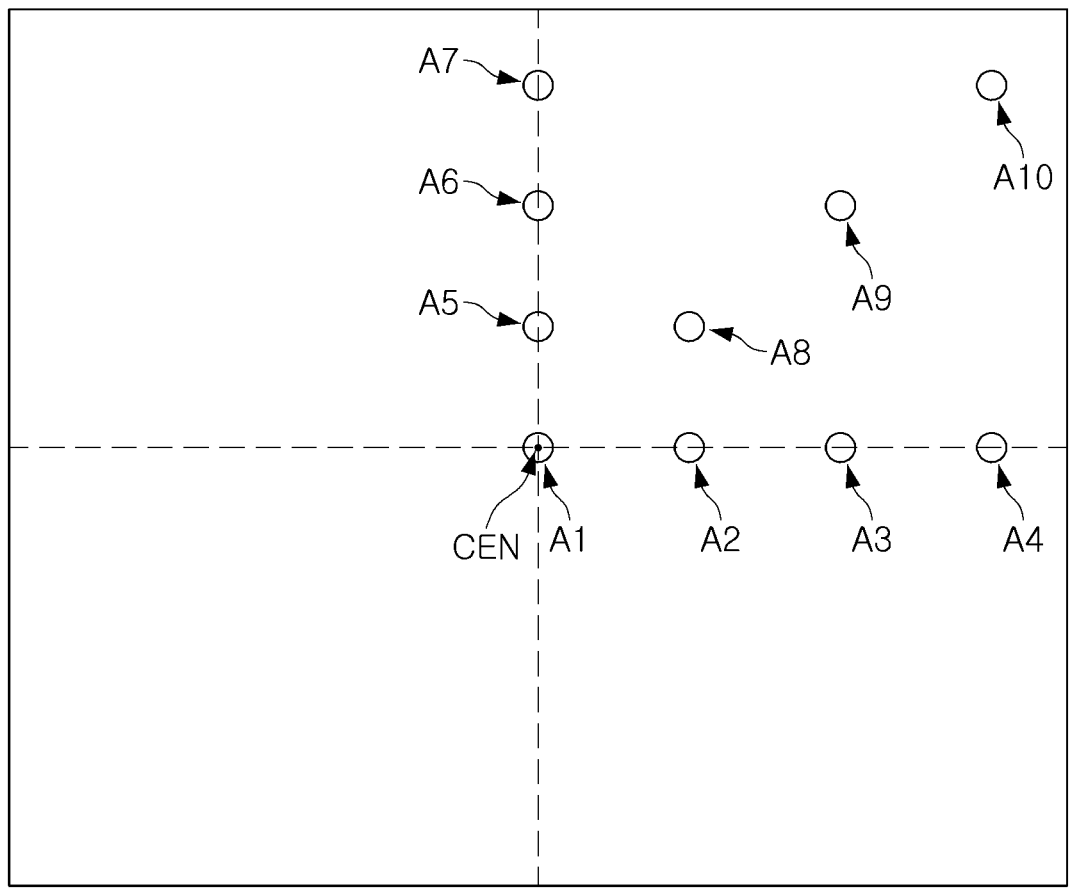
FIGS. 12 and 13A to 13J are diagrams illustrating a pixel array of an image sensor according to an example embodiment.
Figure 12:
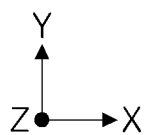

Referring first to FIG. 12, in a pixel array 200 of an image sensor according to an example embodiment, a plurality of areas A1 to A10 may be defined. The plurality of areas A1 to A10 may be defined by a distance from the center CEN of the pixel array 200 and a direction in which the areas are separated from the center CEN. For example, the first area A1 may be a region closest to the center CEN. The second to fourth areas A2-A4 may be regions separated from the center CEN in the first direction (X-axis direction), and the fifth to seventh areas A5 to A7 may be regions separated from the center CEN in the second direction (Y-axis direction). The eighth to tenth areas A8 to A10 may be regions separated from the center CEN in a diagonal direction intersecting the first and second directions.

FIGS. 13A to 13J are plan views schematically illustrating pixels included in each of the plurality of areas A1 to A10. A red pixel, a green pixel, and a blue pixel may be disposed in each of the plurality of areas A1-A10, and each of the pixels may include a microlens ML.

The pixels may also be separated by a grid structure 210.

Figure 13A:
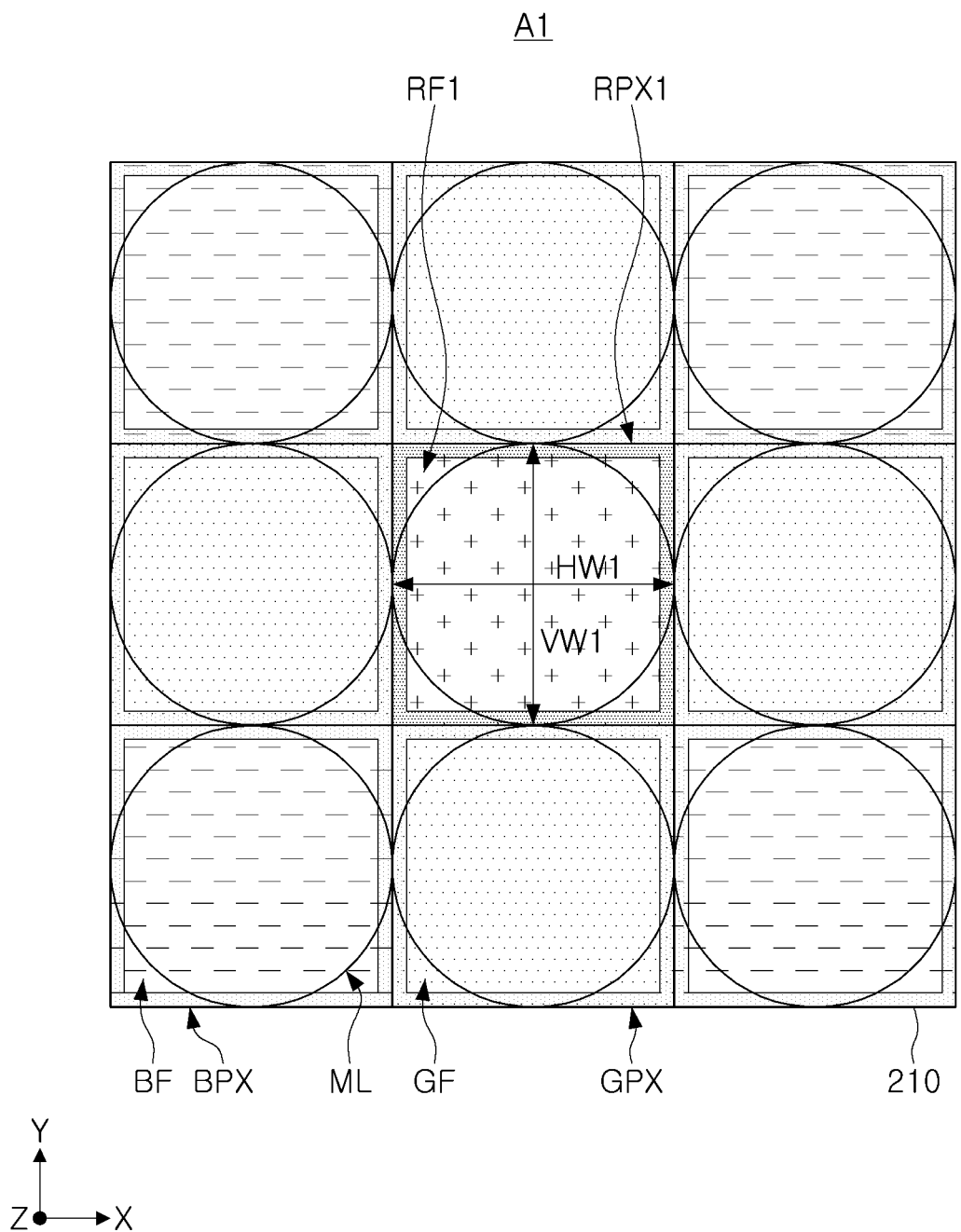

Referring to FIG. 13A, a first red pixel RPX1, a green pixel GPX, and a blue pixel BPX may be disposed in the first area A1. The first red pixel RPX1 may have a color filter having the same size (e.g., overall size and size from a plan view), and same shape, as the green pixel GPX and the blue pixel BPX, which are other pixels included in the first area A1. Referring to FIG. 13A, the first red color filter RF1 has the same first horizontal length HW1 and first vertical length VW1 as those of the green color filter GF and the blue color filter BF in the first direction and the second direction.

Figure 13B:
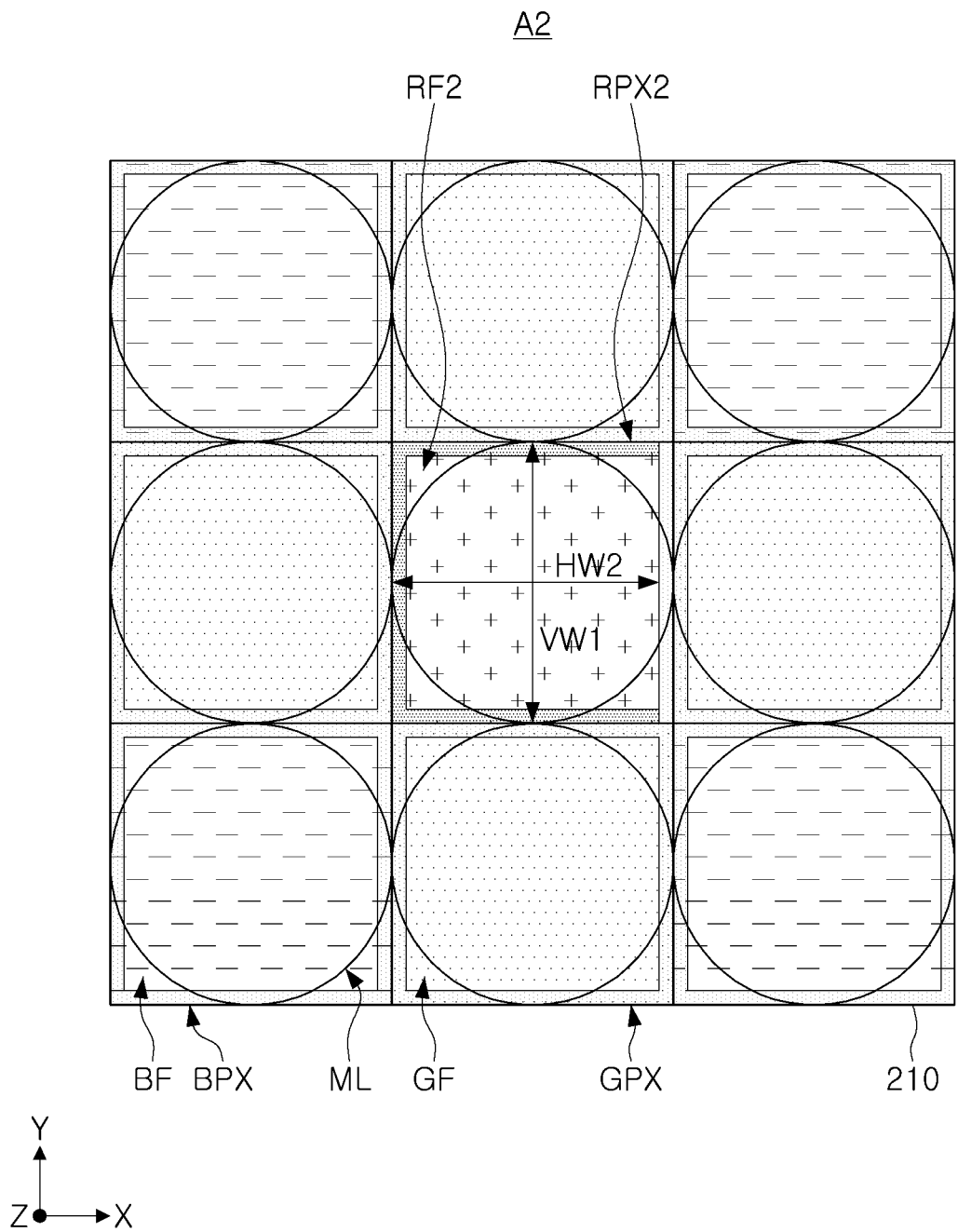

Next, referring to FIG. 13B, a second red pixel RPX2, a green pixel GPX, and a blue pixel BPX may be disposed in the second area A2. Unlike the first red pixel RPX1, the second red pixel RPX2 may have a color filter having a size different from that of the green pixel GPX and the blue pixel BPX. Referring to FIG. 13B, the second red color filter RF2 may have a smaller size (e.g., overall size and size from a plan view) than the first red color filter RF1. For example, in the first direction, the second red color filter RF2 may have a second horizontal length HW2 less than that of the green color filter GF and the blue color filter BF. Accordingly, a phenomenon, in which a portion of light that should be incident on the green pixel GPX disposed between the second red pixel RPX2 and the edge of the pixel array 200 in the first direction is absorbed and/or blocked by the second red color filter RF2, may be significantly reduced.

Figure 13C:
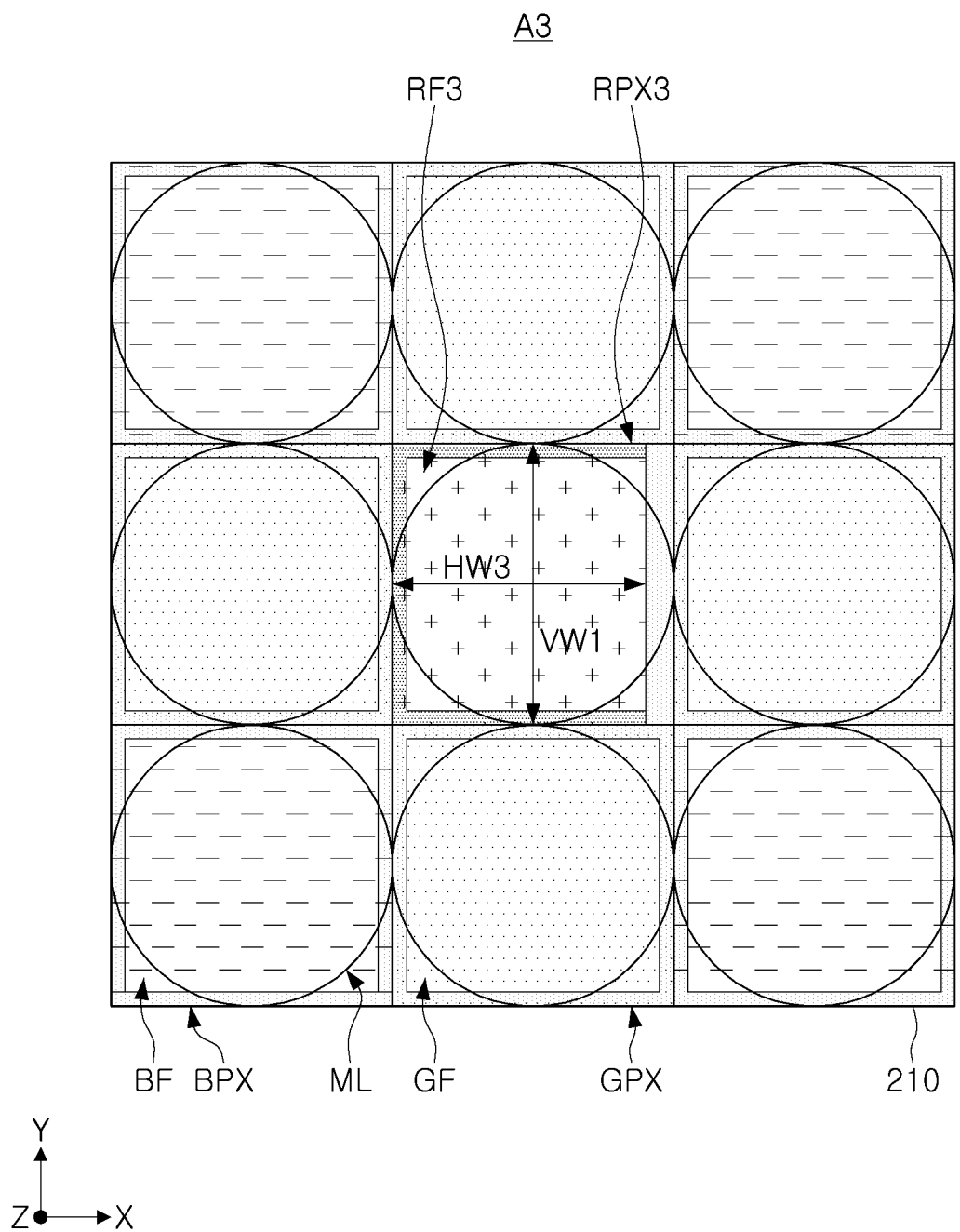

Referring to FIG. 13C, a third red pixel RPX3, a green pixel GPX, and a blue pixel BPX may be disposed in the third area A3. The third red pixel RPX3 may have a color filter having a size smaller than that of the second red pixel RPX2. Referring to FIG. 13C, the third red color filter RF3 has a smaller size (e.g., from a plan view and in some cases also an overall size) than the green color filter GF and the blue color filter BF. For example, the third red color filter RF3 may have a third horizontal length HW3 shorter than the second horizontal length HW2 in the first direction. Accordingly, a phenomenon, in which a portion of the light that should be incident on the green pixel GPX disposed on the right side of the third red pixel RPX3 is absorbed and/or blocked by the third red color filter RF3, may be significantly reduced.

Figure 13D:
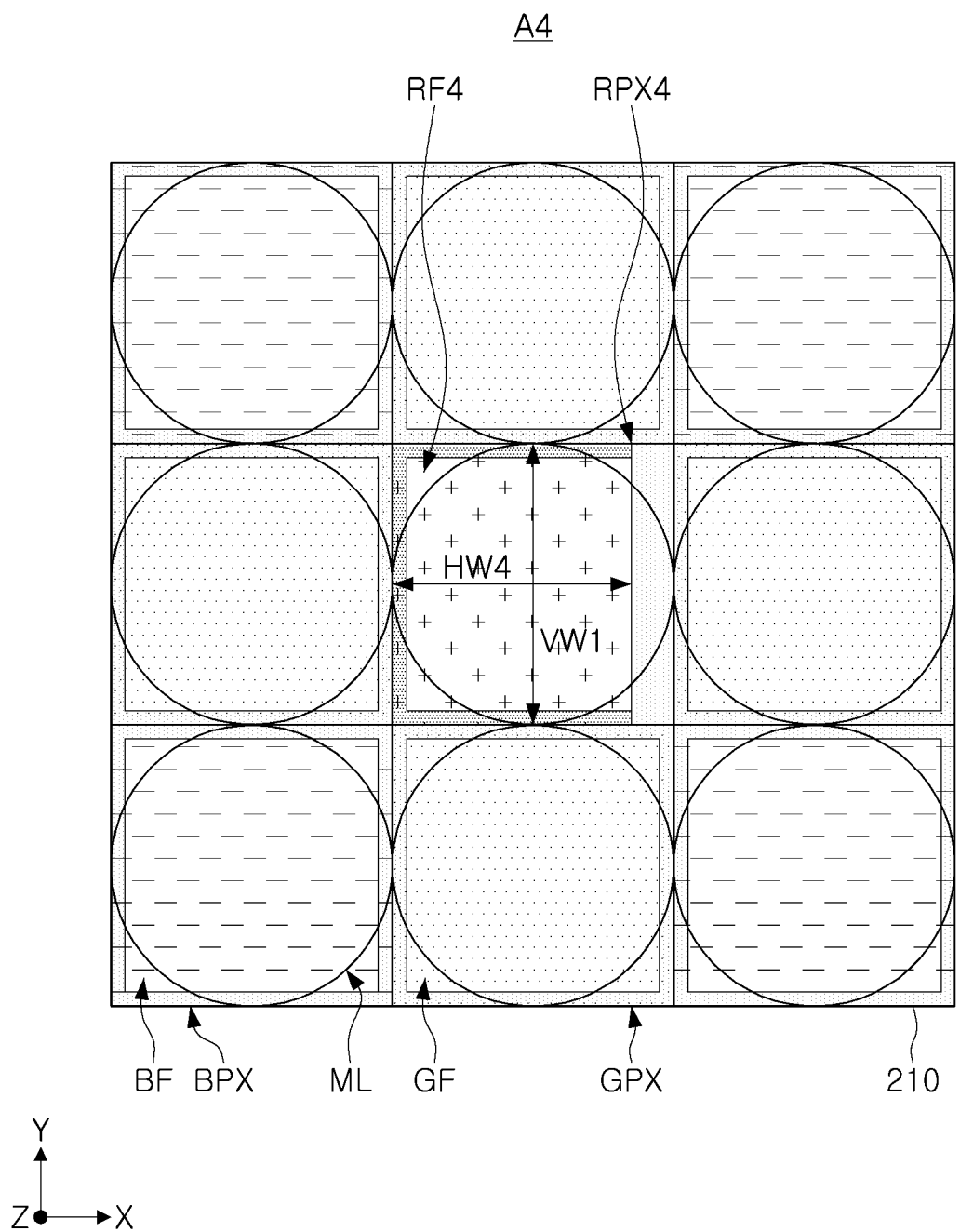

Referring to FIG. 13D, a fourth red pixel RPX4, a green pixel GPX, and a blue pixel BPX may be disposed in the fourth area A4. The fourth red pixel RPX4 may have a color filter having a size smaller than that of the third red pixel RPX3. Referring to FIG. 13D, the fourth red color filter RF4 has a smaller size (e.g., from a plan view and in some cases also an overall size) than the green color filter GF and the blue color filter BF, and in the first direction, the fourth reds color red color filter RF4 may have a fourth horizontal length HW4 shorter than the third horizontal length HW3. Accordingly, a phenomenon, in which a portion of light that should be incident on the green pixel GPX disposed on the right side of the fourth red pixel RPX4 is absorbed and/or blocked by the fourth red color filter RF4, may be significantly reduced.

Referring to FIGS. 13B to 13D, the size of the red color filter may be more reduced as the region is closer to the edge of the pixel array 200 in the first direction. Also, referring to FIGS. 13C and 13D, the size of the grid structure 210 may increase in regions adjacent to the third red pixel RPX3 and the fourth red pixel RPX4, as much as the sizes of the third red color filter RF3 and the fourth red color filter RF4 are decreased. Accordingly, a distance in the X-direction between right sides of red color filters and left sides of adjacent green color filters may increase in a direction from a center of the pixel array 200 toward the right edge of the pixel array 200.

Figure 13E:
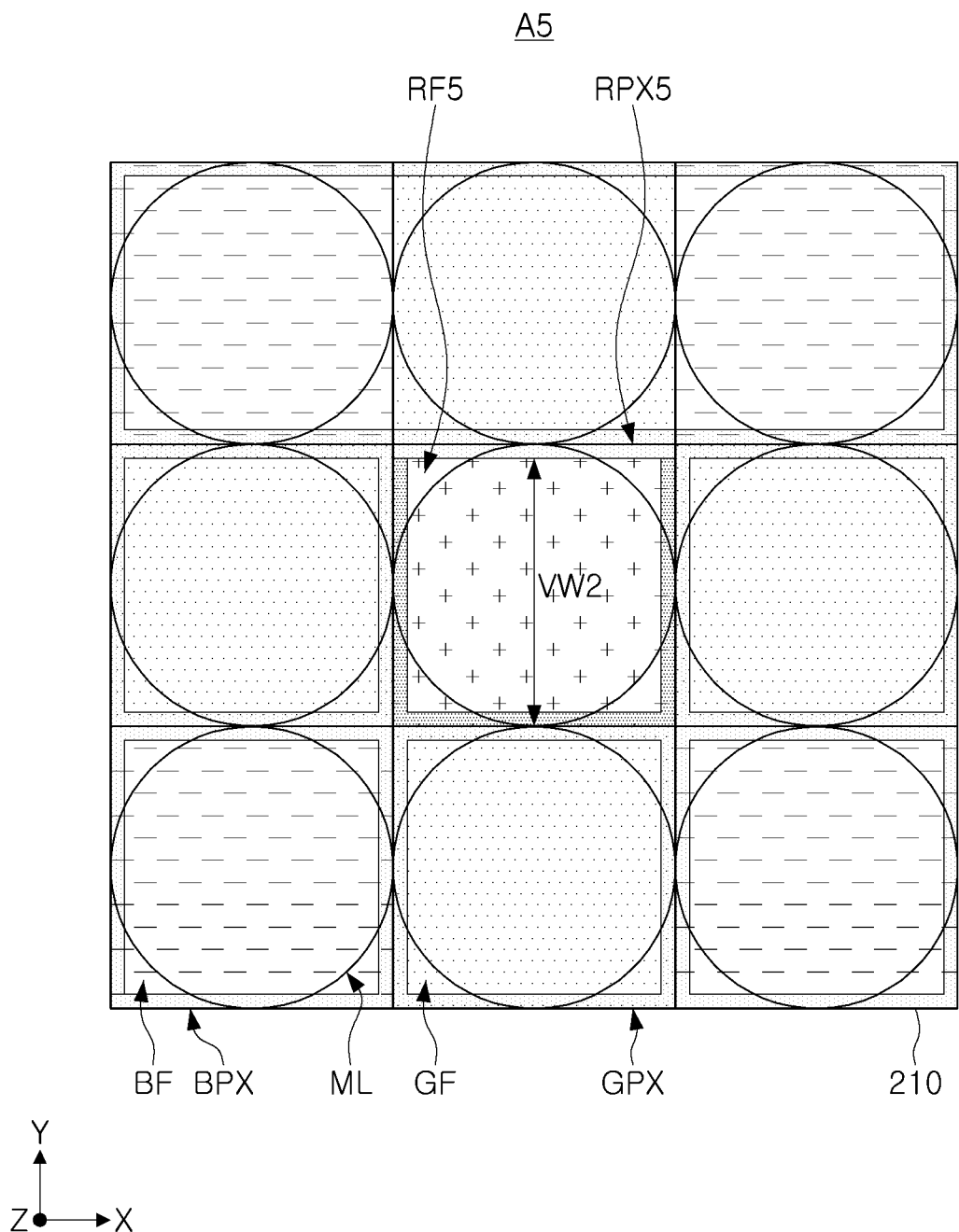

Next, referring to FIG. 13E, a fifth red pixel RPX5, a green pixel GPX, and a blue pixel BPX may be disposed in the fifth area A5. The fifth red pixel RPX5 may have a color filter having a size (e.g., from a plan view and in some cases also an overall size) different from that of the green pixel GPX and the blue pixel BPX. Referring to FIG. 13E, the fifth red color filter RF5 may have a smaller size than the green color filter GF and the blue color filter BF.

The fifth area A5 is an area separated from the center CEN of the pixel array 200 in the second direction, and the fifth red color filter RF5 may have a second vertical length VW2 less than a green color filter GF and a blue color filter BF. For example, the upper edge of the fifth red color filter RF5 may be disposed to be lower (in relation to the view shown in FIG. 13E) than the upper edge of the pair of green color filters GPX adjacent to both sides of the fifth red color filter RF5 in the first direction. Accordingly, a phenomenon in which a portion of light that should be incident on the green pixel GPX disposed above the fifth red pixel RPX5 in the second direction is absorbed and/or blocked by the fifth red color filter RF5 may be significantly reduced.

Figure 13F:
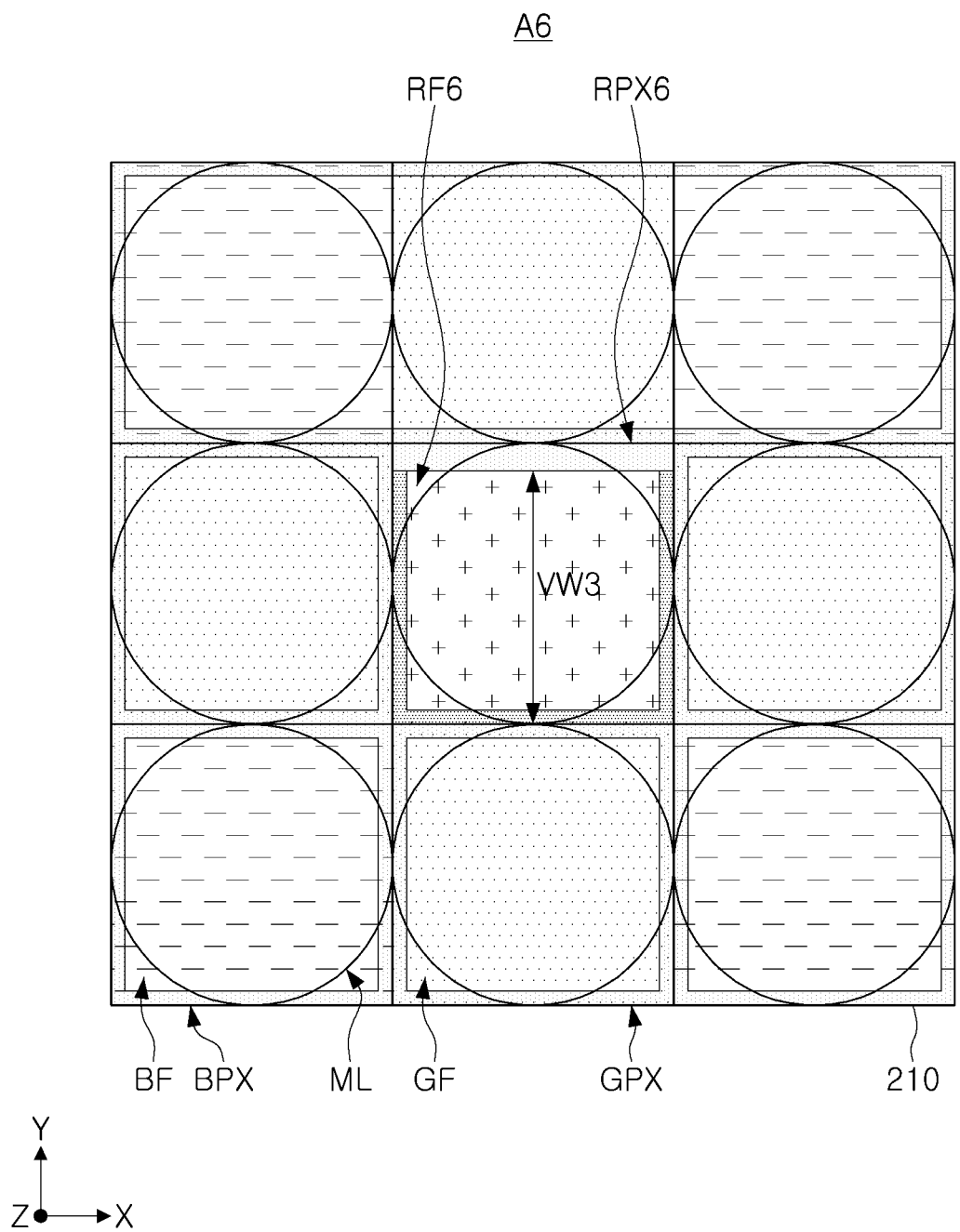

Referring to FIG. 13F, a sixth red pixel RPX6, a green pixel GPX, and a blue pixel BPX may be disposed in the sixth area A6. The sixth red pixel RPX6 may have a color filter having a size smaller than that of the fifth red pixel RPX5. Referring to FIG. 13F, the sixth red color filter RF6 may have a third vertical length VW3 shorter than the second vertical length VW2 in the second direction. Accordingly, a phenomenon in which a portion of light that should be incident on the green pixel GPX disposed on the sixth red pixel RPX6 is absorbed and/or blocked by the sixth red color filter RF6 may be significantly reduced.

Figure 13G:
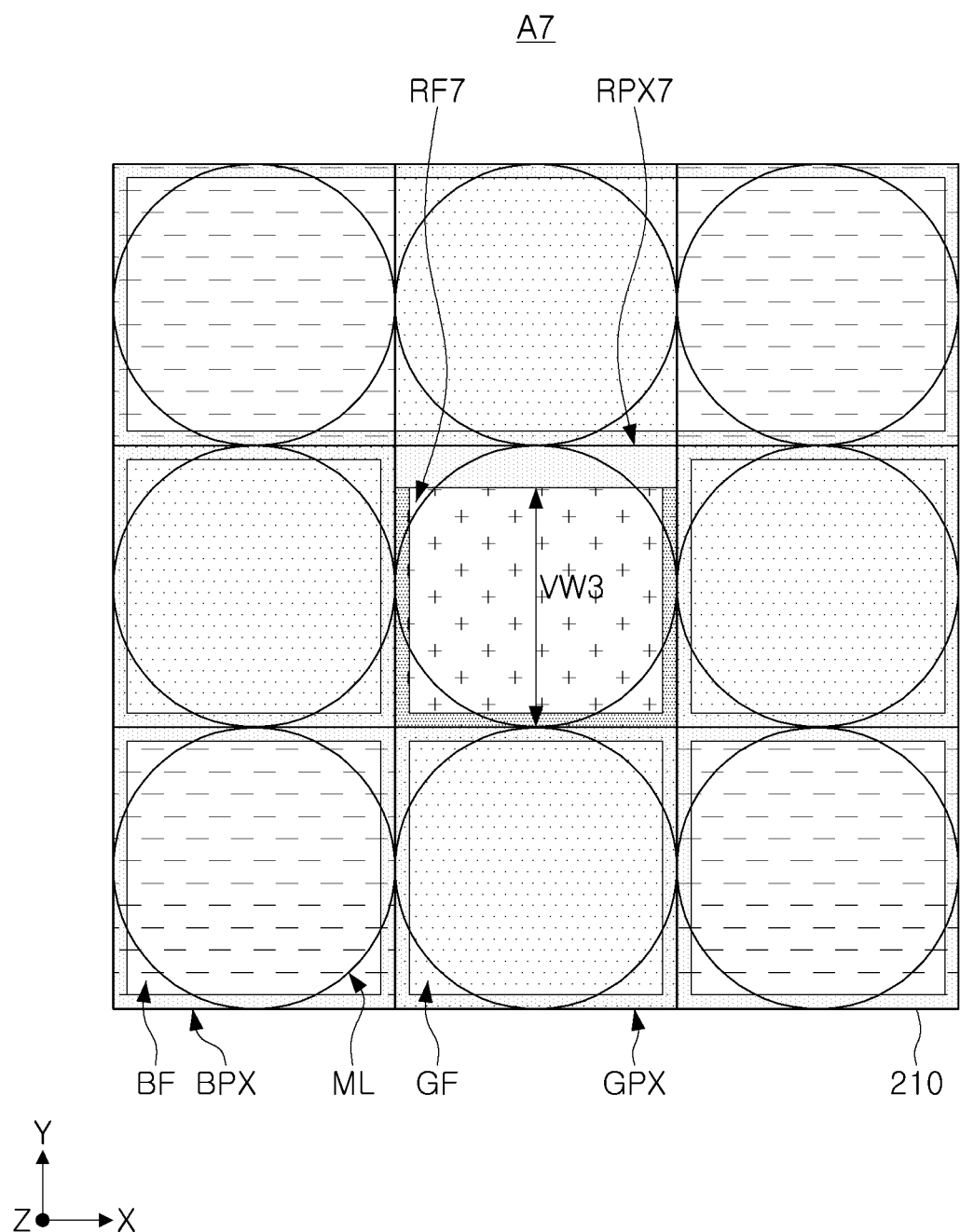

Referring to FIG. 13G, a seventh red pixel RPX7, a green pixel GPX, and a blue pixel BPX may be disposed in the seventh area A7. Referring to FIG. 13D, the seventh red pixel RPX7 may have a color filter having a size smaller than that of the sixth red pixel RPX6. The seventh red color filter RF7 may have a fourth vertical length VW4 shorter than the third vertical length VW3 in the second direction. Accordingly, a phenomenon in which a portion of the light that should be incident on the green pixel GPX disposed on the seventh red pixel RPX7 is absorbed and/or blocked by the seventh red color filter RF7 may be significantly reduced.

Referring to FIGS. 13E to 13G, the size of the red color filter may be further reduced as the region thereof is closer to the edge of the pixel array 200 in the second direction. Also, referring to FIGS. 13F and 13G, as much as the sizes of the sixth red color filter RF6 and the seventh red color filter RF7 are reduced, the size of the grid structure 210 may increase in the region adjacent to the sixth red pixel RPX6 and the seventh red pixel RPX7. Accordingly, a distance in the Y-direction between top sides of red color filters and bottom sides of adjacent green color filters may increase in a direction from a center of the pixel array 200 toward the top edge of the pixel array 200.

Figure 13H:
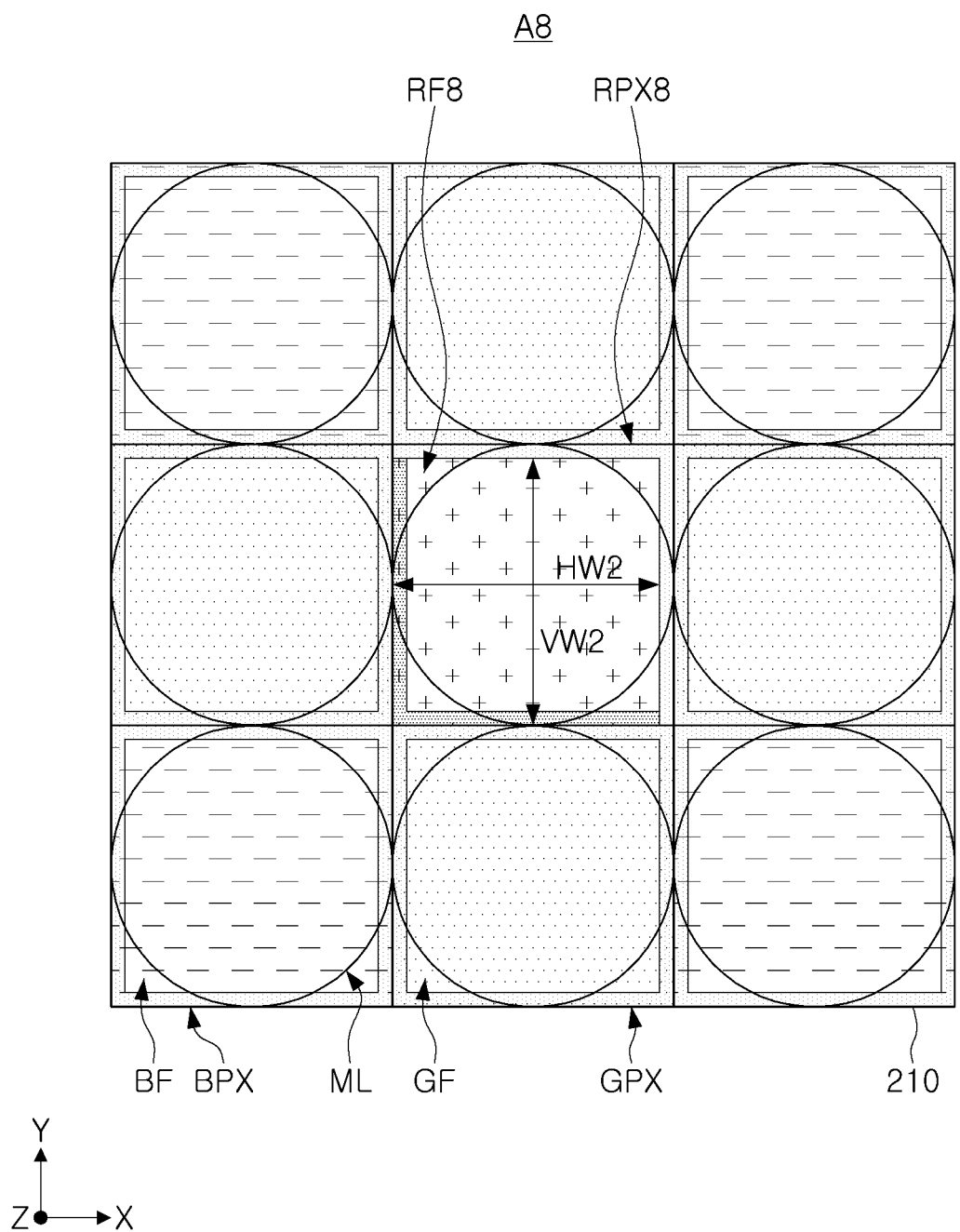

Next, referring to FIG. 13H, an eighth red pixel RPX8, a green pixel GPX, and a blue pixel BPX may be disposed in the eighth area A8. The eighth red pixel RPX8 may have a color filter having a size (e.g., from a plan view and in some cases also an overall size) different from that of the green pixel GPX and the blue pixel BPX. Referring to FIG. 13H, the eighth red color filter RF8 may have a smaller size than the green color filter GF and the blue color filter BF.

The eighth area A8 may be an area separated from the center CEN of the pixel array 200 in a diagonal direction intersecting the first direction and the second direction. For example, the eighth area A8 may be disposed at the same location as the second area A2 in the first direction, and may be disposed at the same location as the fifth area A5 in the second direction. Accordingly, the eighth red color filter RF8 may have a second horizontal length HW2 and a second vertical length VW2 smaller than the green color filter GF and the blue color filter BF. A phenomenon in which a portion of light that should be incident on the green pixels GPX disposed on the right and above the eighth red pixel RPX8 in the diagonal direction is absorbed and/or blocked by the eighth red color filter RF8 may be significantly reduced.

Figure 13I:
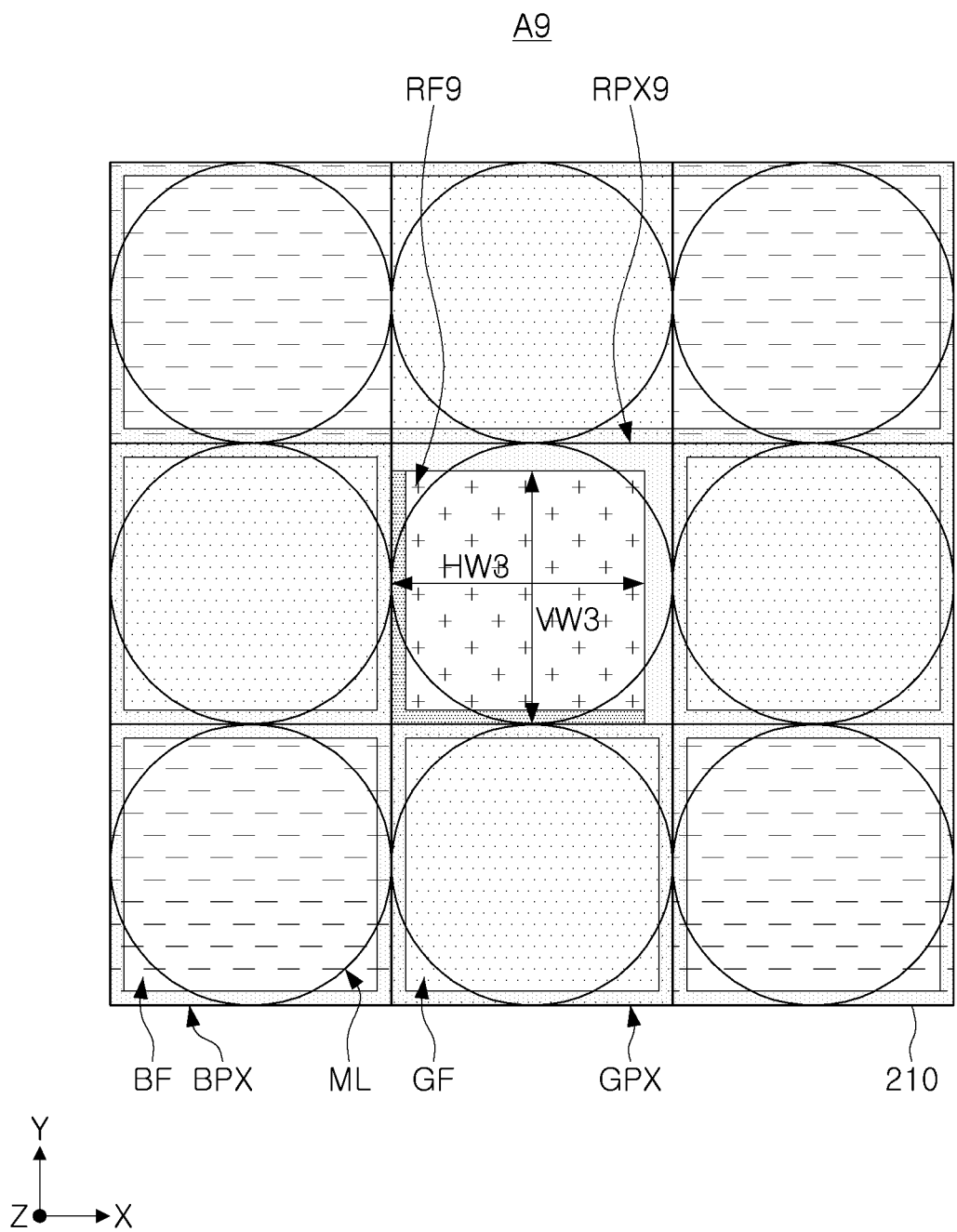

Referring to FIG. 13I, a ninth red pixel RPX9, a green pixel GPX, and a blue pixel BPX may be disposed in the ninth area A9. The ninth red pixel RPX9 may have a color filter having a size smaller than that of the eighth red pixel RPX8. Referring to FIG. 13I, the ninth red color filter RF9 may have a third horizontal length HW3 that is shorter than the second horizontal length HW2 in the first direction and may have a third vertical length VW3 that is shorter than the second vertical length VW2 in the second direction. Accordingly, a phenomenon in which a portion of light that should be incident on the green pixels GPX disposed on the right and above the ninth red pixel RPX9 is absorbed and/or blocked by the ninth red color filter RF9 may be significantly reduced.

Figure 13J:
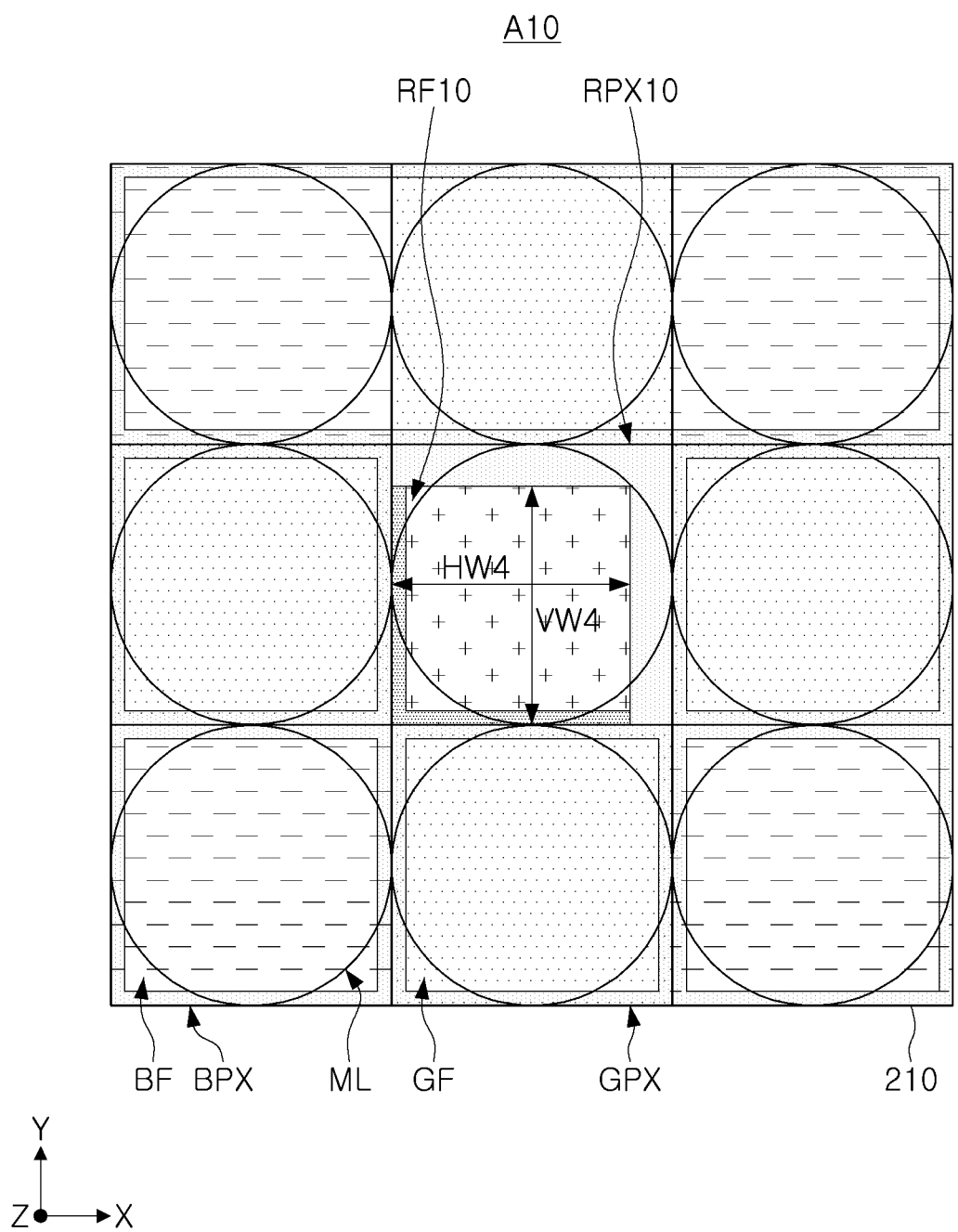

Referring to FIG. 13J, a tenth red pixel RPX10, a green pixel GPX, and a blue pixel BPX may be disposed in the tenth area A10. Referring to FIG. 13J, the tenth red pixel RPX10 may have a color filter having a size smaller than that of the ninth red pixel RPX9. The tenth red color filter RF10 has a fourth horizontal length HW4 that is shorter than the third horizontal length HW3 in the first direction, and a fourth vertical length VW4 that is shorter than the third vertical length VW3 in the second direction. Accordingly, a phenomenon in which a portion of light that should be incident on the green pixels GPX disposed on the right and above the tenth red pixel RPX10 is absorbed and/or blocked by the tenth red color filter RF10 may be significantly reduced.

Referring to FIGS. 13H to 13J, the size of the red color filter may be more reduced in the region closer to the edge and the corner of the pixel array 200 in the second direction. Also, referring to FIGS. 13I and 13J, as much as the sizes of the ninth red color filter RF9 and the tenth red color filter RF10 are reduced, the size of the grid structure 210 may increase in the region adjacent to the ninth red pixel RPX9 and the tenth red pixel RPX10.

FIGS. 14A to 14D are diagrams illustrating a pixel array of an image sensor according to an example embodiment.

FIGS. 14A to 14D are views illustrating cross-sections of a red pixel and a green pixel adjacent to the red pixel in the first to fourth areas A1 to A4. Referring to FIGS. 14A to 14D, each of the pixels includes a photodiode PD formed in a substrate 201, and the pixels may be separated from each other by a pixel separation layer 205. The pixel separation layer 205 may extend in the first direction and the second direction, below the grid structure 210, to separate pixels from each other, and may extend in a third direction (Z-axis direction).

The substrate 201 may include a first surface and a second surface opposing each other, and a light transmitting portion including a color filter, a planarization layer 230, and a microlens ML may be disposed on the first surface in each of the pixels. On the other hand, elements 220 constituting the pixel circuit, and wiring patterns 221, may be formed on the second surface in each of the pixels. The devices 220 and the wiring patterns 221 may be covered by the insulating layer 222.

Referring to FIGS. 14A to 14D, the size of each of the red color filters RF1 to RF4 may decrease as it approaches the edge of the pixel array 200. Since the first to fourth areas A1 to A4 are disposed in positions further away from the center CEN in the first direction and disposed in the same position in the second direction, the size of the red color filters RF1 to RF4 may be gradually decreased as they are closer to the edge in the first direction.

As the sizes of the red color filters RF1 to RF4 decrease in the first direction, the distance between each of the red color filters RF1 to RF4 and the adjacent green color filter GF may appear differently in the first to fourth areas (A1-A4). For example, referring to FIG. 14A, in the first area A1, the first red color filter RF1 and the green color filter GF may be in contact with each other or directly adjacent to each other in the first direction. On the other hand, referring to FIG. 14B, in the second area A2, a first distance d1 may be present between the second red color filter RF2 and the green color filter GF in the first direction.

Figure 14A:
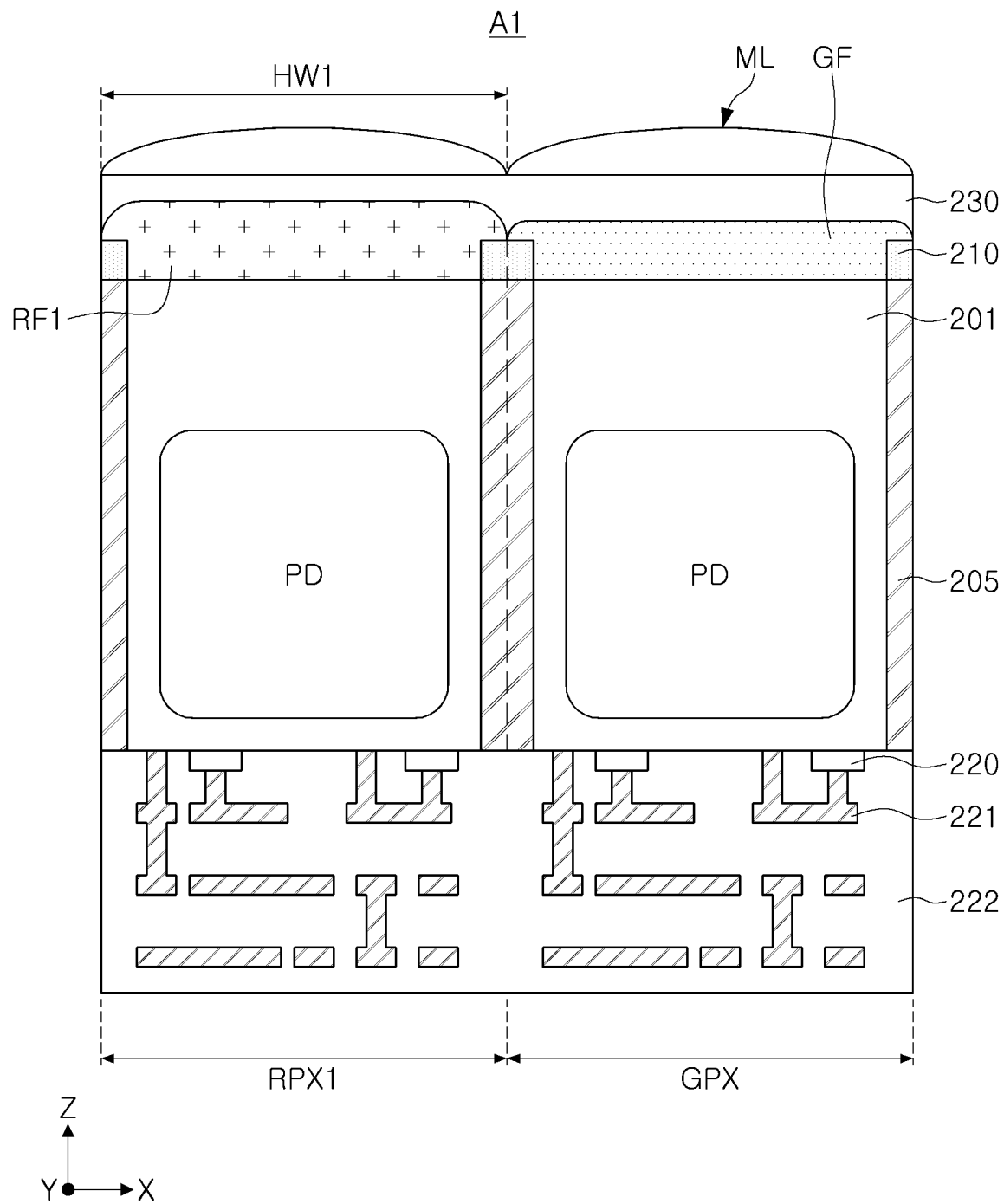
FIGS. 14A to 14D are diagrams illustrating a pixel array of an image sensor according to an example embodiment.
Figure 14B:
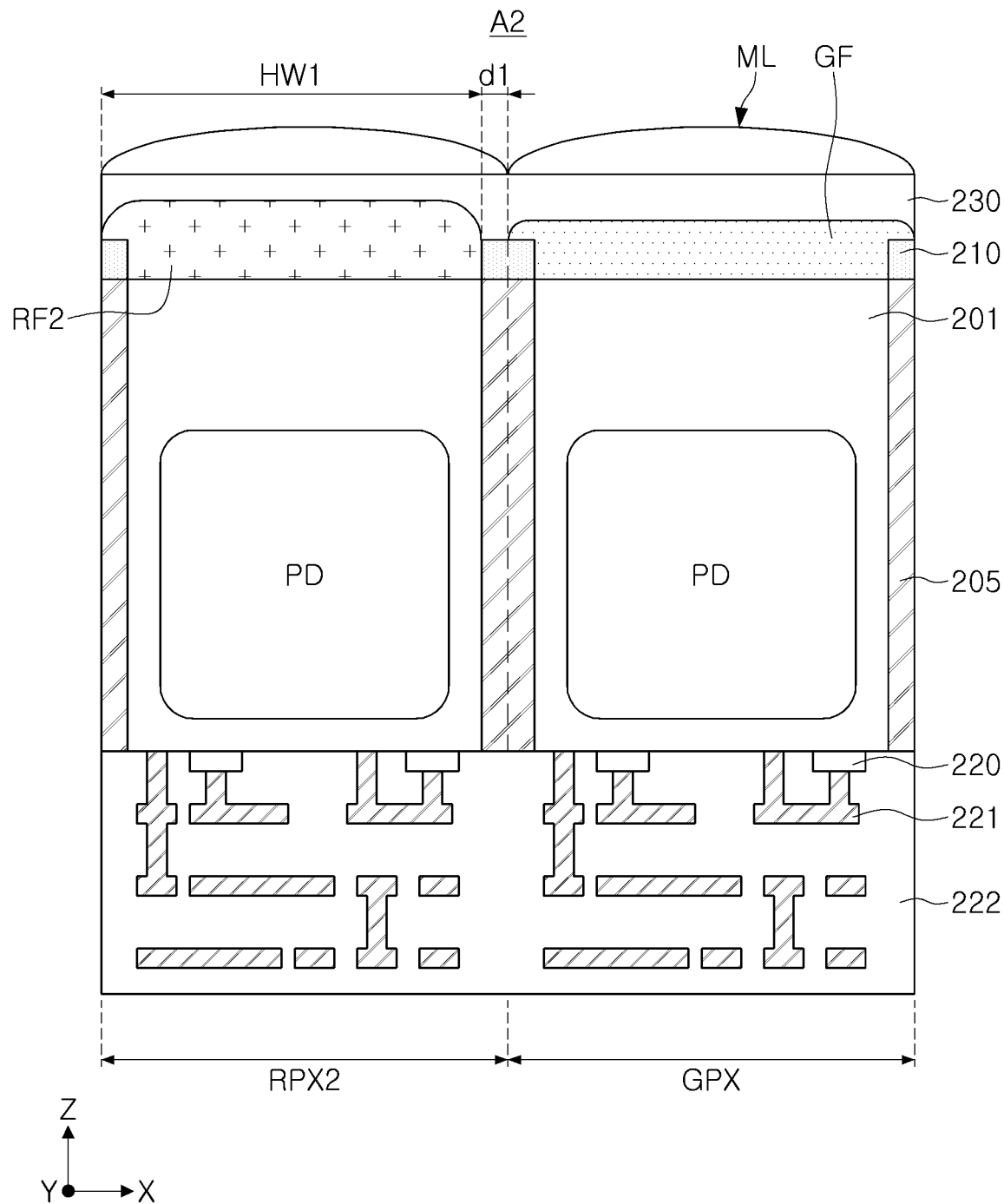
Figure 14C:
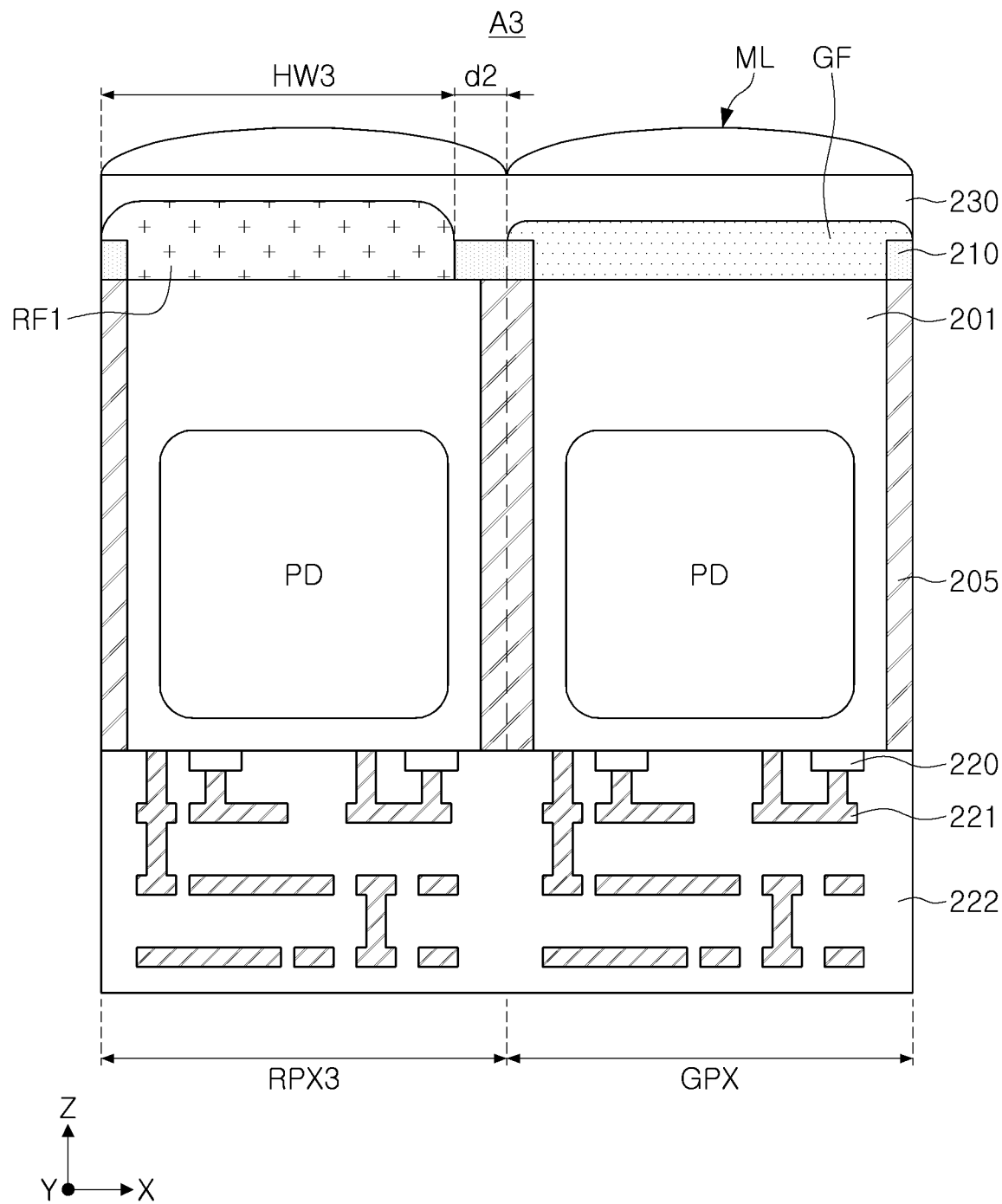

Next, referring to FIG. 14C, in the third area A2, a second distance d2 may be present between the third red color filter RF3 and the green color filter GF. Also, referring to FIG. 14D, in the fourth area A4, a third distance d3 may be present between the fourth red color filter RF4 and the green color filter GF in the first direction. The first distance d1 may be less than the second distance d2, and the third distance d3 may be greater than the second distance d2.

Figure 14D:
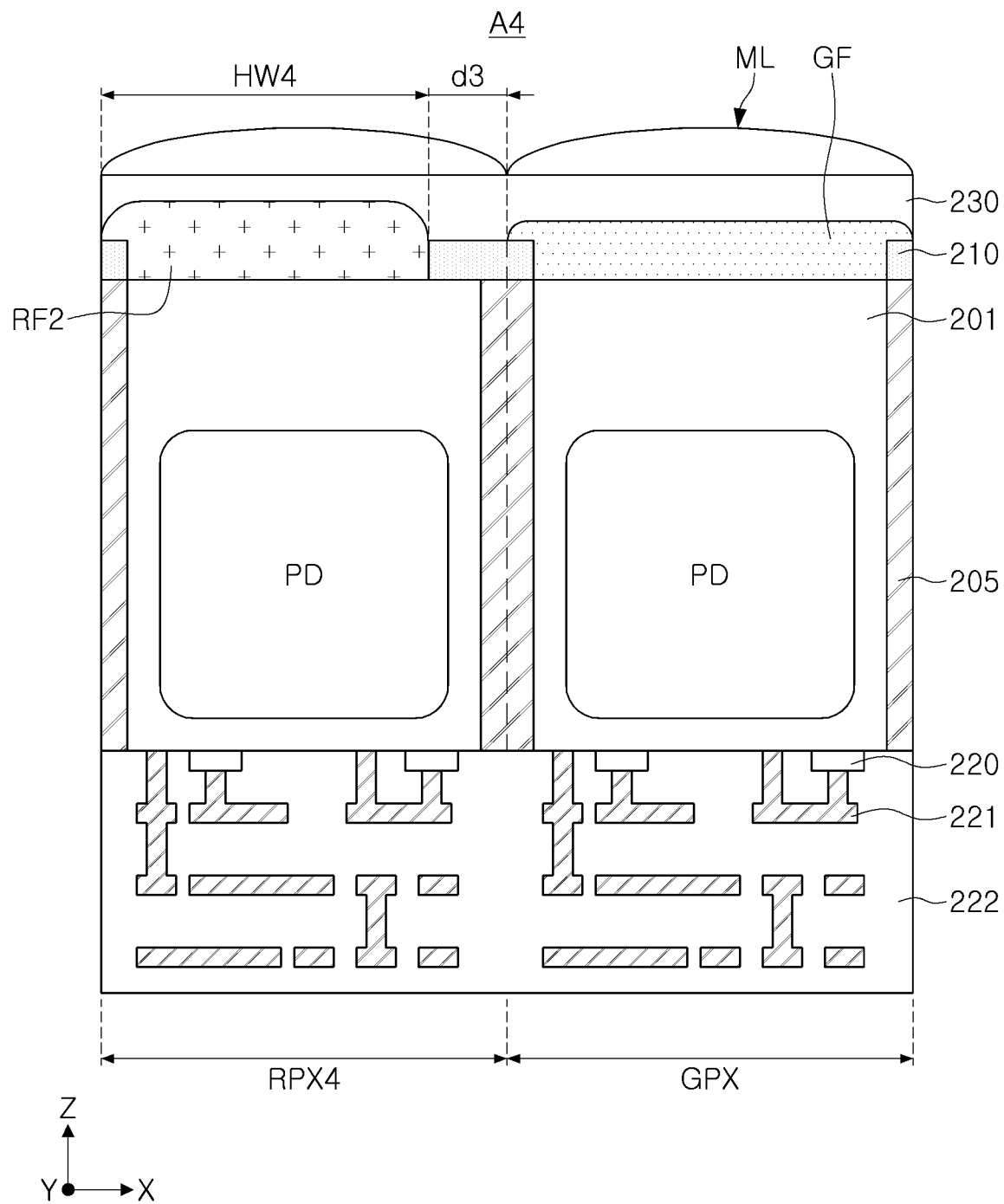

In FIGS. 14B to 14D, as the sizes of the second to fourth red color filters RF2-RF4 are relatively small, compared at least to the first red color filter RF1, at least a portion of the grid structure 210 may contact the planarization layer 230 in a region adjacent to the second to fourth red color filters RF2 to RF4. In addition, the size of the grid structure 210 may increase in response to a decrease in the size of the second to fourth red color filters RF2-RF4.

In the example embodiments illustrated in FIGS. 14A to 14D, the thickness of each of the red color filters RF1-RF4 is illustrated as being greater than that of the green color filter GF, but the thickness is not necessarily limited thereto. For example, each of the red color filters RF1-RF4 may have the same thickness as the green color filter GF. In detail, the red color filters RF1-RF4 may have the same thickness as the green color filter GF, and may have smaller sizes as they are closer to the edge of the pixel array 200.

Figure 15:
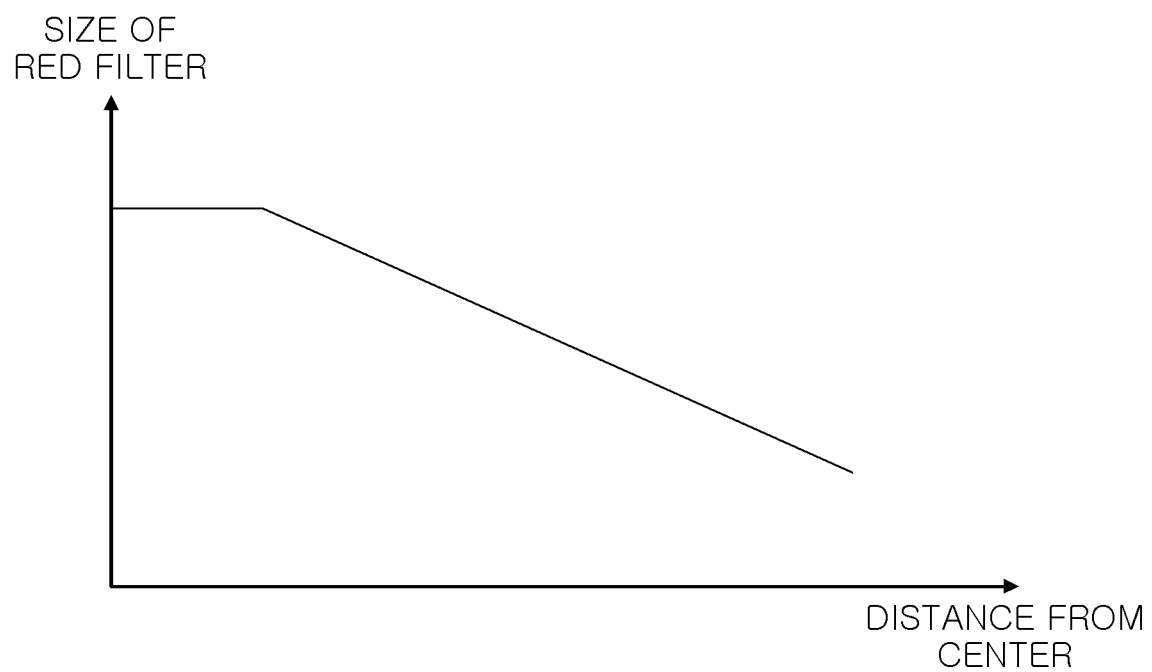
FIG. 15 is a graph illustrating a size of a red color filter in an image sensor according to an example embodiment.

FIG. 15 is a graph illustrating a size of a red color filter in an image sensor according to an example embodiment.

In the graph illustrated in FIG. 15, the horizontal axis may indicate a distance from the center of the pixel array, and the vertical axis may indicate the size of the red color filter. Referring to FIG. 15, the size of the red color filter included in the red pixel may decrease as the distance from the center increases, in detail, as it approaches the edge of the pixel array.

In an example embodiment, the size of the red color filter may be constant in an area within a predetermined reference distance from the center, and may decrease linearly in proportion to the distance from the center in an area outside the reference distance. In detail, in red pixels disposed within a reference distance from the center of the pixel array, red color filters may have the same size. The reference distance may be determined in consideration of a range in which a red color filter does not affect light incident to an adjacent green color filter when an angle at which light is incident on the pixels is considered.

FIGS. 16 and 17A to 17D are diagrams illustrating a pixel array of an image sensor according to an example embodiment.

Figure 16:
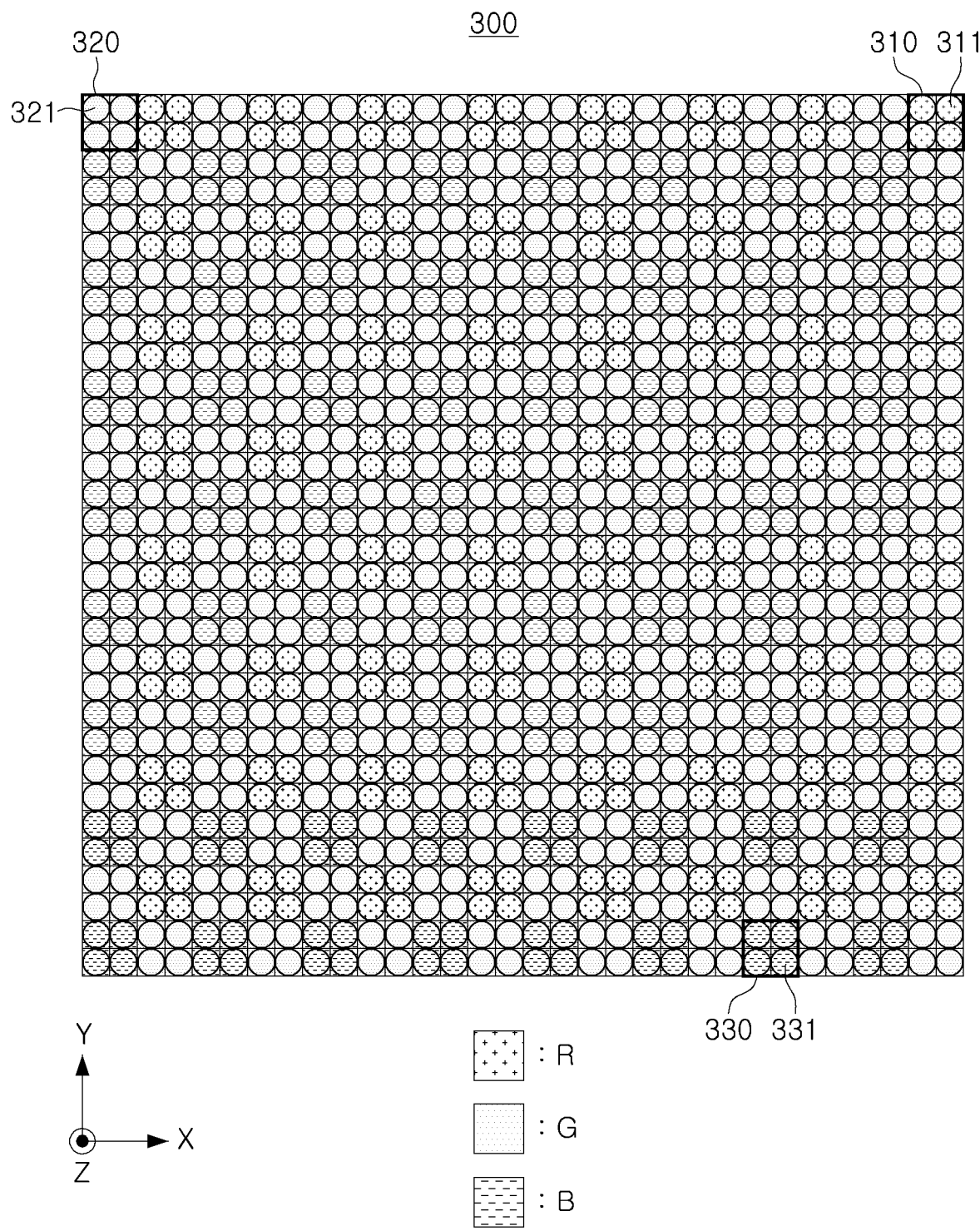
FIGS. 16 and 17A to 17D are diagrams illustrating a pixel array of an image sensor according to an example embodiment.

Referring first to FIG. 16, a pixel array 300 of an image sensor according to an example embodiment may include a plurality of pixels 310, 320 and 330 arranged in a first direction (X-axis direction) and a second direction (Y-axis direction). In the example embodiment illustrated in FIG. 16, each of the plurality of pixels 310, 320 and 330 may include two or more sub-pixels 311, 321 and 331 adjacent to each other in at least one of the first direction and the second direction and sharing a color filter of the same color.

For example, each of the red pixels 310 includes red sub-pixels 311 arranged in N×N form (N is a natural number equal to or greater than 2), and the red sub-pixels 311 included in each of the red pixels 310 may share one color filter. In the example embodiment illustrated in FIG. 16, N may be 2. Also, each of the red sub-pixels 311 may include a microlens. In each of the pixels 310, 320, and 330, the sub-pixels 311, 321, and 331 may share one color filter, and may each include a microlens without sharing. Configurations of the green pixels 320 and the blue pixels 330 may be similar to those of the red pixels 310.

FIGS. 17A to 17D are diagrams schematically illustrating first to fourth areas 400 to 430 selected from the pixel array having the same structure as in the example embodiment illustrated in FIG. 16. In each of the first to fourth areas 400-430, pixels may include a plurality of sub-pixels SPX. As an example, a red pixel may have a plurality of red sub-pixels, a green pixel may have a plurality of green sub-pixels, and a blue pixel may have a plurality of blue sub-pixels. Each sub-pixel may generate its own individual pixel signal, and/or information from a group of sub-pixels that form a pixel may be combined into an individual pixel signal.

In each of the pixels, the plurality of sub-pixels SPX may share one color filter and may not share the microlens. Accordingly, a color filter of each of the pixels may be divided into a plurality of sub-filter areas corresponding to the plurality of sub-pixels SPX. For example, an area of overlap in the vertical direction between each sub-pixel SPX and the portion of a shared color filter that covers that sub-pixel SPX may be described as a sub-filter area corresponding to that sub-pixel. Because some of the portions of the shared color filters that overlap particular sub-pixels do not cover the entire sub-pixel, those portions of the shared color filters may cover a smaller sub-filter area than portions of the shared color filters that cover entire sub-pixels.

For example, the first area 400 may be a region separated by a first distance from the center of the pixel array, and the second area 410 may be a region separated by a second distance from the center of the pixel array in a first direction (X-axis direction). The second distance may be greater than the first distance.

The third area 420 may be a region separated from the center of the pixel array by a third distance in the second direction (Y-axis direction), and the third distance may be greater than the first distance. The fourth area 430 may be a region separated by a third distance from the center of the pixel array, and may be separated from the center of the pixel array in a direction intersecting the first and second directions, for example, in a diagonal direction.

Figure 17A:
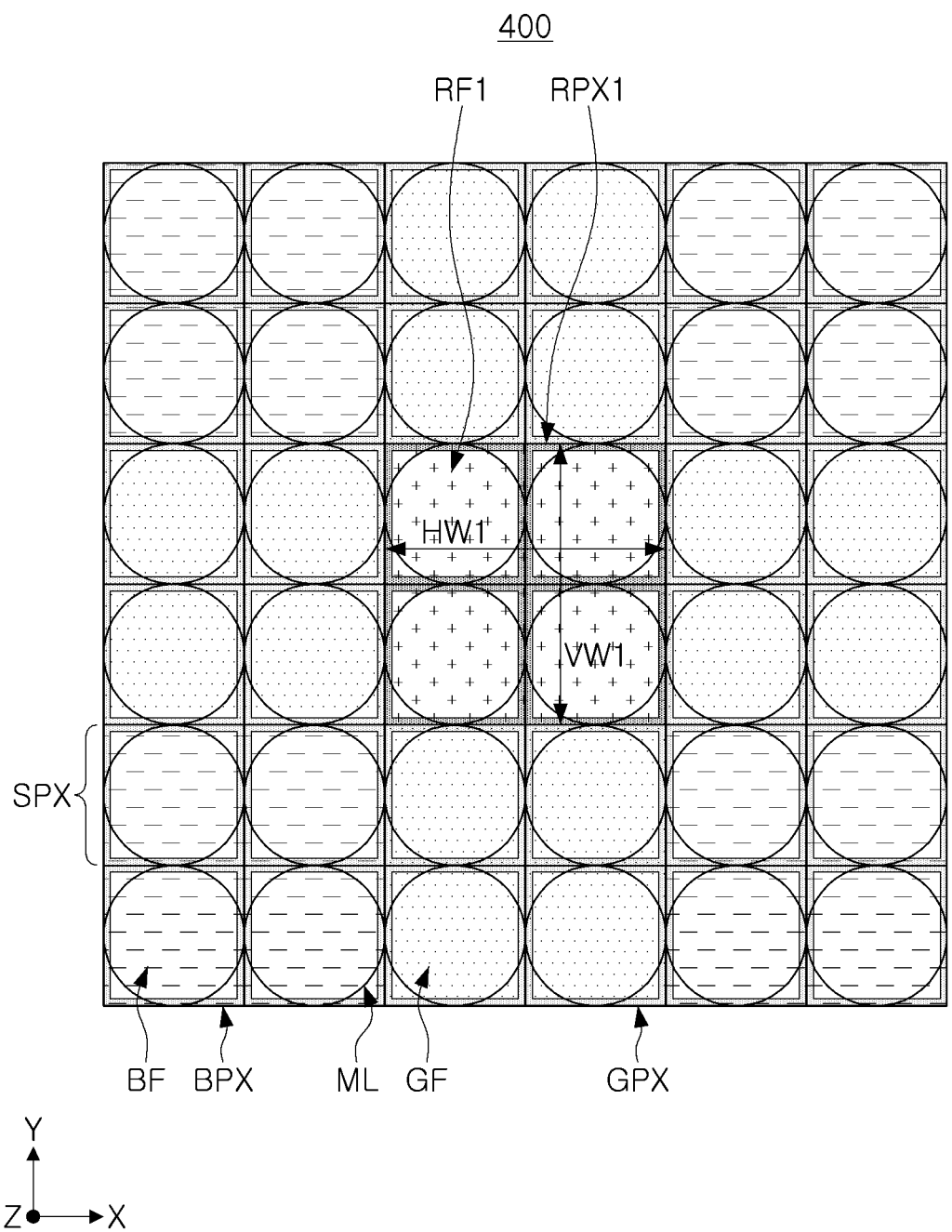

Referring to FIG. 17A, the first red pixel RPX1 disposed in the first area 400 includes a first red color filter RF1, and the first red color filter RF1 may have the same size as the green color filter GF and the blue color filter BF. Like the green color filter GF and the blue color filter BF, the first red color filter RF1 may have a first horizontal length HW1 in the first direction and a first vertical length VW1 in the second direction.

Figure 17B:
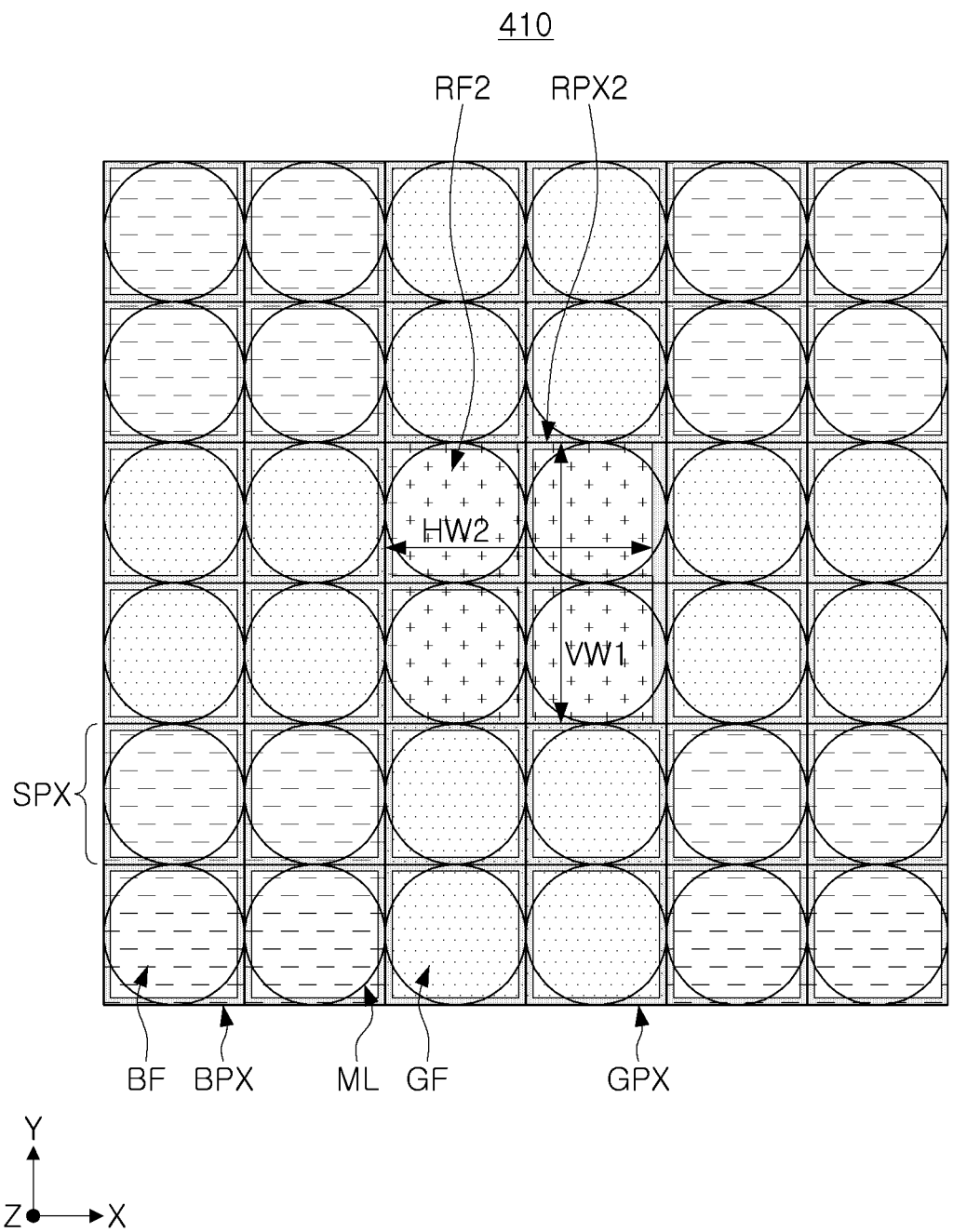

Referring to FIG. 17B, the second red pixel RPX2 disposed in the second area 410 includes a second red color filter RF2, and the second red color filter RF2 may have a smaller size than the first red color filter RF1. As described above, the second area 410 may be disposed more distantly than the first area 400 from the center of the pixel array in the first direction. Accordingly, the second red color filter RF2 may have a second horizontal length HW2 shorter than the first horizontal length HW1 in the first direction. On the other hand, in the second direction, the second red color filter RF2 may have the same first vertical length VW1 as the first red color filter RF1.

Since the sub-pixels SPX included in the second red pixel RPX2 share the second red color filter RF2, the size of the sub-filter areas corresponding to the two sub-pixels SPX disposed on the right among the sub-pixels SPX may be reduced. Accordingly, the size of each of the sub-filter areas corresponding to the two sub-pixels SPX located on the right side in the second red pixel RPX2 may be smaller than the size of each of the sub-filter areas corresponding to two sub-pixels SPX located on the left side in the second red pixel RPX2.

As illustrated in FIG. 17B, in the second red pixel RPX2, the size of each of some sub-filter areas located close to one of the edges of the pixel array may be smaller than the size of each of the remaining sub-filter areas located farther from the one of the edges of the pixel array. In the second red pixel RPX2, the number of some sub-filter areas having a relatively large size may be the same as the number of remaining sub-filter areas having a relatively small size. On the other hand, in the green pixel GPX and the blue pixel BPX, the sub-filter areas corresponding to the sub-pixels SPX may have the same size respectively.

Figure 17C:
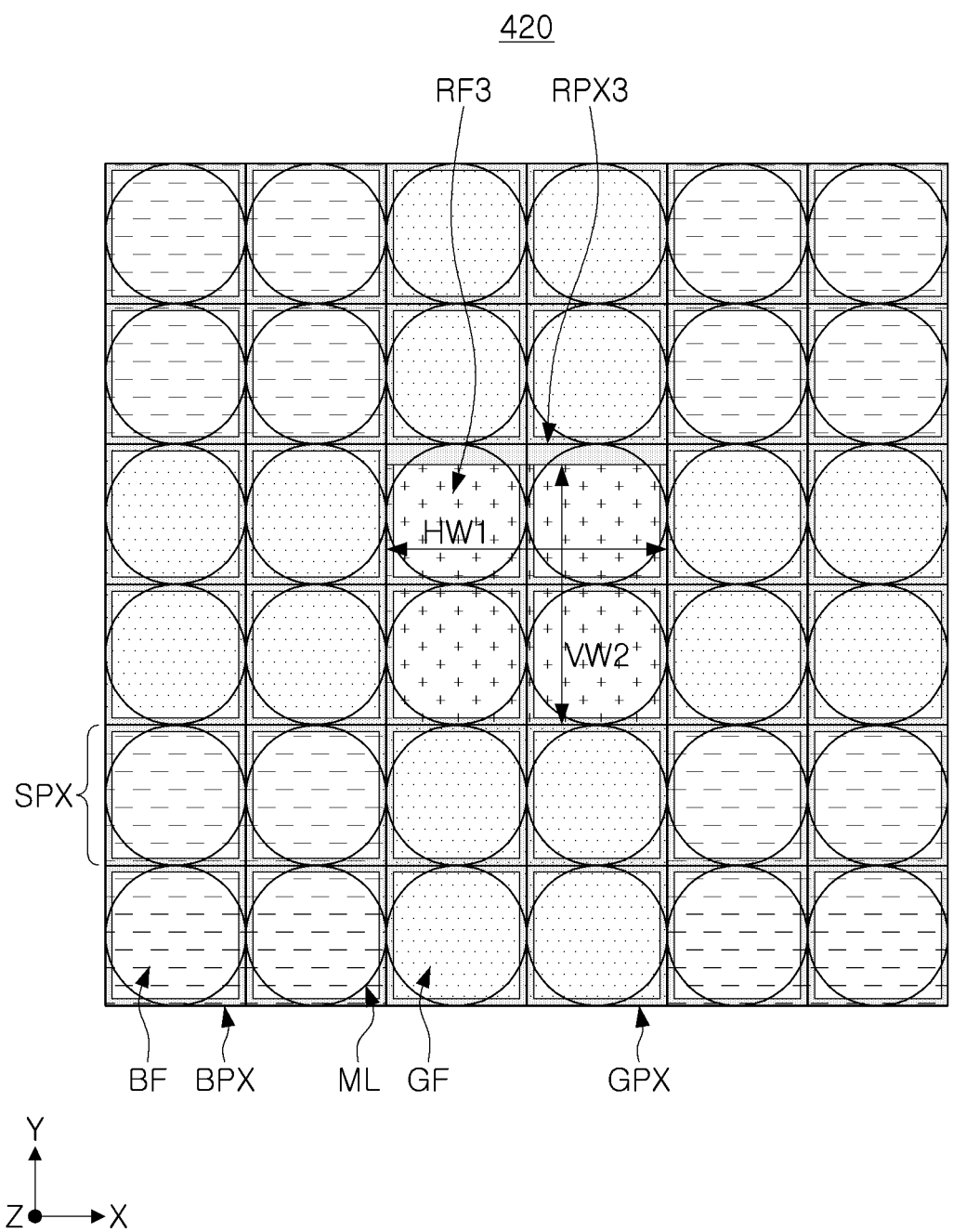

Referring to FIG. 17C, the third red pixel RPX3 disposed in the third area 420 includes the third red color filter RF3, and the third red color filter RF3 may have the size smaller than the first red color filter RF1. For example, the third area 420 may be disposed further from the center of the pixel array than the first area 400 in the second direction. Accordingly, the third red color filter RF3 may have a second vertical length VW2 shorter than the first vertical length VW1 in the second direction. On the other hand, in the first direction, the third red color filter RF3 may have the same first horizontal length HW1 as the first red color filter RF1.

The sub-pixels SPX included in the third red pixel RPX3 share the third red color filter RF3, and thus, the size of each of the sub-filter areas may be reduced only in two sub-pixels SPX disposed in an upper side on the second direction among the sub-pixels SPX. Accordingly, the size of each of the two sub-filter areas located on the upper side in the second direction may be smaller than the size of each of two sub-filter areas located on the lower side in the second direction.

Figure 17D:
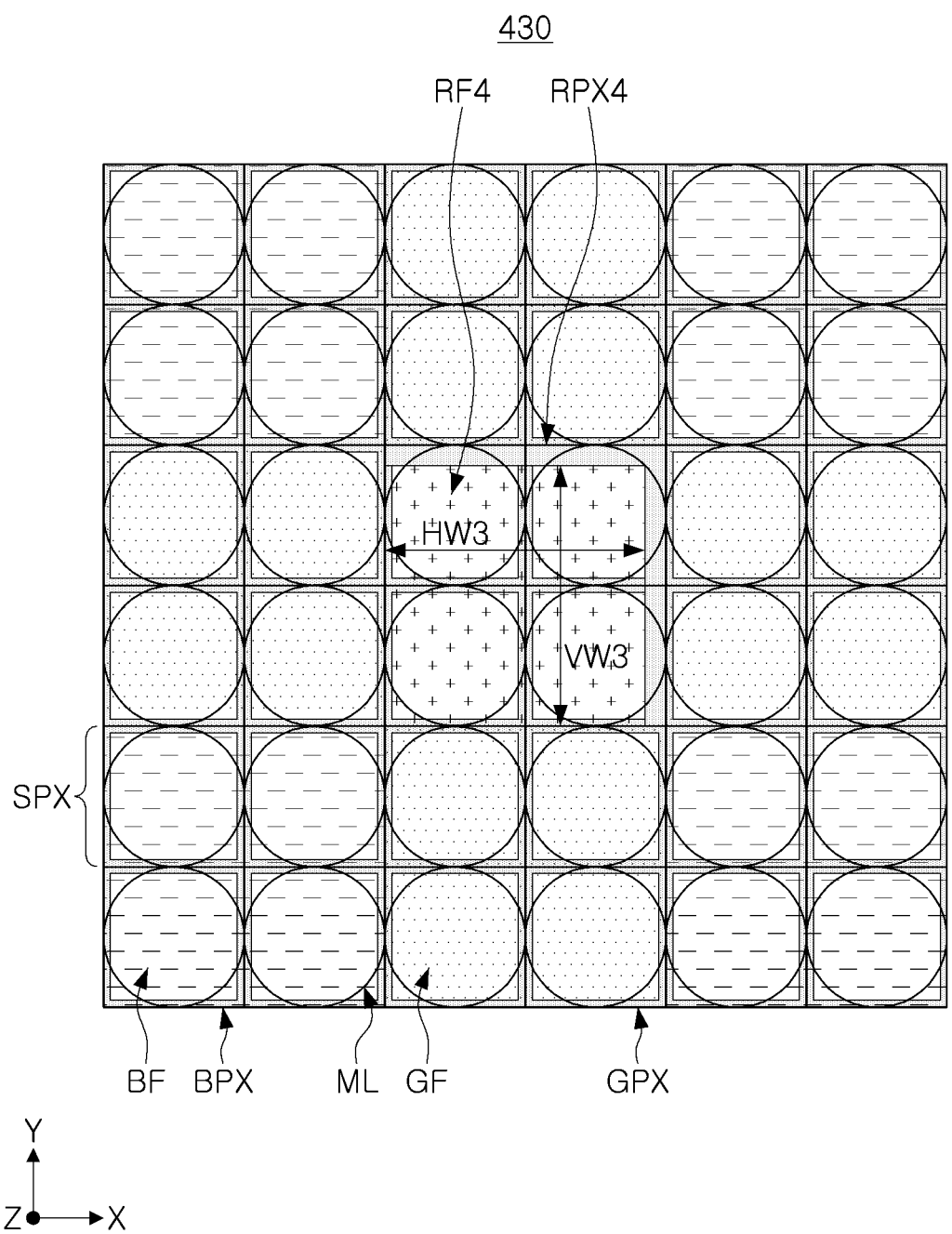

Referring to FIG. 17D, the fourth red pixel RPX4 disposed in the fourth area 430 includes a fourth red color filter RF4, and the fourth red color filter RF4 may have a size smaller than the first red color filter RF1. For example, the fourth area 430 may be disposed more distantly than the first area 400 from the center of the pixel array in a diagonal direction intersecting the first and second directions. Accordingly, the fourth red color filter RF4 may have a third horizontal length HW3 shorter than the first horizontal length HW1 in the first direction, and may have a third vertical length VW3 shorter than the first vertical length VW1 in the second direction.

The sub-pixels SPX included in the fourth red pixel RPX4 may share the fourth red color filter RF4. Referring to FIG. 17D, the size of each of sub-filter areas may be reduced in the sub-pixels SPX contacting the green pixel GPX on the right side in the first direction and in the sub-pixels SPX contacting the green pixel GPX on the upper side in the second direction. For example, in the example embodiment illustrated in FIG. 17D, sizes of sub-filter areas included in the respective sub-pixels SPX of the fourth red pixel RPX4 may all have different sizes.

Referring to FIGS. 17B to 17D, at least a portion of the sub-pixels SPX included in the red pixel may include sub-filter areas having different sizes. In addition, the sub-filter areas corresponding to the sub-pixels SPX included in the red pixel separately disposed from the center of the pixel array in a diagonal direction may all have different sizes. On the other hand, in the example embodiment illustrated in FIGS. 17B and 17C, the number of sub-filter areas having a relatively small size may be the same as the number of sub-filter areas having a relatively large size.

FIGS. 18 and 19A to 19D are diagrams illustrating a pixel array of an image sensor according to an example embodiment.

Figure 18:
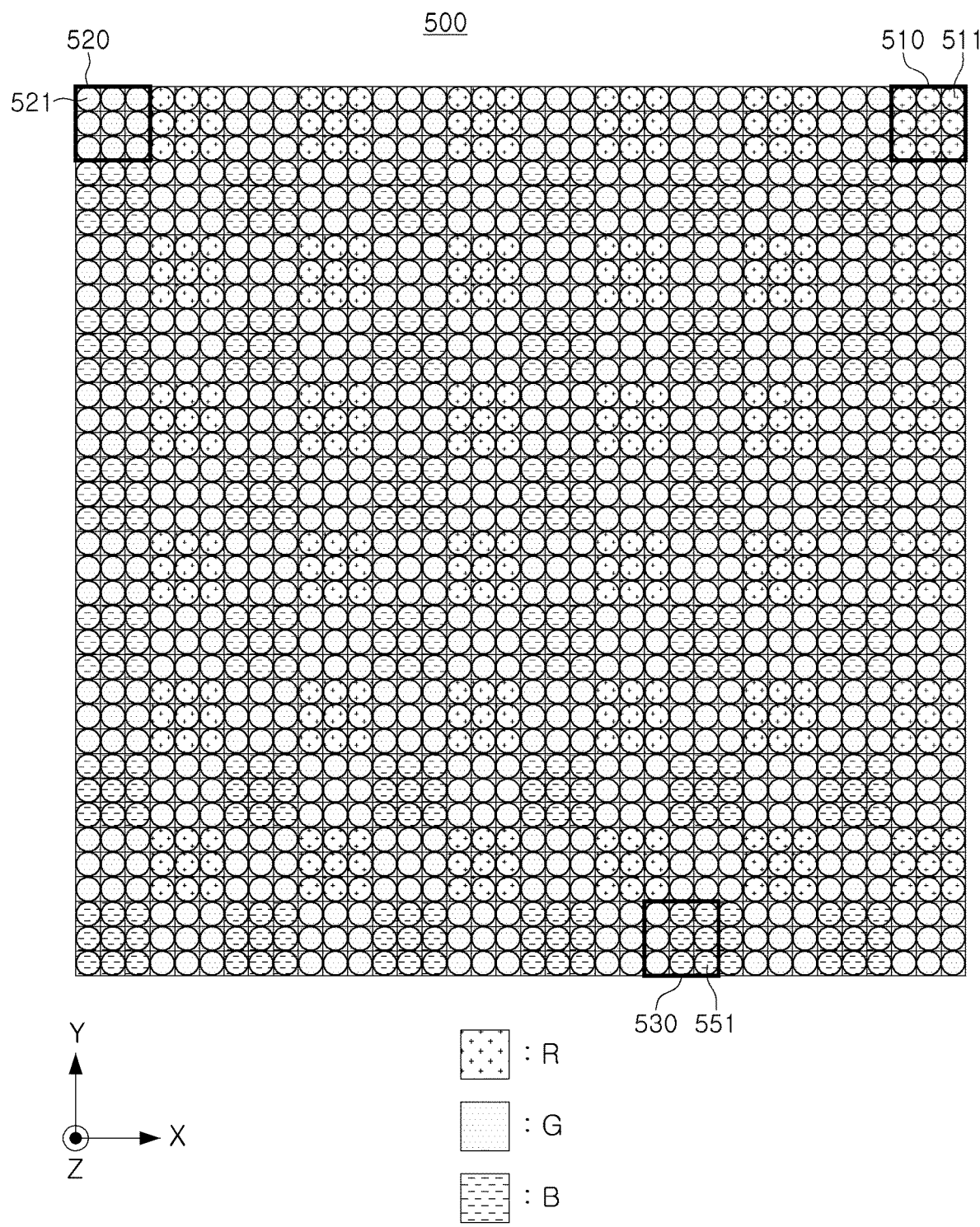
FIGS. 18 and 19A to 19D are diagrams illustrating a pixel array of an image sensor according to an example embodiment.

Referring first to FIG. 18, a pixel array 500 of an image sensor according to an example embodiment may include a plurality of pixels 510, 520 and 530 arranged in a first direction (X-axis direction) and a second direction (Y-axis direction). In the example embodiment illustrated in FIG. 18, each of the plurality of pixels 510, 520, and 530 may include two or more sub-pixels 511, 521 and 531 adjacent to each other in at least one of the first direction and the second direction and sharing a color filter of the same color.

For example, each of the red pixels 510 may include red sub-pixels 511 arranged in a 3×3 shape, and the red sub-pixels 511 included in each of the red pixels 510 may share one color filter. In addition, each of the red sub-pixels 511 may include a microlens. In each of the pixels 510, 520, and 530, the sub-pixels 511, 521, and 531 may share one color filter, and in the case of the microlens, may each include a microlens without sharing. The configuration of the green pixels 520 and the blue pixels 530 may be similar to that of the red pixels 510.

FIGS. 19A to 19D are diagrams schematically illustrating first to fourth areas 600 to 630 selected in the pixel array having the same structure as in the example embodiment illustrated in FIG. 18. In each of the first to fourth areas 600 to 630, pixels include a plurality of sub-pixels SPX, and the plurality of sub-pixels SPX in each of the pixels may share one color filter, but may not share a microlens.

The first to fourth areas 600 to 630 may be regions determined similarly to those described above with reference to FIGS. 17A to 17D. For example, the first area 600 may be a region separated by a first distance from the center of the pixel array, and the second area 610 may be a region separated by a second distance from the center of the pixel array in the first direction (X-axis direction). The second distance may be greater than the first distance.

The third area 620 may be a region separated by a third distance from the center of the pixel array in the second direction (Y-axis direction), and the third distance may be greater than the first distance. The fourth area 630 may be a region separated by a third distance from the center of the pixel array in the second direction (Y-axis direction), and may be separated from the center of the pixel array in a direction intersecting the first and second directions, for example, in a diagonal direction.

Figure 19A:
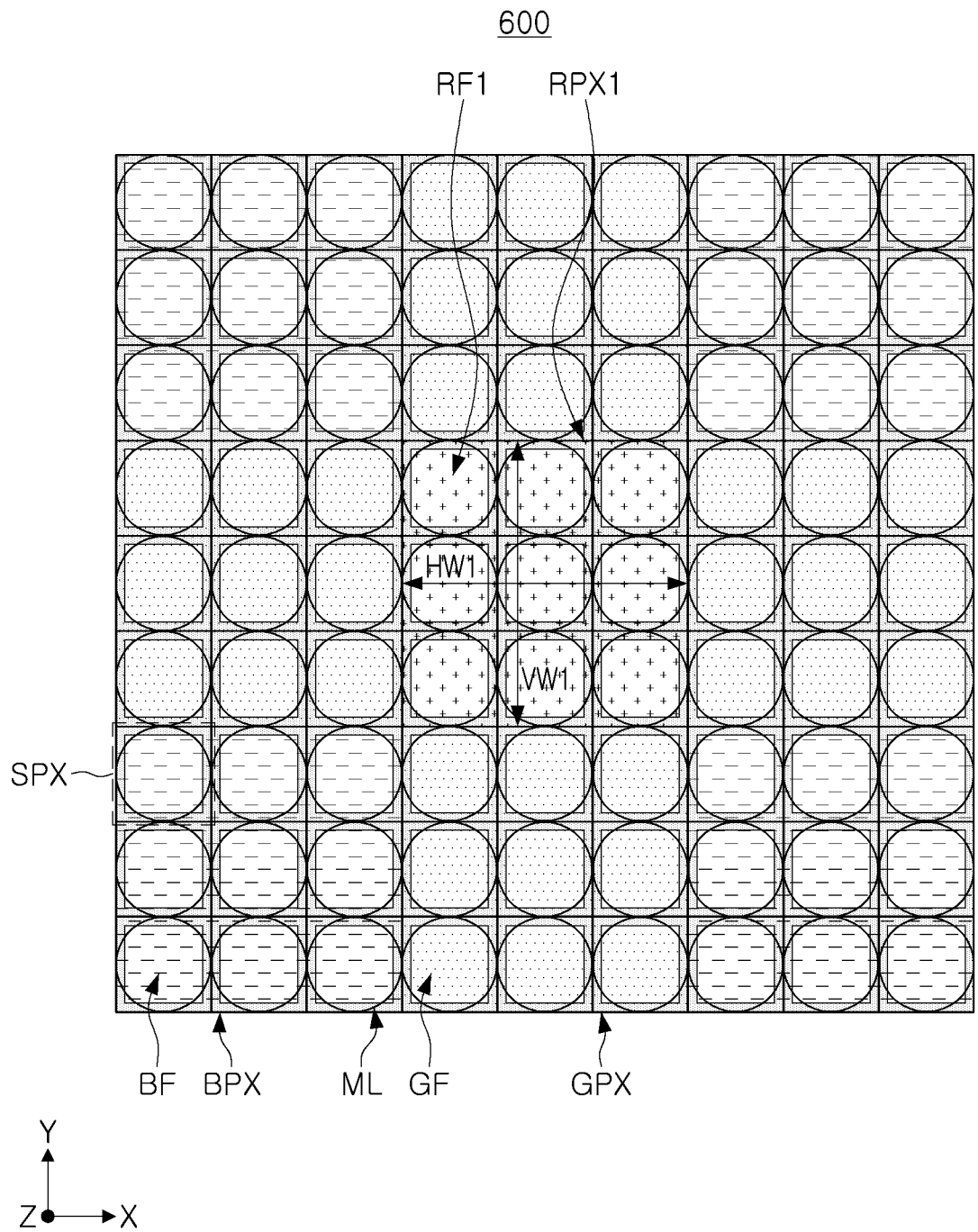

Referring to FIG. 19A, the first red pixel RPX1 disposed in the first area 600 may include a first red color filter RF1, and the first red color filter RF1 may have the same size as a green color filter GF and the blue color filter BF. Like the green color filter GF and the blue color filter BF, the first red color filter RF1 may have a first horizontal length HW1 in the first direction and a first vertical length VW1 in the second direction.

Figure 19B:
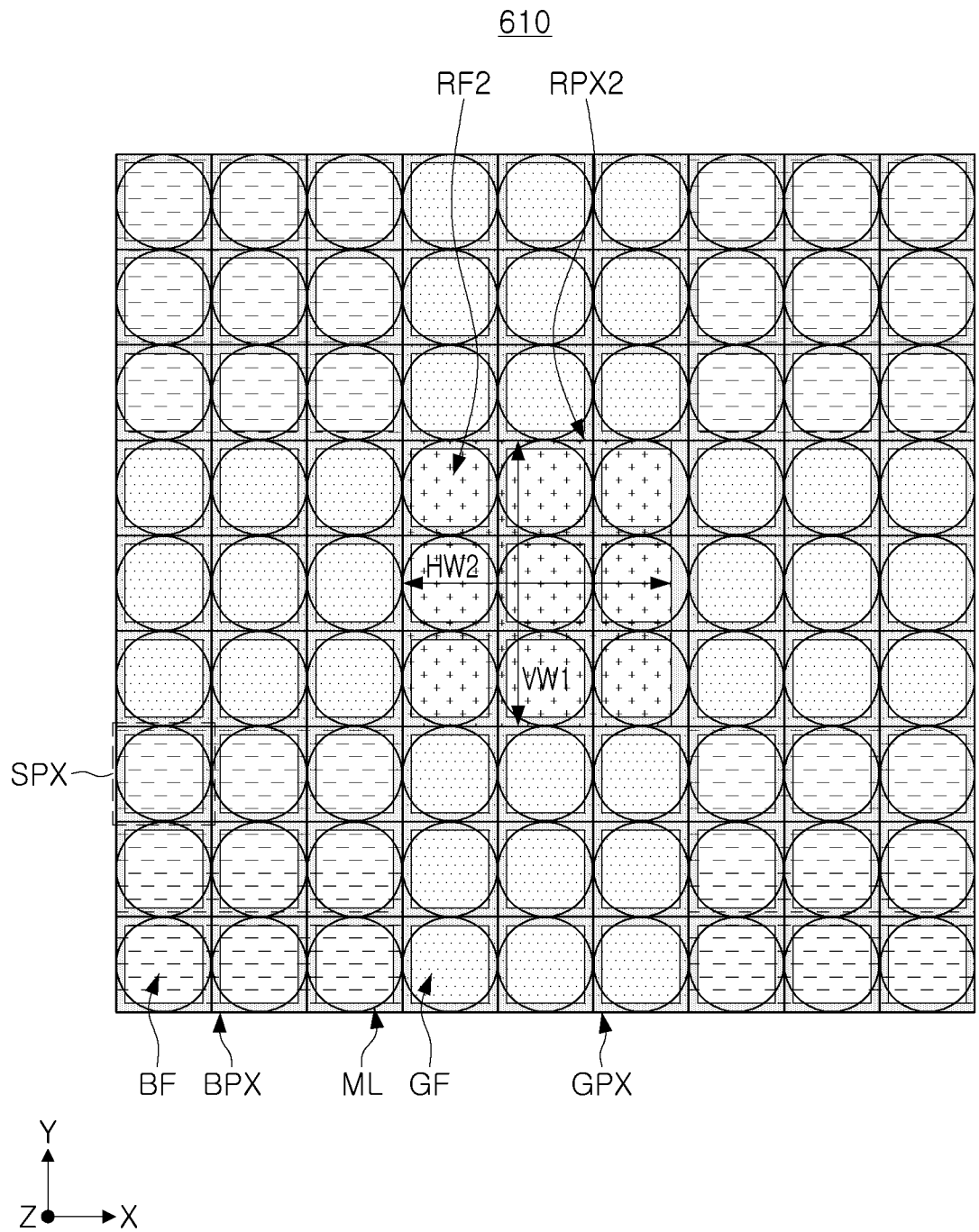

Referring to FIG. 19B, the second red pixel RPX2 disposed in the second area 610 includes a second red color filter RF2, and the second red color filter RF2 may have a smaller size than the first red color filter RF1. As described above, the second area 610 may be disposed more distantly than the first area 600 from the center of the pixel array in the first direction. Accordingly, the second red color filter RF2 may have a second horizontal length HW2 shorter than the first horizontal length HW1 in the first direction. On the other hand, in the second direction, the second red color filter RF2 may have the same first vertical length VW1 as that of the first red color filter RF1.

The sub-pixels SPX included in the second red pixel RPX2 share the second red color filter RF2, and the second red color filter RF2 may be divided into sub-filter areas corresponding to the sub-pixels SPX. Referring to FIG. 19B, the size of each of the sub-filter areas included in three sub-pixels SPX disposed on the right, among the sub-pixels SPX, may be relatively smaller. Accordingly, the size of each of the sub-filter areas included in six sub-pixels SPX located on the left may be larger than the size of each of the three sub-filter areas located on the right side.

Figure 19C:
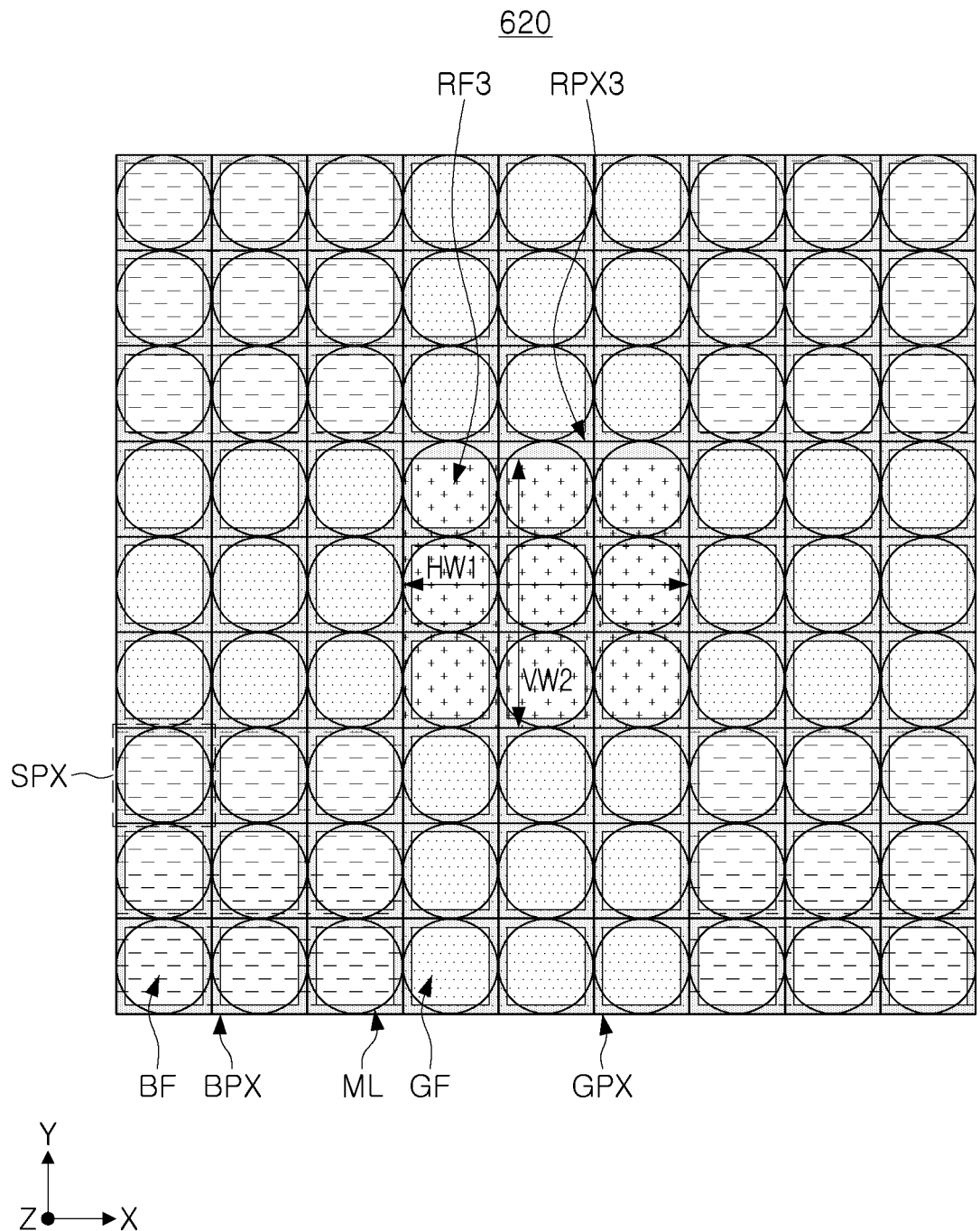

Referring to FIG. 19C, the third red pixel RPX3 disposed in the third area 620 includes a third red color filter RF3, and the third red color filter RF3 may have a smaller size than the first red color filter RF1. For example, the third area 620 may be disposed further from the center of the pixel array than the first area 600 in the second direction. Accordingly, the third red color filter RF3 may have a second vertical length VW2 shorter than the first vertical length VW1 in the second direction. On the other hand, in the first direction, the third red color filter RF3 may have the same first horizontal length HW1 as that of the first red color filter RF1.

The sub-pixels SPX included in the third red pixel RPX3 share the third red color filter RF3, and thus, each of sub-filter areas included in three sub-pixels SPX disposed on the upper side in the second direction, among the sub-pixels SPX, may have a relatively small size. Accordingly, an area of each of the three sub-filter areas positioned on the upper side in the second direction may be smaller than an area of each of six sub-filter areas positioned on a lower side in the second direction.

Figure 19D:
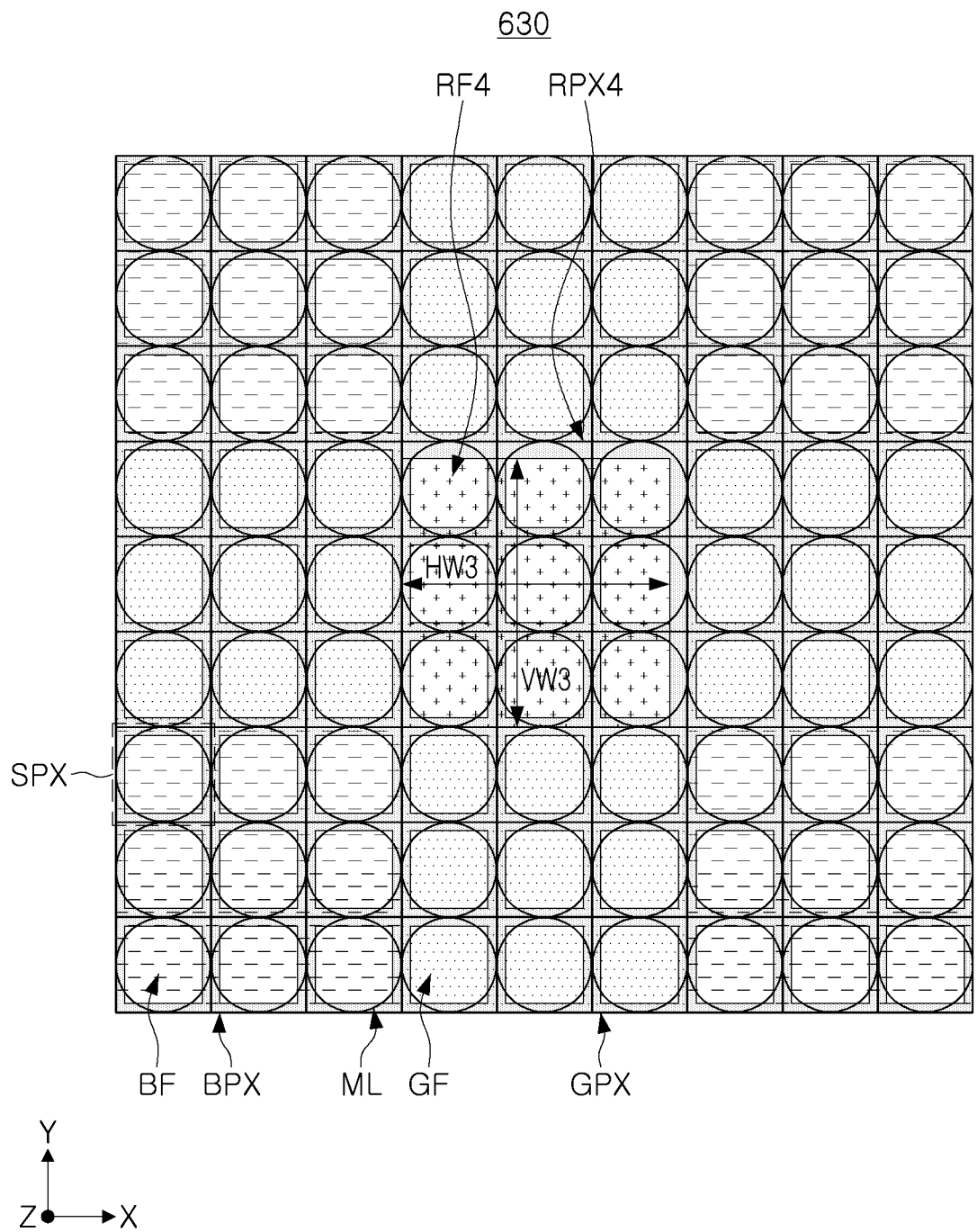

Referring to FIG. 19D, the fourth red pixel RPX4 disposed in the fourth area 430 includes a fourth red color filter RF4, and the fourth red color filter RF4 may have a smaller size than the first red color filter RF1. For example, the fourth area 430 may be disposed more distantly than the first area 400 from the center of the pixel array in a diagonal direction intersecting the first and second directions. Accordingly, the fourth red color filter RF4 may have a third horizontal length HW3 shorter than the first horizontal length HW1 in the first direction, and may have a third vertical length VW3 shorter than the first vertical length VW1 in the second direction.

The sub-pixels SPX included in the fourth red pixel RPX4 may share the fourth red color filter RF4. Referring to FIG. 17D, each of the sub-filter areas included in the sub-pixels SPX contacting the green pixel GPX on the right side in the first direction and the sub-pixels SPX contacting the green pixel GPX on the upper side in the second direction may have a relatively small size. Accordingly, a sub-filter area of each of the five sub-pixels SPX may have a relatively smaller size than a sub-filter area of each of the four sub-pixels SPX. Also, the sub-filter area of one sub-pixel SPX disposed most distantly from the center of the pixel array in the diagonal direction may have a smallest size.

In the example embodiments illustrated in FIGS. 19B and 19C, the number of sub-filter areas having a relatively small size may be less than the number of sub-filter areas having a relatively large size. On the other hand, in the example embodiment illustrated in FIG. 19D, the number of sub-filter areas having a relatively small size may be greater than the number of sub-filter areas having a relatively large size. The sub-filter areas having a relatively small size may be adjacent to the green color filter GF in at least one of the first direction and the second direction.

FIGS. 20 to 27 are views illustrating a method of manufacturing an image sensor according to an example embodiment.

Figure 20:
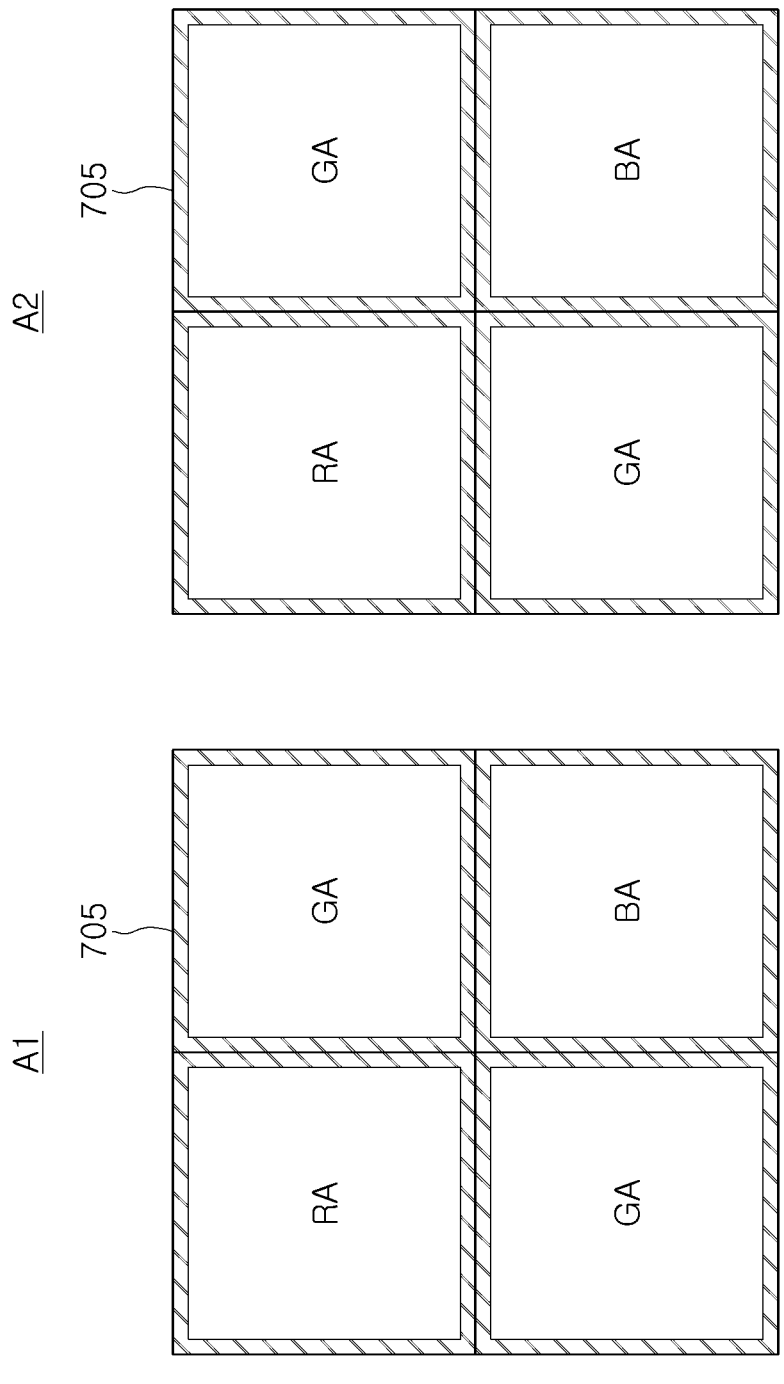
FIGS. 20 to 27 are views illustrating a method of manufacturing an image sensor according to an example embodiment.
Figure 21:
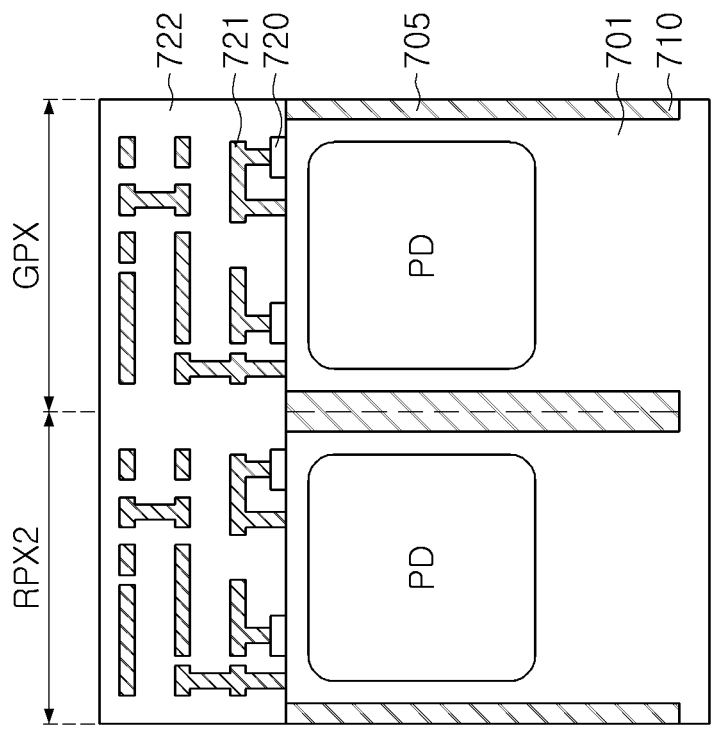
Figure 21:
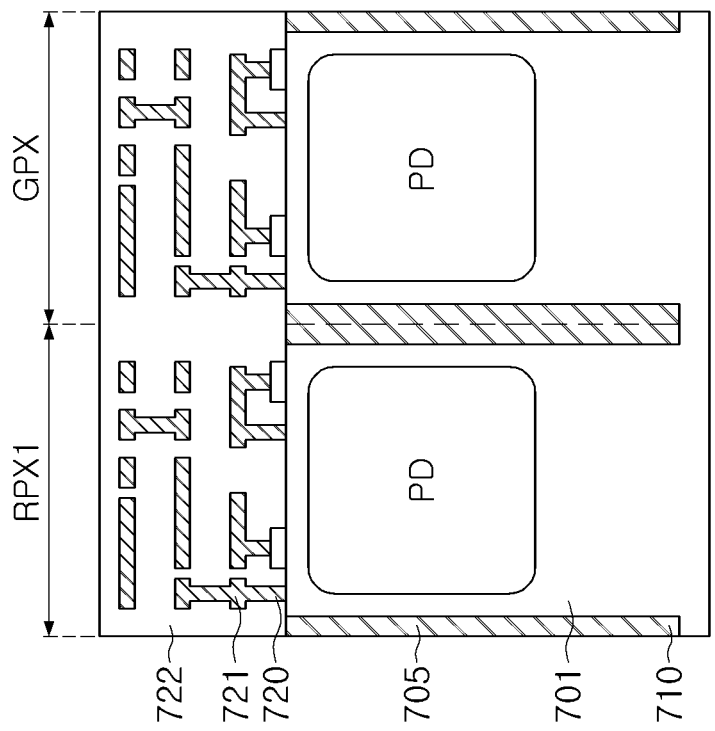

First, referring to FIGS. 20 and 21, a plurality of pixel areas RA, GA, and BA may be defined in a first area A1 and a second area A2 of a substrate 701. For example, the plurality of pixel areas RA, GA, and BA may include a red pixel area RA, a green pixel area GA, and a blue pixel area BA. The plurality of pixel areas RA, GA, and BA may be arranged in a first direction (X-axis direction) and a second direction (Y-axis direction). In an example embodiment, the first area A1 may be an area located at a first distance from the center of a pixel array in which the plurality of pixel areas RA, GA, and BA are defined, and the second area A2 may be an area located at a second distance from the center of the pixel array in which the plurality of pixel regions RA, GA, and BA are defined. The first distance may be shorter than the second distance.

The plurality of pixel areas RA, GA, and BA may be separated from each other by a pixel separation layer 705 extending in the third direction (Z-axis direction). A photodiode PD may be formed between the pixel separation layers 705. Although the example embodiment illustrated in FIGS. 20 and 21 illustrates that one photodiode PD is formed in each of the plurality of pixel areas RA, GA, and BA, two or more photodiodes PD may be formed in at least one of the plurality of pixel areas RA, GA and BA. The image sensor may implement an autofocus function using two or more photodiodes PD. On one surface of the substrate 701, elements 720 included in a pixel circuit, wiring patterns 721 for connecting the elements 720 to each other, and an insulating layer 722 covering the elements 720 and the wiring patterns 721 may be formed.

Figure 22:
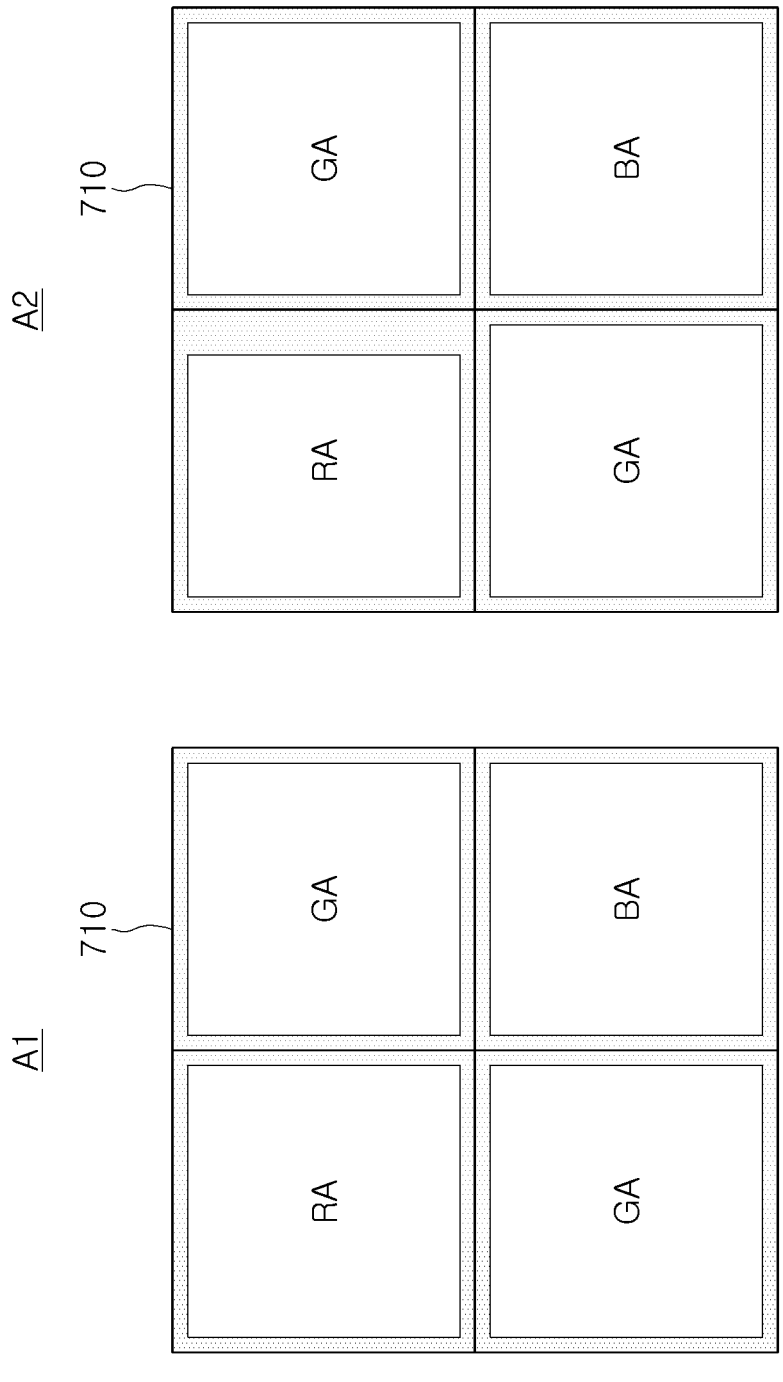
Figure 23:
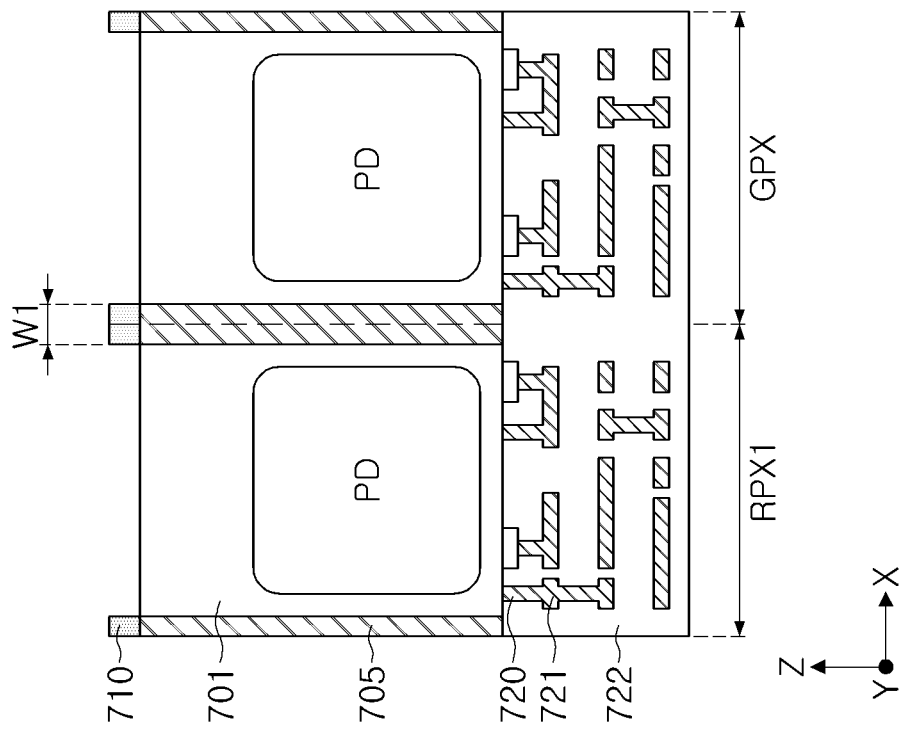

Next, referring to FIGS. 22 and 23, a grid structure 710 may be formed on the substrate 701. For example, the grid structure 710 may be formed on a surface opposite to a surface on which the elements 720, the wiring patterns 721, and the insulating layer 722 are formed.

As illustrated in FIGS. 22 and 23, the grid structure 710 may have different shapes in the first area A1 and the second area A2. For example, in the first area A1, the grid structure 710 disposed on the right side of the red pixel area RA has a first width W1, while in the second area A2, the grid structure 710 disposed on the right side of the red pixel area RA may have a second width W2 greater than the first width W1. The difference in width of the grid structure 710 may appear from a difference in the mask for forming the grid structure 710.

Figure 24:
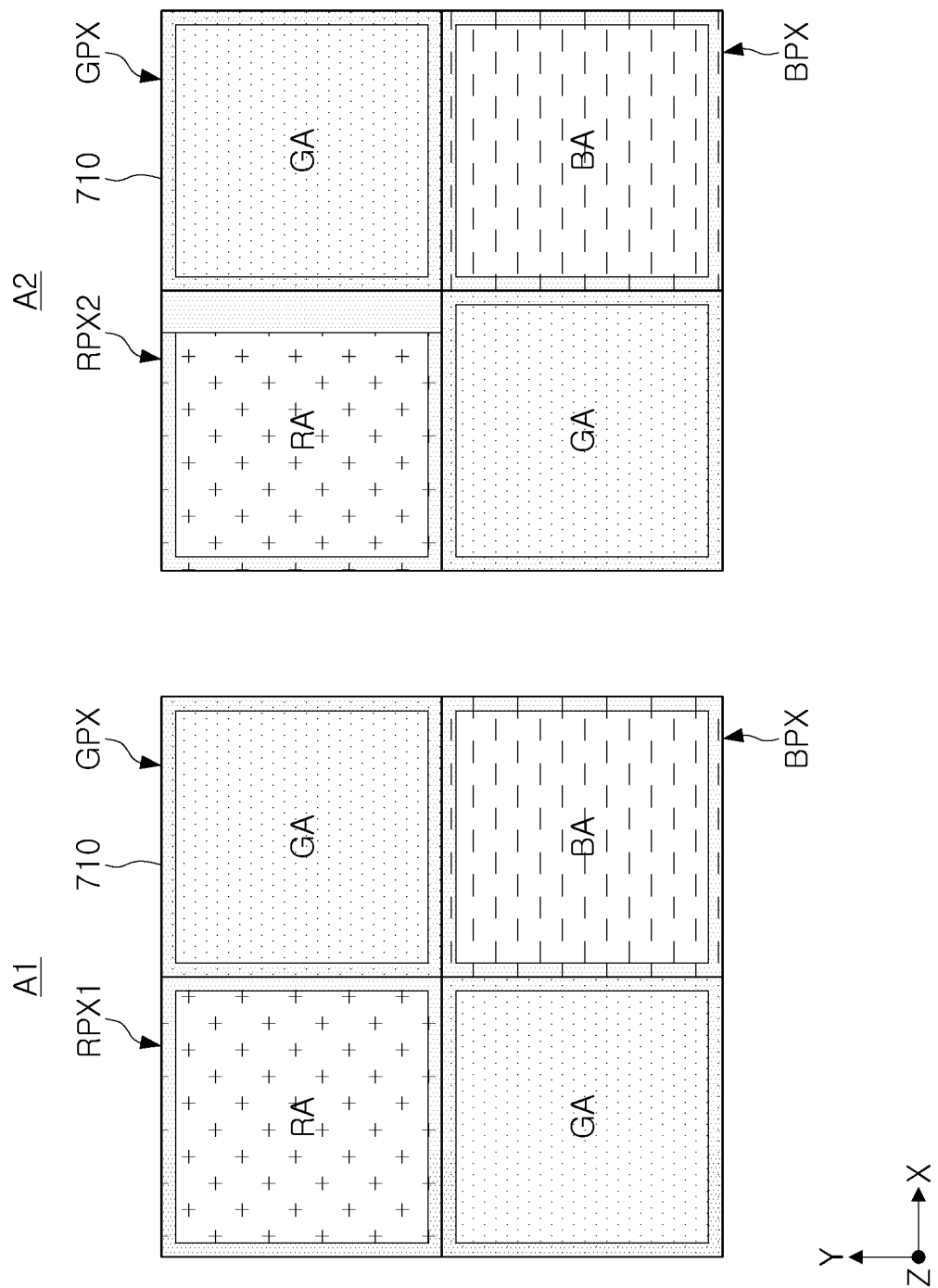
Figure 25:
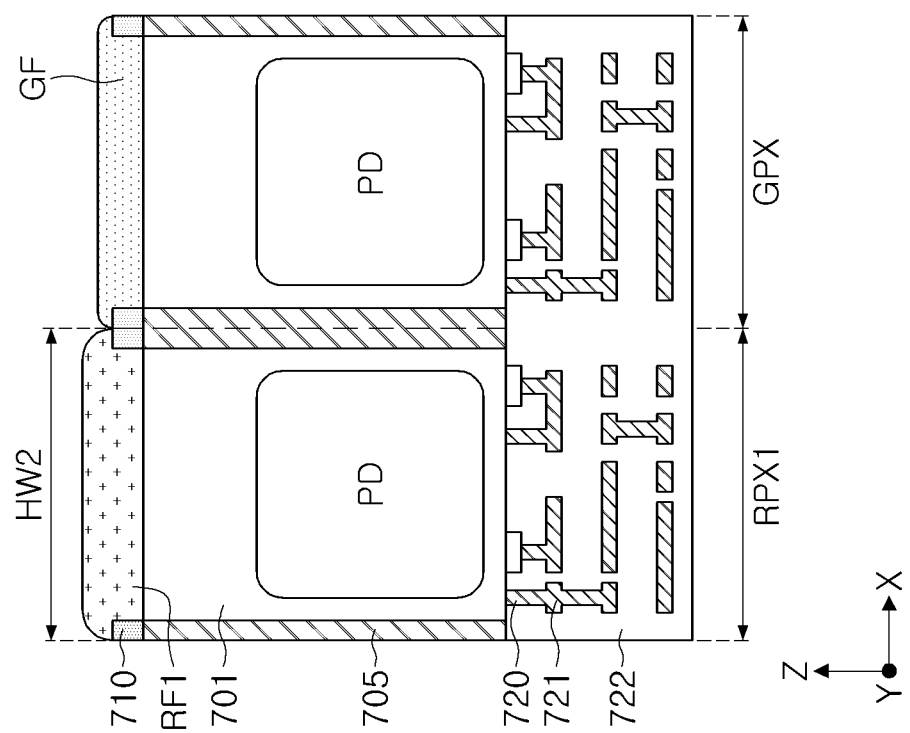

Referring to FIGS. 24 and 25, color filters RF1, RF2, GF and BF may be formed on the grid structure 710 and the substrate 701. In an example embodiment, the color filters RF1, RF2, GF and BF may be formed by a spin coating process and a patterning process, and the red color filters RF1 and RF2 may be formed to have a relatively large thickness, relative to the green color filter GF. The blue color filter BF may also be formed to have a greater thickness than the green color filter GF, and according to example embodiments, the blue color filter BF may be formed to have a greater thickness than the red color filters RF1 and RF2. Alternatively, according to example embodiments, the red color filters RF1 and RF2 and the green color filter GF may have the same thickness. In addition, the red color filters RF1 and RF2, the green color filter GF, and the blue color filter BF may all have the same thickness.

As illustrated in FIGS. 24 and 25, the first red color filter RF1 formed in the first area A1 may have a smaller size than the second red color filter RF2 formed in the second area A2. For example, in the first direction, the first red color filter RF1 may have a first horizontal length HW1, while the second red color filter RF2 may have a second horizontal length HW2. Accordingly, a phenomenon in which light incident obliquely in the first direction to the green color filter GA of the second area A2 is blocked and/or absorbed by the second red color filter RF2 may be significantly reduced, and a signal intensity difference between green pixels included in the area A2 may be reduced.

Figure 26:
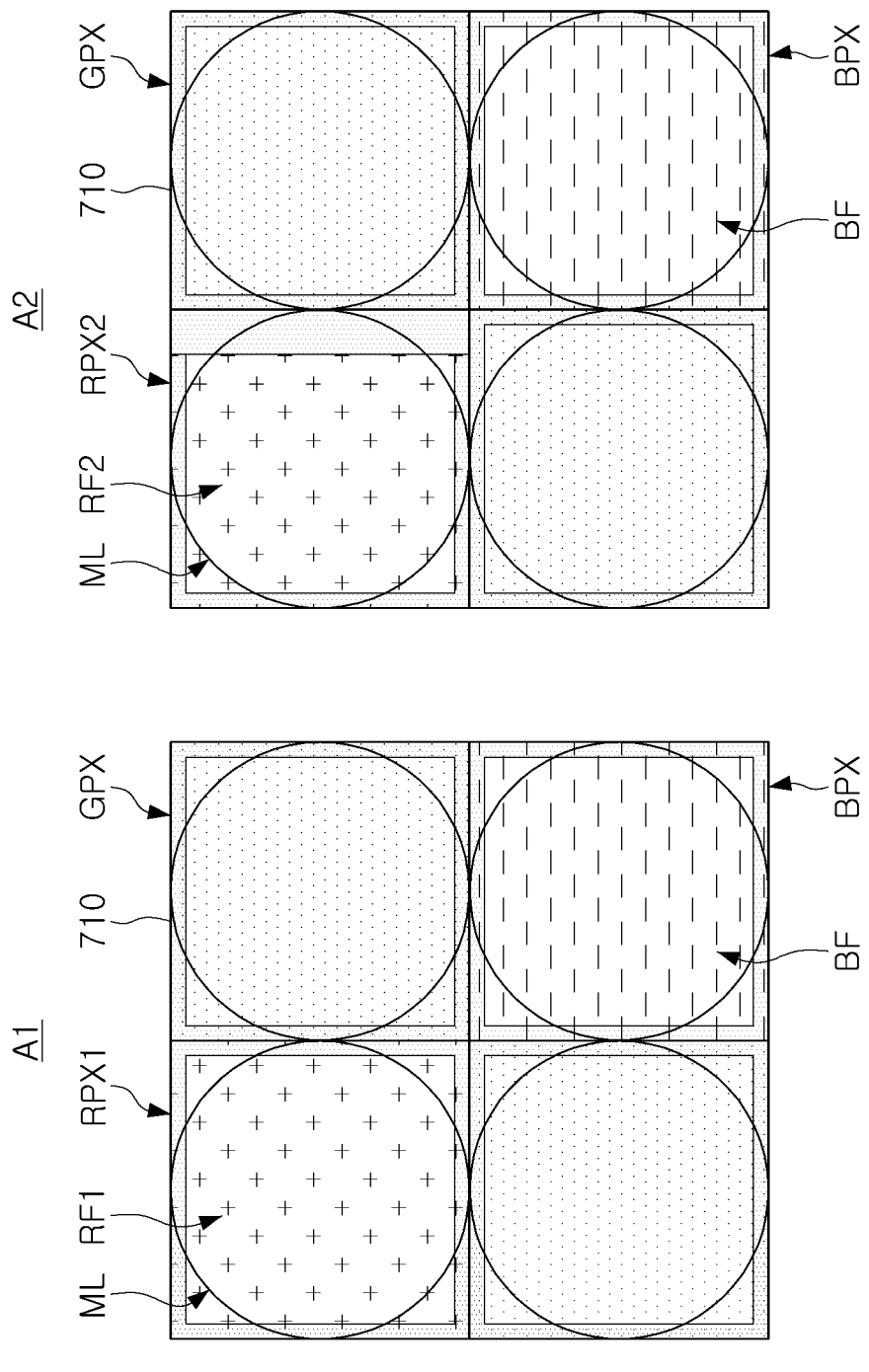
Figure 27:
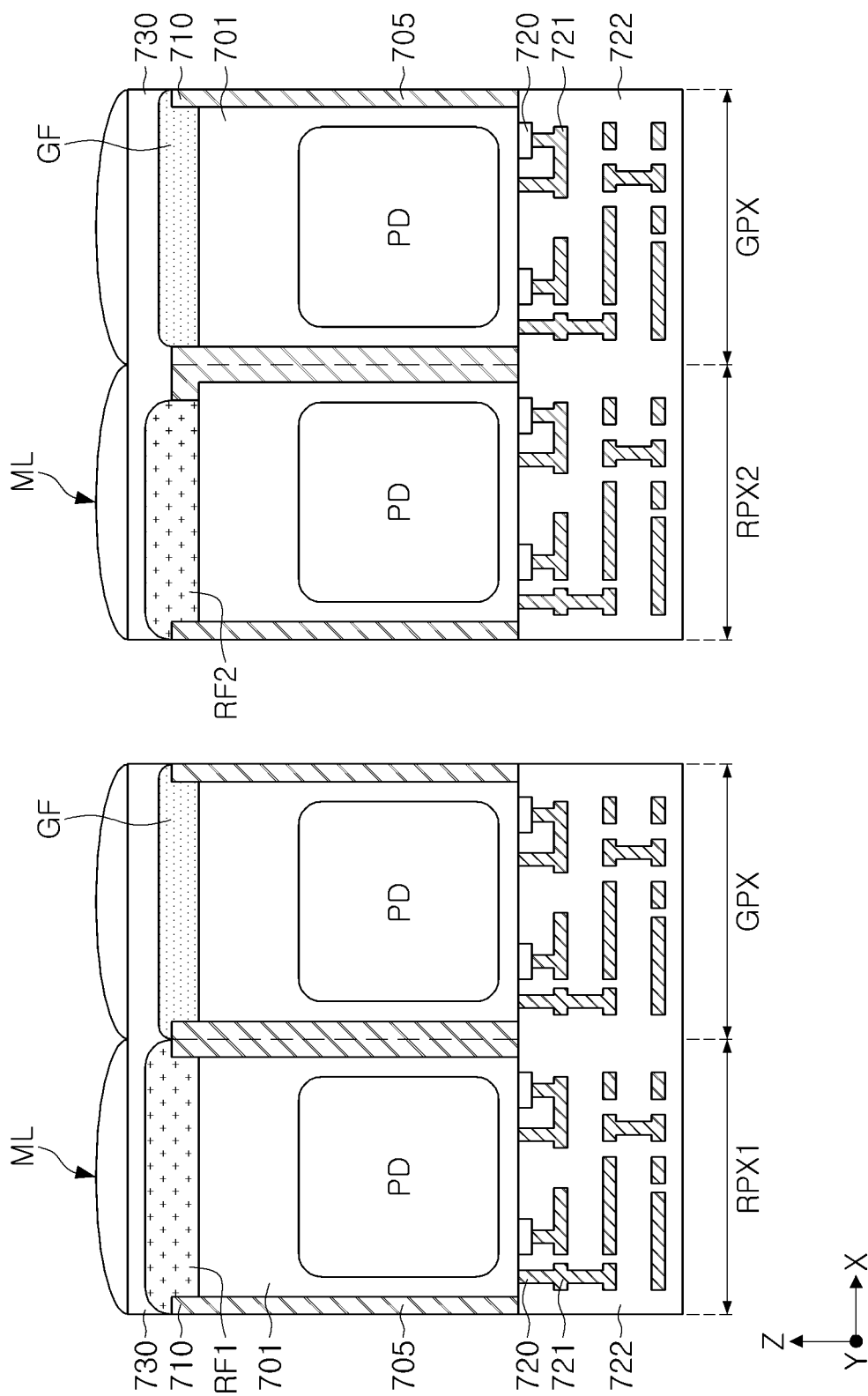

Referring to FIGS. 26 and 27, a planarization layer 730 and a microlens ML may be formed on the color filters RF1, RF2, GF, and BF to form a plurality of pixels RPX1, RPX2, GPX, and BPX. The planarization layer 730 may have a flat upper surface in each of the plurality of pixel areas RA, GA, and BA. Accordingly, as illustrated in FIG. 27, the planarization layers 730 may have different thicknesses in at least portions of the plurality of pixel areas RA, GA, and BA.

In the second area A2, the grid structure 710 may have a relatively greater width between the second red color filter RF2 and the green color filter GF, and the second red color filter RF2 may have a smaller size than the first red color filter RF1. Accordingly, the upper surface of the grid structure 710 may contact the planarization layer 730, between the second red color filter RF2 and the green color filter GF.

Figure 28:
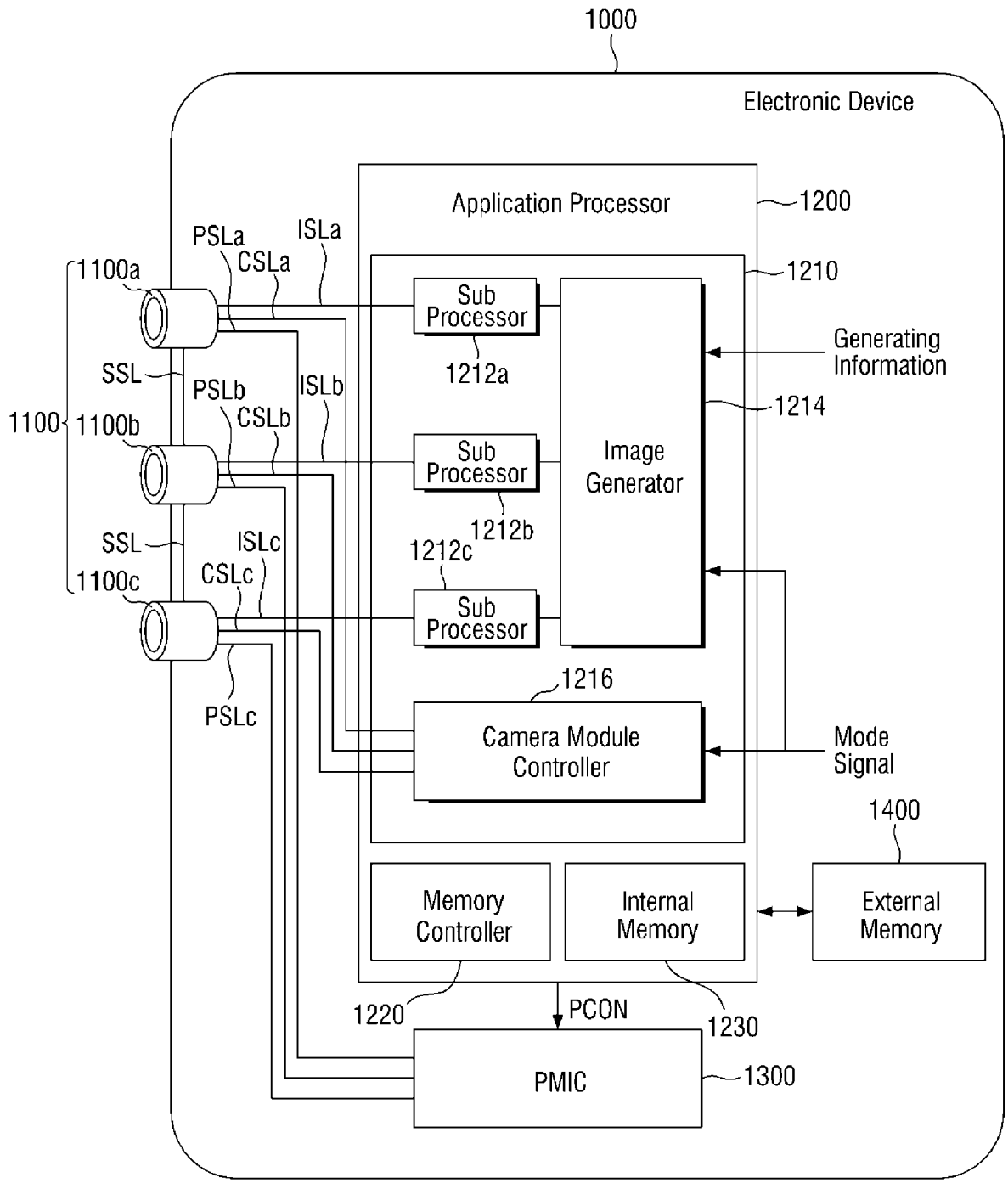
FIGS. 28 and 29 are diagrams schematically illustrating an electronic device including an image sensor according to an example embodiment.
Figure 29:
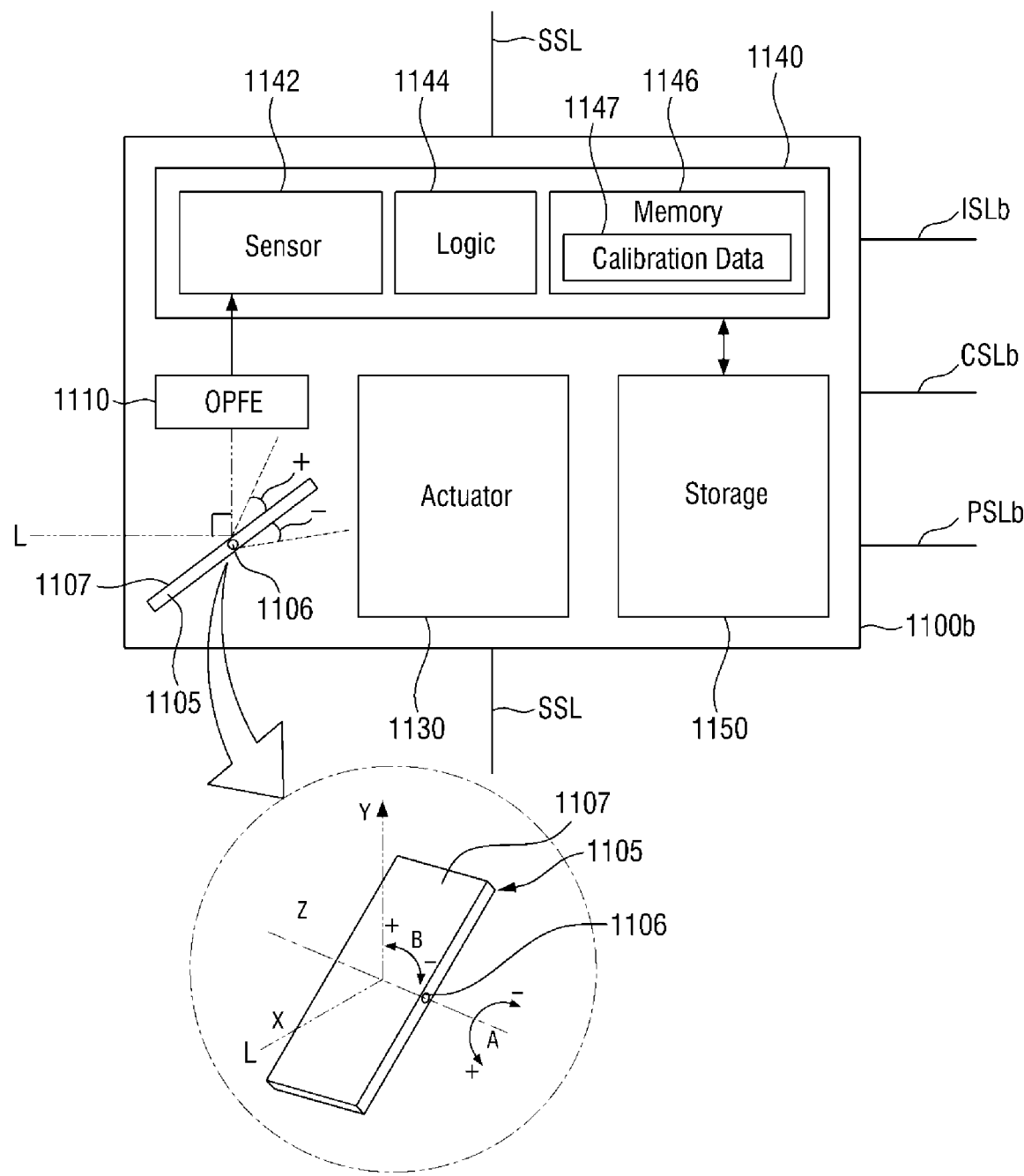

FIGS. 28 and 29 are diagrams schematically illustrating an electronic device including an image sensor according to an example embodiment.

Referring to FIG. 28, an electronic device 1000 may include a camera module group 1100, an application processor 1200, a PMIC 1300, and an external memory 1400.

The camera module group 1100 may include a plurality of camera modules 1100a, 1100b, and 1100c. Although the drawing illustrates an example embodiment in which three camera modules 1100a, 1100b, and 1100c are disposed, the example embodiments are not limited thereto. In some embodiments, the camera module group 1100 may be modified to include only two camera modules. In addition, in some embodiments, the camera module group 1100 may be modified and implemented to include n (where n is a natural number of 4 or more) camera modules. In addition, in an example embodiment, at least one of the plurality of camera modules 1100a, 1100b, and 1100c included in the camera module group 1100 may include an image sensor according to one of the example embodiments described above with reference to FIGS. 1 to 27.

Hereinafter, a detailed configuration of the camera module 1100b will be described in more detail with reference to FIG. 29, but the following description may be equally applied to other camera modules 1100a and 1100b according to an example embodiment.

Referring to FIG. 29, the camera module 1100b may include a prism 1105, an optical path folding element (hereinafter referred to as "OPFE") 1110, an actuator 1130, an image sensing device 1140, and a storage unit 1150.

The prism 1105 may include a reflective surface 1107 of a light reflecting material to change the path of light L incident from the outside.

In some embodiments, the prism 1105 may change the path of the light L, incident in the first direction X, to the second direction Y, perpendicular to the first direction X. In addition, the prism 1105 may rotate the reflective surface 1107 of the light reflecting material in A direction around a central axis 1106, or may rotate the central axis 1106 in B direction, to change the path of the light L incident in the first direction X to be incident in the second direction, a vertical direction. In this case, the OPFE 1110 may also move in a third direction Z, perpendicular to the first direction X and the second direction Y.

In some embodiments, as illustrated, a maximum rotation angle of the prism 1105 in the A direction is 15 degrees or less in the positive (+) A direction, and may be greater than 15 degrees in the negative (−) A direction, but embodiments are not limited thereto.

In some embodiments, in the positive (+) or negative (−) B direction, the prism 1105 may move between 20 degrees, or between 10 degrees and 20 degrees, or between 15 degrees and 20 degrees, and in this case, the angle of movement may be at the same angle thereas, in the positive (+) or negative (−) B direction, or may be almost the same angle thereas in the range of around 1 degree.

In some embodiments, the prism 1105 may move the reflective surface 1106 of the light reflective material in a third direction (e.g., the Z direction) parallel to the extending direction of the central axis 1106.

The OPFE 1110 may include, for example, an optical lens comprised of m (where m is a natural number) groups. The m lenses may move in the second direction Y to change the optical zoom ratio of the camera module 1100b. For example, when the basic optical zoom ratio of the camera module 1100b is Z, in the case in which m optical lenses included in the OPFE 1110 are moved, the optical zoom ratio of the camera module 1100b may be changed to 3Z, 5Z, or 5Z or higher optical zoom ratio.

The actuator 1130 may move the OPFE 1110 or an optical lens, (hereinafter, referred to as an optical lens), to a specific position. For example, the actuator 1130 may adjust the position of the optical lens such that the image sensor 1142 is positioned at a focal length of the optical lens for accurate sensing.

The image sensing device 1140 may include an image sensor 1142, a control logic 1144, and a memory 1146. The image sensor 1142 may sense an image of a sensing target using light L provided through an optical lens. The control logic 1144 may control the overall operation of the camera module 1100b. For example, the control logic 1144 may control the operation of the camera module 1100b according to a control signal provided through a control signal line CSLb.

The memory 1146 may store information used for the operation of the camera module 1100b, such as calibration data 1147. The calibration data 1147 may include information used for the camera module 1100b to generate image data using light L provided externally. The calibration data 1147 may include, for example, information on a degree of rotation described above, information on a focal length, information on an optical axis, and the like. For example, when the camera module 1100b is implemented in the form of a multi-state camera in which a focal length is changed depending on the position of the optical lens, the calibration data 1147 may include a focal length value for each position (or state) of the optical lens and information related to autofocusing.

The storage unit 1150 may store image data sensed through the image sensor 1142. The storage unit 1150 may be disposed outside of the image sensing device 1140 and may be implemented in a form stacked with a sensor chip constituting the image sensing device 1140. In some embodiments, the storage unit 1150 may be implemented as an Electrically Erasable Programmable Read-Only Memory (EEPROM), but embodiments are not limited thereto.

Referring to FIGS. 28 and 29 together, in some embodiments, each of the plurality of camera modules 1100a, 1100b, and 1100c may include the actuator 1130. Accordingly, each of the plurality of camera modules 1100a, 1100b, and 1100c may include the same or different calibration data 1147 according to the operation of the actuator 1130 included therein.

In some embodiments, one camera module (e.g., 1100b) among the plurality of camera modules 1100a, 1100b and 1100c may be a folded lens type camera module including the prism 1105 and the OPFE 1110 described above, and the other camera modules (for example, 1100a, 1100b) may be vertical camera modules that do not include the prism 1105 and the OPFE 1110, but the embodiments are not limited thereto.

In some embodiments, one camera module (e.g., 1100c) among the plurality of camera modules 1100a, 1100b and 1100c may be a vertical type of depth camera for extracting depth information using, for example, Infrared Ray (IR). In this case, the application processor 1200 may merge image data provided from the depth camera with image data provided from another camera module (for example, 1100a or 1100b), thereby generating a 3D depth image.

In some embodiments, at least two camera modules (e.g., 1100a and 1100b) among the plurality of camera modules 1100a, 1100b, and 1100c may have different fields of view. In this case, for example, optical lenses of at least two camera modules (e.g., 1100a and 1100b) among the plurality of camera modules 1100a, 1100b, and 1100c may be different from each other, but the configuration is not limited thereto.

In addition, in some embodiments, fields of view of the plurality of camera modules 1100a, 1100b, and 1100c may be different from each other. In this case, the optical lenses included in the plurality of respective camera modules 1100a, 1100b, and 1100c may also be different from each other, but the configurations thereof are not limited thereto.

In some embodiments, the plurality of camera modules 1100a, 1100b, and 1100c may be physically separated from each other and disposed. For example, the sensing area of one image sensor 1142 is not divided and used by the plurality of camera modules 1100a, 1100b, and 1100c, but an independent image sensor 1142 may be disposed inside of each of the plurality of camera modules 1100a, 1100b, and 1100c. Whether one single image sensor 1142 or a plurality of independent image sensors 1142 are used, the image sensor(s) may include the various features described above in connection with FIGS. 1-27.

Referring back to FIG. 28, the application processor 1200 may include an image processing device 1210, a memory controller 1220, and an internal memory 1230. The application processor 1200 may be implemented separately from the plurality of camera modules 1100a, 1100b, and 1100c. For example, the application processor 1200 and the plurality of camera modules 1100a, 1100b, and 1100c may be implemented by being separated from each other as separate semiconductor chips.

The image processing device 1210 may include a plurality of sub-image processors 1212a, 1212b and 1212c, an image generator 1214, and a camera module controller 1216.

The image processing device 1210 may include a plurality of sub-image processors 1212a, 1212b, and 1212c corresponding to the number of the plurality of camera modules 1100a, 1100b, and 1100c.

Image data generated from the camera modules 1100a, 1100b, and 1100c, respectively, may be provided to the corresponding sub-image processors 1212a, 1212b, and 1212c through image signal lines ISLa, ISLb, and ISLc separated from each other. For example, image data generated from the camera module 1100a is provided to the sub-image processor 1212a through an image signal line ISLa, the image data generated from the camera module 1100b is provided to the sub-image processor 1212b through an image signal line ISLb, and the image data generated from the camera module 1100c may be provided to the sub-image processor 1212c through the image signal line ISLc. Such image data transmission may be performed using, for example, a camera serial interface (CSI) based on a Mobile Industry Processor Interface (MIPI), but embodiments are not limited thereto.

On the other hand, in some embodiments, one sub-image processor may be disposed to correspond to a plurality of camera modules. For example, the sub-image processor 1212a and the sub-image processor 1212c may not be implemented separately from each other as illustrated, but may be implemented by being integrated into one sub-image processor. In this case, image data provided from the camera module 1100a and the camera module 1100c may be selected through a selection element (e.g., a multiplexer) or the like, and then provided to the integrated sub-image processor.

Image data provided to the respective sub-image processors 1212a, 1212b, and 1212c may be provided to the image generator 1214. The image generator 1214 may generate an output image using image data provided from the respective sub-image processors 1212a, 1212b, and 1212c according to the image generating information or a mode signal.

In detail, the image generator 1214 may merge at least portions of the image data generated from the camera modules 1100a, 1100b, and 1100c having different fields of view and may generate an output image, according to the image generation information or the mode signal. In addition, the image generator 1214 may generate an output image by selecting any one of image data generated from camera modules 1100a, 1100b, and 1100c having different fields of view according to image generation information or the mode signal.

In some embodiments, the image generation information may include a zoom signal or zoom factor. Further, in some embodiments, the mode signal may be, for example, a signal based on a mode selected from a user.

For example, when the image generation information is a zoom signal (zoom factor) and the camera modules 1100a, 1100b and 1100c have different fields of view (viewing angles), the image generator 1214 may operate differently depending on the type of the zoom signal. For example, when the zoom signal is a first signal, after merging the image data output by the camera module 1100a and the image data output by the camera module 1100c, an output image may be generated using the merged image signal and image data output by the camera module 1100b that is not used for merging. For example, in a case in which the zoom signal is a second signal different from the first signal, the image generator 1214 does not perform such image data merging, and may select any one of the image data output by the camera modules 1100a, 1100b and 1100c and may generate an output image. However, embodiments are not limited thereto, and a method of processing image data may be variously modified and implemented as needed.

In some embodiments, the image generator 1214 may receive a plurality of image data having different exposure times, from at least one of the plurality of sub-image processors 1212a, 1212b and 1212c, and may perform high dynamic range (HDR) processing for the plurality of image data, thereby generating merged image data having an increased dynamic range.

The camera module controller 1216 may provide a control signal to the respective camera modules 1100a, 1100b, and 1100c. The control signal generated from the camera module controller 1216 may be provided to the corresponding camera modules 1100a, 1100b, and 1100c through control signal lines CSLa, CSLb, and CSLc separated from each other.

Any one of the plurality of camera modules 1100a, 1100b and 1100c may be designated as a master camera (e.g., 1100b) according to image generation information including a zoom signal or a mode signal, and the remaining camera modules (e.g., 1100a and 1100c) may be designated as slave cameras. Such information may be included in the control signal and provided to the corresponding camera modules 1100a, 1100b, and 1100c through the control signal lines CSLa, CSLb, and CSLc separated from each other.

Camera modules operating as masters and slaves may be changed according to a zoom factor or an operation mode signal. For example, when the field of view of the camera module 1100a is wider than that of the camera module 1100b and the zoom factor thereof provides a relatively low zoom ratio, the camera module 1100b may operate as a master, and the camera module 1100a may operate as a slave. Conversely, when the zoom factor indicates a relatively high zoom ratio, the camera module 1100a may operate as a master and the camera module 1100b may operate as a slave.

In some embodiments, a control signal provided from the camera module controller 1216 to the respective camera modules 1100a, 1100b, and 1100c may include a sync enable signal. For example, when the camera module 1100b is a master camera and the camera modules 1100a and 1100c are slave cameras, the camera module controller 1216 may transmit a sync enable signal to the camera module 1100b. The camera module 1100b receiving the sync enable signal generates a sync signal based on the received sync enable signal, and may transmit the generated sync signal to the camera modules 1100a and 1100c through a sync signal line SSL. The camera module 1100b and the camera modules 1100a and 1100c may be synchronized with such a sync signal to transmit image data to the application processor 1200.

In some embodiments, a control signal provided from the camera module controller 1216 to the plurality of camera modules 1100a, 1100b, and 1100c may include mode information based on the mode signal. Based on this mode information, the plurality of camera modules 1100a, 1100b, and 1100c may operate in a first operation mode and a second operation mode in relation to the sensing speed.

In the first operation mode, the plurality of camera modules 1100a, 1100b, and 1100c may generate an image signal at a first rate (for example, generate an image signal at a first frame rate), and may encode the generated image signal at a second rate higher than the first rate (for example, encode an image signal having a second frame rate higher than the first frame rate), and may transmit the encoded image signal to the application processor 1200. In this case, the second speed may be 30 times or less of the first speed.

The application processor 1200 stores the received image signal, for example, the encoded image signal, in a memory 1230 provided therein or in a storage 1400 outside of the application processor 1200, and then, may read the encoded image signal from the memory 1230 or the storage 1400 and decode the read signal, and may display image data generated based on the decoded image signal. For example, a corresponding subprocessor among the plurality of subprocessors 1212a, 1212b, and 1212c of the image processing device 1210 may perform decoding, and may also perform image processing on the decoded image signal.

The plurality of camera modules 1100a, 1100b, and 1100c may generate an image signal at a third rate lower than the first rate in the second operation mode, (for example, generate an image signal having a third frame rate lower than the first frame rate), and may transmit the image signal to the application processor 1200. The image signal provided to the application processor 1200 may be an unencoded signal. The application processor 1200 may perform image processing on the received image signal or may store the image signal in the memory 1230 or the storage 1400.

The PMIC 1300 may supply power, such as a power voltage, to the plurality of respective camera modules 1100a, 1100b, and 1100c. For example, under the control of the application processor 1200, the PMIC 1300 may supply first power to the camera module 1100*a* through the power signal line PSLa, supply the second power to the camera module 1100*b* through the power signal line PSLb, and supply third power to the camera module 1100*c* through the power signal line PSLc.

The PMIC 1300 may generate power corresponding to each of the plurality of camera modules 1100*a*, 1100*b*, and 1100*c* in response to a power control signal PCON from the application processor 1200, and may also adjust the power level. The power control signal PCON may include a power adjustment signal for each operation mode of the plurality of camera modules 1100*a*, 1100*b*, and 1100*c*. For example, the operation mode may include a low power mode, and in this case, the power control signal PCON may include information on a camera module operating in a low power mode and a set power level. Levels of power signals provided to the plurality of camera modules 1100*a*, 1100*b*, and 1100*c*, respectively, may be the same as or different from each other. Also, the level of power signals may be dynamically changed.

As set forth above, according to an example embodiment, the size of the red color filter included in the red pixel is determined according to the distance from the center of the pixel array, and at least a portion of the red pixels may include red color filters of different sizes. Accordingly, the phenomenon in which a portion of the incident light incident on the green pixel is blocked and/or absorbed by the red color filter of the adjacent red pixel may be significantly reduced. In addition, in the direction of incidence of the incident light, the signal strength between the green pixel adjacent to the red pixel and the green pixel not adjacent to the red pixel may be significantly reduced, thereby improving the performance of the image sensor.

While example embodiments have been illustrated and described above, it will be apparent to those skilled in the art that modifications and variations could be made without departing from the scope of the present invention as defined by the appended claims.

What is claimed is:

1. An image sensor comprising:
    a pixel array including a plurality of pixels arranged in directions parallel to an upper surface of a substrate, each of the plurality of pixels including at least one photodiode, a color filter above the at least one photodiode, and a pixel circuit below the at least one photodiode; and
    a logic circuit configured to obtain a pixel signal from the plurality of pixels,
    wherein the plurality of pixels include red pixels each having a red color filter, green pixels each having a green color filter, and blue pixels each having a blue color filter,
    wherein a size of a first red color filter included in a first red pixel, disposed in a first area separated by a first distance from a center of the pixel array, is greater than a size of a second red color filter included in a second red pixel, disposed in a second area separated from the center of the pixel array by a second distance, greater than the first distance, and
    wherein a difference in size between the first red color filter and a first green color filter adjacent to the first red color filter is less than a difference in size between the second red color filter and a second green color filter adjacent to the second red color filter.

2. The image sensor of claim 1, wherein the first red pixel and the second red pixel are separated from each other in a first direction, parallel to the upper surface of the substrate, and are part of a plurality of pixels arranged in the first direction, and the second red color filter has an asymmetric shape when viewed in a cross-section along a plane parallel to the first direction and a second direction perpendicular to the upper surface of the substrate.

3. The image sensor of claim 2, wherein:
    a pair of green color filters including the second green color filter and a third green color filter are respectively disposed on opposite sides of the second red color filter in the first direction, and
    in the first direction, a distance between the second green color filter and the second red color filter is different from a distance between the third green color filter and the second red color filter.

4. The image sensor of claim 3, wherein:
    in the first direction, the first green color filter is disposed between the first red color filter and the second red color filter, and
    in the first direction, a distance between the first green color filter and the second red color filter is less than a distance between the second green color filter and the second red color filter.

5. The image sensor of claim 2, wherein an upper surface of the red color filter has a flat surface, and a curved surface extending from the flat surface.

6. The image sensor of claim 1, wherein in a plane parallel to the upper surface of the substrate, an area of the second red color filter is smaller than an area of the first red color filter.

7. The image sensor of claim 1, wherein:
    each of the plurality of pixels includes a plurality of sub-pixels disposed in N×N form, where N is a natural number equal to or greater than 2,
    wherein in each of the plurality of pixels, the plurality of sub-pixels share one color filter.

8. The image sensor of claim 7, wherein:
    in each of the plurality of pixels, the color filter includes a plurality of sub-filter areas corresponding to the plurality of sub-pixels, and
    in the first red color filter, a size of at least one of the sub-filter areas is smaller than a size of each of remaining sub-filter areas of the sub-filter areas.

9. The image sensor of claim 8, wherein a size of each of the sub-filter areas included in the green color filter is the same as the size of each of the remaining sub-filter areas included in the green color filter.

10. An image sensor comprising:
    a substrate providing a plurality of pixel areas on which a plurality of pixels are disposed, the substrate including a first surface and a second surface opposing the first surface;
    a light transmitting portion including a color filter, a planarization layer, and a microlens sequentially disposed on the first surface in each of the plurality of pixel areas; and
    a pixel circuit disposed on the second surface in each of the plurality of pixel areas,
    wherein the plurality of pixels include red pixels each having a red color filter, green pixels each having a green color filter, and blue pixels each having a blue color filter, and
    wherein a first red color filter included in a first red pixel of the red pixels has an area smaller than an area of an adjacent first green color filter included in an adjacent green pixel or an adjacent first blue color filter included in an adjacent blue pixel, when viewed from a first direction perpendicular to the first surface of the substrate, and a second red color filter included a second red pixel of the red pixels has an area the same as an area of an adjacent second green color filter included in an adjacent green pixel or an adjacent first blue color filter included in an adjacent blue pixel, when viewed from the first direction.

11. The image sensor of claim 10, wherein in the first direction, the planarization layer has a first thickness on the red color filter, and a second thickness greater than the first thickness on the green color filter,
wherein an upper surface of the planarization layer on the red color filter is disposed at the same height above the first surface of the substrate as an upper surface of the planarization layer on the green color filter and the blue color filter.

12. The image sensor of claim 10, wherein the first red pixel is disposed at a first distance from a center of the substrate, and the second red pixel is disposed at a second distance shorter than the first distance from the center of the substrate, and
an area of the red color filter included in the first red pixel is smaller than an area of the red color filter included in the second red pixel, when viewed from the first direction.

13. The image sensor of claim 12, wherein an area of the red color filter included in the red pixels, when viewed from the first direction, decreases as a distance of the red color filter from the center of the substrate increases.

14. The image sensor of claim 13, wherein an area of the red color filter included in the red pixels, when viewed from the first direction, linearly decreases according to a distance from the center of the substrate.

15. An image sensor comprising:
a pixel array including a plurality of pixels arranged in directions parallel to an upper surface of a substrate, each of the plurality of pixels including a plurality of sub-pixels disposed in N×N form, where N is a natural number equal to or greater than 2, the plurality of sub-pixels having the same color filter; and
a logic circuit configured to obtain a pixel signal from the plurality of pixels,
wherein the plurality of pixels include red pixels each having a plurality of red sub-pixels, green pixels each having a plurality of green sub-pixels, and blue pixels each having a plurality of blue sub-pixels,
in each of the plurality of pixels, the color filter has a plurality of sub-filter areas respectively corresponding to the plurality of sub-pixels, and
in at least a first red pixel of the red pixels, from a plan view, a size of each sub-filter area of the plurality of sub-filter areas, disposed relatively closer to a first edge of the substrate, is smaller than a size of each of each remaining sub-filter area of the plurality of sub-filter areas, disposed further from the first edge of the substrate, and
the first red pixel includes a single color filter formed by the plurality of sub-filter areas for the first red pixel, and the single color filter is separated from an adjacent color filter of a first adjacent pixel at a first side of the first red pixel by a first distance, and is separated from an adjacent color filter of a second adjacent pixel at a second side of the first red pixel opposite the first side, by a second distance greater than the first distance.

16. The image sensor of claim 15, wherein, from the plan view, for each green pixel of the green pixels, a size of each of the plurality of sub-filter areas for the green pixel is the same as a size of each of the remaining sub-filter areas for the green pixel.

17. The image sensor of claim 15, wherein, from the plan view, for each blue pixel of the blue pixels, a size of each of the plurality of sub-filter areas for the blue pixel is the same as a size of each of the remaining sub-filter areas for the blue pixel.

18. The image sensor of claim 15, wherein, from the plan view, a size of a red color filter included in at least one of the red pixels is smaller than a size of a green color filter included in each of the green pixels.

19. The image sensor of claim 15, wherein the number of the plurality of sub-filter areas disposed relatively closer to the first edge of the substrate is the same as the number of the remaining sub-filter areas.

20. The image sensor of claim 15, wherein the number of the plurality of sub-filter areas disposed relatively closer to the first edge of the substrate is less than the number of the remaining sub-filter areas.

* * * * *